(12) United States Patent
Hoshino et al.

(10) Patent No.: US 7,088,618 B2
(45) Date of Patent: Aug. 8, 2006

(54) METHOD OF EVALUATING CHARACTERISTICS OF SEMICONDUCTOR MEMORY ELEMENT, AND METHOD OF EXTRACTING MODEL PARAMETER OF SEMICONDUCTOR MEMORY ELEMENT

(75) Inventors: Kozo Hoshino, Tenri (JP); Hiroshi Iwata, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 67 days.

(21) Appl. No.: 10/986,271

(22) Filed: Nov. 12, 2004

(65) Prior Publication Data
US 2005/0117419 A1    Jun. 2, 2005

(30) Foreign Application Priority Data
Nov. 28, 2003  (JP)  .............................. 2003-400231

(51) Int. Cl.
  G11C 16/04  (2006.01)
  G11C 11/22  (2006.01)
(52) U.S. Cl. ........................... 365/185.05; 365/185.06; 365/185.14
(58) Field of Classification Search ........... 365/185.05, 365/185.26, 185.14, 185.18, 185.25
See application file for complete search history.

(56) References Cited

U.S. PATENT DOCUMENTS 5,303,185 A * 4/1994 Hazani .................. 365/185.26
5,981,996 A * 11/1999 Fujishima .................. 257/335

FOREIGN PATENT DOCUMENTS

| JP | 5-81075 A | 4/1993 |
| JP | 5-30427 A | 5/1993 |
| WO | WO-03/044868 A1 | 5/2003 |

* cited by examiner

Primary Examiner—Tuan T. Nguyen
Assistant Examiner—Dang Nguyen
(74) Attorney, Agent, or Firm—Birch, Stewart, Kolasch & Birch LLP

(57) ABSTRACT

A characteristic evaluating method of precisely obtaining a resistance value of an offset region in a semiconductor memory element constructed so that the resistance value of the offset region positioned below a memory function element formed on one side or both sides of a gate electrode changes according to an amount of charges or a polarization state of charges accumulated in said memory function element includes: a step of obtaining each of a resistance value between two diffusion regions inclusive formed on both sides of a channel region disposed just below the gate electrode of the semiconductor memory element via a gate insulating film, a resistance value of the channel region, and a resistance value of the diffusion regions; and a step of calculating the resistance value of the offset region which isolates the channel region and the diffusion region from each other on the basis of a result of subtracting the resistance value of the channel region and the resistance value of the diffusion regions from the resistance value between the two diffusion regions.

22 Claims, 32 Drawing Sheets

METHOD OF EVALUATING CHARACTERISTICS OF SEMICONDUCTOR MEMORY ELEMENT, AND METHOD OF EXTRACTING MODEL PARAMETER OF SEMICONDUCTOR MEMORY ELEMENT

CROSS REFERENCE TO RELATED APPLICATIONS

This Nonprovisional application claims priority under 35 U.S.C. § 119(a) on Patent Application No. JP2003-400231 filed in Japan on 28 Nov. 2003, the entire contents of which are hereby incorporated by reference.

BACKGROUND OF THE INVENTION

1. Field of the Invention

The present invention relates to a method and apparatus for extracting a model parameter for a circuit simulation for a semiconductor memory element. More particularly, the present invention relates to a method of calculating a resistance value of an offset region in a semiconductor memory element having a gate electrode formed over a semiconductor layer via a gate insulating film, a channel region disposed just below the gate electrode via the gate insulating film, two diffusion regions formed on the both sides of the channel region, a memory function element formed on one side or both sides of the gate electrode and having a charge retaining function, and an offset region positioned below the memory function element and isolating the channel region and the diffusion region from each other, and constructed so that the diffusion region formed on the side where the memory function element exists and the channel region are isolated from each other by the offset region and the resistance value of the offset region changes according to the amount of charges or a polarization state of charges accumulated in said memory function element, and relates to a method and apparatus of extracting a model parameter of a semiconductor memory element by using a model formula precisely expressing a calculated resistance value.

2. Description of the Related Art

As a conventional nonvolatile semiconductor memory element generally spread, there is a flash memory constructed by a transistor having a floating-gate structure. In the flash memory, as shown in FIG. 31, a floating gate 902, an insulating film 907, and a word line (control gate) 903 are formed in this order over a semiconductor substrate 901 via a gate insulating film. On both sides of the floating gate 902, a source line 904 and a bit line 905 are formed by a diffusion region, thereby constructing a memory cell. A device isolation region 906 is formed around the memory cell (see, for example, JP-A 05-304277 (1993)).

The memory cell in the flash memory stores information in accordance with an amount of charges in the floating gate 902. In a memory cell array constructed by arranging memory cells, by selecting a specific word line and a specific bit line and applying a predetermined voltage, an operation of rewriting/reading a desired memory cell can be performed. In such a flash memory, when the amount of charges in the floating gate changes, a drain current (Ids)-gate voltage (Vgs) characteristic as shown in FIG. 32 is displayed. When the amount of negative charges in the floating gate increases, the threshold increases and the Ids-Vgs curve shifts almost in parallel to the Vgs increasing direction.

In such a flash memory, however, the insulating film 907 which separates the floating gate 902 and the word line 903 is necessary from the viewpoint of functions, and in order to prevent leakage of charges from the floating gate 902, it is difficult to reduce the thickness of the gate insulating film. Consequently, it is difficult to effectively reduce the thickness of the insulating film 907 and the gate insulating film, and it disturbs reduction in the size of the memory cell.

There is a move afoot to provide a novel semiconductor memory element of which size is easily reduced by employing a semiconductor memory element disclosed in International Publication WO 03/044868 as a semiconductor memory element constructed so that the resistance value of an offset region positioned below a memory function element changes according to an amount of charges or a polarization state of charges accumulated in the memory function element formed on one side or both sides of a gate electrode.

There is also a semiconductor memory element disclosed in JP-A 05-81072 (1993) which has a structure and forms an offset region similar to those of the semiconductor memory element disclosed in International Publication WO 03/044868.

As described above, a semiconductor memory element constructed so that the resistance value of the offset region positioned below the memory function element changes according to an amount of charges or a polarization state of charges accumulated in the memory function element formed on one side or both sides of the gate electrode has, first, a gate electrode formed over a semiconductor layer via a gate insulating film, a channel region disposed below the gate electrode, diffusion regions formed on both sides of the channel region and having a conduction type opposite to that of the channel region, and memory function elements formed on both sides of the gate electrode and having a charge retaining function. The memory function of the memory function element and a transistor operating function of the gate insulating film are separated from each other. Therefore, while maintaining the sufficient memory function, the gate insulating film can be thinned and it is easy to suppress a short channel effect. Further, as compared with an EEPROM, the value of current flowing between diffusion regions largely changes by rewriting. Thus, it becomes easier to discriminate between the programming state and the erasing state of the semiconductor memory element.

Further, the semiconductor memory element of the present invention can be formed by a process which is very compatible with a normal transistor forming process on the basis of the configuration. Therefore, as compared with the case of using a conventional flash memory as a nonvolatile memory device together with a normal transistor, the number of masks and the number of processes can be dramatically reduced. Consequently, the yield of a chip on which both the semiconductor memory element and a normal transistor circuit are formed can be improved. Due to this, the manufacturing cost is reduced and, accordingly, reliability improves.

To perform a circuit simulation on a circuit including the semiconductor memory element having the excellent characteristics, a set of model parameters of a model for a circuit simulation expressing electric characteristics of the semiconductor memory element is necessary. The semiconductor memory element is different from a general IGFET (insulated gate field-effect transistor, a MOSFET being a kind of the IGFET) with respect to the points that an offset region is provided on both sides or one side of the channel region disposed just below the gate electrode and a memory function element is provided on both sides or one side of the gate electrode.

However, it is difficult to precisely extract a model parameter with respect to an electrostatic characteristic of the semiconductor memory element by using a normal IGFET model (for example, BSIM3 developed mainly by University of California, Berkley, U.S.A.) as a conventional technique by the differences for the following reason. The resistance value of resistance of the offset region existing on both sides or one side of the channel region just below the gate electrode changes according to an amount of charges or a polarization state of charges accumulated in the memory function element positioned on both sides or one side of the gate electrode, and the gate voltage dependency, substrate voltage dependency, and drain voltage dependency of the offset region are largely different from those of the channel region just below the gate electrode. There is a problem such that, in particular, when the memory function element on one side or both sides is in a programming state, it is impossible to extract a model parameter with high precision.

Further, at the time of extracting a model parameter with respect to an electrostatic characteristic of the semiconductor memory element, it is very important to obtain, not channel resistance of the offset and channel regions in a lump, but the resistance of the channel region just below the gate electrode and the resistance of the offset region on both sides or one side separately and to accurately grasp the state (erase or program) of the memory function element and an offset resistance value under voltage conditions of the each region (the gate electrode, semiconductor layer, and diffused region).

However, the offset region is a very small region positioned below the memory function element and it is actually impossible to directly connect an electrode to the offset region. Consequently, the actual condition is that it is difficult to directly measure the resistance of the offset region, and a characteristic evaluating method of precisely obtaining the resistance value of the offset region and a model formula and a model parameter for precisely expressing the resistance value of the offset region obtained by the characteristic evaluation do not exist.

SUMMARY OF THE INVENTION

The present invention has been achieved in view of the problems and its object is to provide a characteristic evaluating method of precisely obtaining a resistance value of an offset region of a semiconductor memory element constructed so that the resistance value of the offset region below the memory function element changes according to an amount of charges or a polarization state of charges accumulated in a memory function element formed on one side or both sides of a gate electrode, and a method and apparatus for extracting a model parameter for a circuit simulation for the semiconductor memory element.

As a first aspect, a method of evaluating characteristics of a semiconductor memory element according to the present invention to achieve the object, the semiconductor memory element including: a gate electrode formed over a semiconductor layer via a gate insulating film; a channel region disposed just below the gate electrode via the gate insulating film; two diffusion regions formed on both sides of the channel region; a memory function element having a charge retaining function, formed on one side or both sides of the gate electrode; and an offset region positioned below the memory function element and isolating the channel region and the diffusion region from each other, the diffusion region formed on the side where the memory function element exists and the channel region being isolated from each other by the offset region, and a resistance value of the offset region changing according to an amount of charges or a polarization state of charges accumulated in the memory function element, the method includes: a step of obtaining each of a resistance value between the two diffusion regions inclusive, a resistance value of the channel region, and a resistance value of the diffusion regions of the semiconductor memory element; and a step of calculating the resistance value of the offset region on the basis of a result of subtracting the resistance value of the channel region and the resistance value of the diffusion regions from the resistance value between the two diffusion regions inclusive.

According to the first aspect of the characteristic evaluating method, the resistance value of the offset region can be extracted precisely from an IGFET structure part of a semiconductor memory element. As a result, the resistance value of the offset region can be modeled independently with high precision, the model parameter can be extracted, and the IGFET structure part can be modeled by using a conventional general IGFET model with high precision. Therefore, the semiconductor memory element can be modeled with high precision by two models of the resistance value of the offset region and the IGFET structure part, and a high-precision circuit simulation can be performed.

In the case where the memory function elements are formed on both sides of the gate electrode, the offset regions are also formed on both sides of the channel region. Consequently, a result of subtracting the resistance value of the channel region and the resistance value of the diffusion region from the resistance value between the two diffusion regions inclusive is equal to the total of the resistance values of the offset regions on both sides. Therefore, by setting the amounts of charges or the polarization states of charges accumulated in the two memory function elements to be the same, the resistance values of the offset regions on both sides can be regarded as equal to each other and calculated.

In the characteristic evaluating method of the first aspect, at the time of obtaining a resistance value between two diffusion regions inclusive, it is a second aspect to use a resistance value obtained from the semiconductor memory element in which length of the gate electrode is sufficiently larger than length of the offset region to a direction in which the two diffusion regions are apart from each other.

Further, in the characteristic evaluating method according to any of the first and second aspects, at the time of obtaining the resistance value of the channel region, it is a third aspect to use a resistance value obtained from an IGFET for channel region resistance evaluation in which the diffusion region extends to a position below the gate electrode and to use, more preferably, the semiconductor memory element and the IGFET for channel region resistance evaluation which are formed on the same semiconductor substrate.

Further, in the characteristic evaluating method according to any of the aspects, at the time of obtaining the resistance value of the diffusion region, it is a fourth aspect to use a resistance value of a diffusion region for resistance evaluation obtained from a device for resistance evaluation constructed by the diffusion region for resistance evaluation formed over a semiconductor layer and a plurality of electrodes provided over the diffusion region for resistance evaluation, and to use, more preferably, the semiconductor memory element and the device for resistance evaluation which are formed on the same semiconductor substrate.

By the characteristic evaluating method of any of the second to fourth aspects, the influence of fluctuations in manufacturing processes can be reduced, and the resistance value of the offset region can be obtained with higher precision.

Moreover, in the characteristic evaluating method of any of the aspects, it is a fifth aspect that the resistance value of the offset region is calculated as a variable resistance value which changes according to an amount of charges or a polarization state of charges accumulated in the memory function element.

Further, in the characteristic evaluating method of any of the aspects, it is a sixth aspect that the resistance value of the offset region is calculated as a variable resistance value which changes according to the potential of the gate electrode, the potential of the semiconductor layer, or the potential difference between the two diffusion regions. Preferably, the resistance value of the offset region adjacent to a source diffusion region serving as a source electrode at the time of reading operation out of the two diffusion regions is set to be constant with respect to potential of the source diffusion region.

By the characteristic evaluating method of the fifth or sixth aspect, the resistance value of the offset region, which changes under various conditions such as the storing state of the memory function element, the potential states of the parts, and the like can be obtained with high precision in correspondence with the conditions.

The model parameter extracting method according to the present invention to achieve the object is a method of extracting a model parameter for a circuit simulation for the semiconductor memory element. To independently extract a model parameter of the resistance value of the offset region separately from a model parameter for a simulation of an IGFET, the present invention provides a method of extracting a model parameter of a variable resistance model expressed by using a model formula having voltage dependency in which physical properties of the resistance value of the offset region are reflected by precisely fitting a fitting parameter to the resistance value of the offset region according to the storing states (erase, program, and the like) and the potential state of the parts (gate electrode, semiconductor layer, and diffusion region) obtained by the characteristic evaluating method of the fifth or sixth characteristic. By using the model parameter obtained by the model parameter extracting method and the model formula, the resistance value of the offset region in an arbitrary potential state of each of the parts (gate electrode, semiconductor layer, and diffusion region) can be uniquely obtained.

Further, the model parameter extracting method according to the present invention to achieve the object is characterized by extracting a model parameter of an IGFET by transferring the resistance value of the offset region according to the storing state (erase, program, or the like) of the memory function element obtained by the model formula and a potential state of the parts (gate electrode, semiconductor layer, and diffusion region) as parasitic resistance of a diffusion region in a simulation model in the IGFET or external parasitic resistance connected to the diffusion region of the IGFET. In the model parameter extracting method, in a state where the resistance value obtained with high precision by the characteristic evaluating method is given to the resistance value of the offset region playing a very important role in the electrostatic characteristics of the semiconductor memory element, a model parameter of the IGFET is extracted. Consequently, as compared with the case of using only a model of a normal IGFET, extraction of a model parameter of a model having a high degree of physical properties can be realized with high precision. The model having a high degree of physical properties denotes that a model formula itself is given as a model in which physical characteristics of the resistance value of the offset region to be modeled are reflected and that the model formula is not a formula just for curve fitting, which does not have any meaning in physical properties.

DETAILED DESCRIPTION OF THE INVENTION

Figure 1:
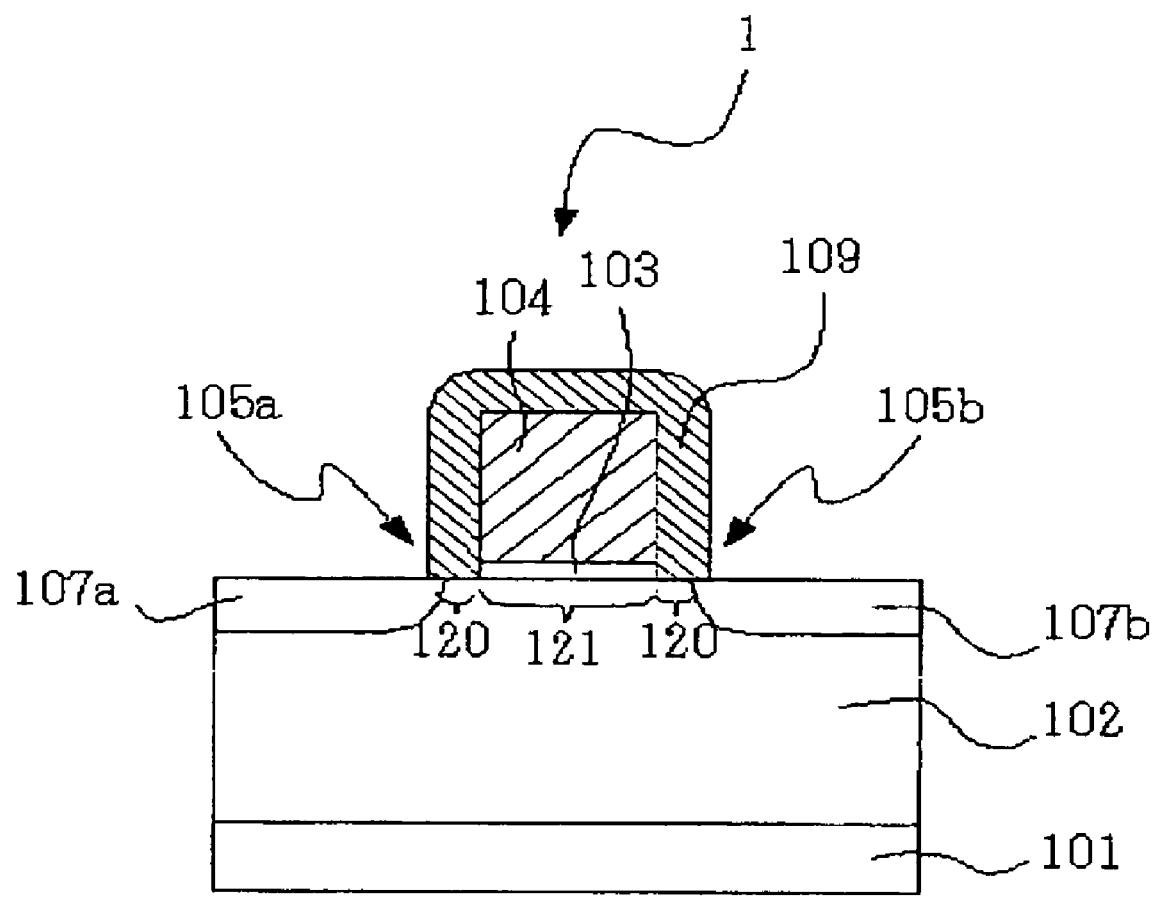
FIG. 1 is a schematic cross section diagram of a main portion of a semiconductor memory element (first configuration example) as an object of the present invention.

Embodiments of a method of evaluating characteristics of a semiconductor memory element according to the present invention and a model parameter extracting method and apparatus will be described with reference to the drawings.

(Semiconductor Memory Element as Object of the Present Invention: Basic Description)

First, the structure of a semiconductor memory element to which the characteristic evaluating method and the model parameter extracting method of the present invention are applied, a method of fabricating the parts, and the like will be described.

A semiconductor memory element is mainly configured by a semiconductor layer, a gate insulating film, a gate electrode, a channel region, a diffusion region and a memory functional element. Herein, the channel region is usually a region having the same conductive type as that of the semiconductor layer and denotes a region immediately below the gate electrode. The diffusion region denotes a region having a conductive type opposite to that of the channel region.

Specifically, although the semiconductor memory element of the present invention may be configured by a region of a first conductive type as a diffusion region, a region of a second conductive type as a channel region, a memory functional element disposed across the boundary of the regions of the first and second conductive types, and an electrode provided via a gate insulating film, it is proper that the nonvolatile semiconductor memory element of the present invention is configured by a gate electrode formed on a gate insulating film, two memory functional elements formed on both sides of the gate electrode, two diffusion regions disposed on the sides of the gate electrode opposite to the memory functional elements, and a channel region disposed below the gate electrode.

Preferably, the semiconductor memory element of the present invention is formed as the semiconductor layer on the semiconductor substrate, more preferably, on a well region of the first conductive type formed in the semiconductor substrate.

The semiconductor substrate is not particularly limited as long as it can be used for a semiconductor element. For example, a bulk substrate made of an elemental semiconductor such as silicon or germanium or a compound semiconductor such as silicon germanium, GaAs, InGaAs, ZnSe, or GaN can be mentioned. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a silicon layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor element, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. As impurity concentration in the semiconductor layer and the well region, impurity concentration which is within a known range in this field can be used. In the case of using the SOI substrate as the semiconductor layer, the well region may be formed in the surface semiconductor layer or a body region may be provided below a channel region.

The gate insulating film is not particularly limited as long as it can be usually used for a semiconductor element. For example, a single-layer film or a multilayer film of an insulating film such as a silicon oxide film or a silicon nitride film, and a high-dielectric-constant film such as an aluminum oxide film, a titanium oxide film, a tantalum oxide film, or a hafnium oxide film can be used. Particularly, a silicon oxide film is preferred. A proper thickness of the gate insulating film is, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor element or a shape having a recess in a lower end on the gate insulating film. Although it is preferable that the gate electrode be formed in an integral form without being separated by a single-layer or multilayer conductive film, the gate electrode may be also disposed in a state where it is separated by a single-layered or multilayer conductive film. The gate electrode may have a sidewall insulating film on its sidewalls. The gate electrode is not particularly limited as long as it is used for a semiconductor element. The gate electrode is formed by a single-layer or multilayer film made by a conductive film, for example, polysilicon, a metal such as copper or aluminum, a high-refractory metal such as tungsten, titanium or tantalum, and a silicide or the like with the high refractory metal. A proper film thickness of the gate electrode is, for example, about 50 to 400 nm. Under the gate electrode, a channel region is formed.

Preferably, the gate electrode is formed only on the sidewalls of the memory functional element or does not cover the top portion of the memory functional element. By such arrangement, a contact plug can be disposed closer to the gate electrode, so that reduction in the size of the semiconductor memory element is facilitated. It is easy to manufacture the semiconductor memory element having such simple arrangement, so that the yield in manufacturing can be improved.

The memory functional element has at least the function of retaining charges (hereinafter, described as "charge retaining function"). In other words, the memory functional element has the function of accumulating and retaining charges, the function of trapping charges, or the function of holding a charge polarization state. The function is exhibited, for example, when the memory functional element includes a film or region having the charge retaining function. Elements having the function are: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional element can be formed by, for example, a single-layer or multilayer structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reasons that the silicon nitride film can obtain a large hysteretic characteristic since a number of levels of trapping charges exist. In addition, the charge retention time is long and a problem of charge leakage due to occurrence of a leak path does not occur, so that the retaining characteristics are good. Further, silicon nitride is a material which is normally used in an LSI process.

By using the insulating film including a film having the charge retaining function such as a silicon nitride film as the memory functional element, reliability of retention of information can be increased. Since the silicon nitride film is an insulator, even in the case where a charge leak occurs in part of the silicon nitride film, the charges in the whole silicon nitride film are not lost immediately. In the case of arranging a plurality of sidewall semiconductor memory elements, even if the distance between the semiconductor memory elements is shortened and neighboring memory functional elements come into contact with each other, unlike the case where the memory functional elements are made of conductors, information stored in the memory functional elements is not lost. Further, a contact plug can be disposed closer to the memory functional element. In some cases, the contact plug can be disposed so as to overlap with the memory functional element. Thus, reduction in the size of the semiconductor memory element is facilitated.

In order to increase the reliability of retention of information, the film having the charge retaining function does not always have to have a film shape. Preferably, films having the charge retaining function exist discretely in an insulating film. Specifically, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a lamination structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional element for the reason that an injection amount of charges into the conductor or semiconductor can be freely controlled and multiple values can be easily obtained.

Further, it is preferable to use the insulating film including at least one conductor or semiconductor dot as the memory functional element for the reason that it becomes easier to perform programming and erasing by direct tunneling of charges, and reduction in power consumption can be achieved.

Alternatively, as a memory functional element, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that programming/erasing can be performed at high speed.

As the insulating film configuring the memory functional element, a film having a region of suppressing escape of charges or the function of suppressing escape of charges is appropriate. One of films having the function of suppressing escape of charges is a silicon oxide film.

The charge retaining film included in the memory functional element is disposed on both sides of the gate electrode directly or via an insulating film, and is disposed on the semiconductor layer (semiconductor substrate, well region, body region or source/drain region or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be properly adjusted in accordance with the performance or the like of a semiconductor memory device to be obtained. In the case of using an SOI substrate as a semiconductor substrate, the diffusion region may have a junction depth smaller than the thickness of the surface semiconductor layer. Preferably, the diffusion region has junction depth almost the same as the thickness of the surface semiconductor layer.

The diffusion region may be disposed so as to overlap an end of the gate electrode, so as to match an end of the gate electrode, or so as to be offset from the gate electrode end. The case where the diffusion region is offset is particularly preferable because easiness of inversion of the offset region below the charge retaining film largely changes in accordance with an amount of charges accumulated in the memory functional element when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance from one of the gate electrode terminals to the closer diffusion area in the gate length direction be shorter than the thickness of the charge retaining film extending in the direction parallel with the gate length direction. It is particularly important that at least a part of the film or region having the charge retaining function in the memory functional element overlaps with a part of the diffusion region. This is because the essence of the semiconductor memory element as a component of the semiconductor memory device of the present invention is to rewrite stored information by an electric field which is applied across the memory functional element in accordance with the voltage difference between the gate electrode which exists only in the sidewall portion of the memory functional element and the diffusion region.

A part of the diffusion region may extend at a level higher than the surface of the channel region, that is, the lower face of the gate insulating film. In this case, it is proper that, on the diffusion region formed in the semiconductor substrate, the conductive film is laminated so as to be integrated with the diffusion region. The conductive film is made of a semiconductor such as polysilicon or amorphous silicon, silicide, the above-mentioned metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional element in cooperation with the gate electrode.

The memory function element can be formed by a normal semiconductor process in accordance with, for example, a method similar to the method of forming the sidewall spacer having the single-layer or multilayer structure on the sidewalls of the gate electrode. Specific examples are: a method of forming the gate electrode, after that, forming a single-layer film or multilayer film including the charge retaining film such as a film having the function of retaining charges (hereinafter, described as "charge retaining film"), charge retaining film/insulating film, insulating film/charge retaining film, or insulating film/charge retaining film/insulating film, and etching back the formed film under proper conditions so as to leave the films in a sidewall spacer shape; a method of forming an insulating film or charge retaining film, etching back the film under proper conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode, and etching back the material under proper conditions so as to leave the insulating film material in a sidewall spacer shape; and a method of forming a gate electrode, after that, forming the single-layer film or multilayer film, and patterning the film with a mask. According to another method, before the gate electrode is formed, the charge retaining film, charge retaining film/insulating film, insulating film/charge retaining film, insulating film/charge retaining film/insulating film, or the like is formed. An opening is formed in a region which becomes the channel region of the films, a gate electrode material film is formed on the entire surface, and the gate electrode material film is patterned in a shape including the opening and larger than the opening.

In the case of configuring the semiconductor memory element array by arranging semiconductor memory elements of the present invention, the best mode of the semiconductor memory element satisfies all of the following requirements: (1) the gate electrodes of a plurality of semiconductor memory elements are integrated and have the function of a word line, (2) the memory functional elements are formed on both sides of the word line, (3) an insulator, particularly, a silicon nitride film retains charges in the memory functional element, (4) the memory functional element is configured by an ONO (Oxide Nitride Oxide) film and the silicon nitride film has a surface almost parallel with the surface of the gate insulating film, (5) a silicon nitride film in the memory functional element is isolated from a word line and a channel region by a silicon oxide film, (6) the silicon nitride film in the memory functional element and a diffusion region overlap with each other, (7) the thickness of the insulating film separating the silicon nitride film having the surface which is almost parallel with the surface of the gate insulating film from the channel region or semiconductor layer and the thickness of the gate insulating film are different from each other, (8) an operation of programming/erasing one semiconductor memory element is performed by a single word line, (9) there is no electrode (word line) having the function of assisting the programming/erasing operation on the memory functional element, and (10) in a portion in contact with the diffusion region immediately below the memory functional element, a region of high concentration of impurity whose conductive type is opposite to that of the diffusion region is provided. It may be sufficient for the semiconductor memory element to satisfy at least one of the requirements.

A particularly preferable combination of the requirements is that, for example, (3) an insulator, particularly, a silicon nitride film holds charges in the memory functional element, (6) the insulating film (silicon nitride film) in the memory functional element and the diffusion region overlap with each other, and (9) there is no electrode (word line) having the function of assisting the programming/erasing operation on the memory functional element.

In the case where the semiconductor memory element satisfies the requirements (3) and (9), it is very useful for the following reasons. First, the bit line contact can be disposed closer to the memory functional element on the word line sidewall or even when the distance between semiconductor memory elements is shortened, a plurality of memory functional elements do not interfere with each other, and stored information can be held. Therefore, reduction in the size of the semiconductor memory element is facilitated. In the case where the charge retaining region in the memory functional element is made of a conductor, as the distance between semiconductor memory elements decreases, interference occurs between the charge retaining regions due to capacitive coupling, so that stored information cannot be held.

In the case where the charge retaining region in the memory functional element is made of an insulator (for example, a silicon nitride film), it becomes unnecessary to make the memory functional element independent for each memory cell. For example, the memory functional elements formed on both sides of a single word line shared by a plurality of sidewall memory cells do not have to be isolated for each memory cell. The memory functional elements formed on both sides of one word line can be shared by a plurality of memory cells sharing the word line. Consequently, a photo etching process for isolating the memory functional element becomes unnecessary, and the manufacturing process is simplified.

Further, a margin for positioning in the photolithography process and a margin for film reduction by etching become unnecessary, so that the margin between neighboring semiconductor memory elements can be reduced. Therefore, as compared with the case where the charge retaining region in the memory functional element is made of a conductor (for example, polysilicon film), even when the memory functional element is formed at the same microfabrication level, a semiconductor memory element occupied area can be reduced. In the case where the charge retaining region in the memory functional element is made of a conductor, the photo etching process for isolating the memory functional element for each semiconductor memory element is necessary, and a margin for positioning in the photolithography process and a margin for film reduction by etching are necessary.

Moreover, since the electrode having the function of assisting the programming and erasing operations does not exist on the memory functional element and the device structure is simple, the number of processes decreases, so that the yield in manufacturing can be increased. Therefore, it facilitates formation with a transistor as a component of a logic circuit or an analog circuit, and a cheap semiconductor memory device can be obtained.

The present invention is more useful in the case where not only the requirements (3) and (9) but also the requirement (6) are satisfied. Specifically, by overlapping the charge retaining region in the memory functional element with the diffusion region, programming and erasing can be performed with a very low voltage. Specifically, with a low voltage of 5 V or less, the programming and erasing operations can be performed. The action produces a very large effect also from the viewpoint of circuit designing. Since it becomes unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as an occupied area in a memory, an occupation area of peripheral circuits for driving a semiconductor memory element is dominant more than that of a semiconductor memory element. Consequently, omission or down sizing of the charge pumping circuit for a semiconductor memory element is most effective to reduce the chip size.

On the other hand, in the case where the requirement (3) is not satisfied, that is, in the case where a conductor retains charges in the memory functional element, even if the requirement (6) is not satisfied, specifically, even if the conductor in the memory functional element and the diffusion region do not overlap with each other, programming operation can be performed. This is because that the conductor in the memory functional element assists programming operation by capacitive coupling with the gate electrode.

In the case where the requirement (9) is not satisfied, specifically, in the case where the electrode having the function of assisting the programming and erasing operations exists on the memory functional element, even if the requirement (6) is not satisfied, specifically, even if the insulator in the memory functional element and the diffusion region do not overlap with each other, programming operation can be performed.

In the semiconductor memory element of the present invention, a transistor may be connected in series with one of or both sides of a semiconductor memory element, or the semiconductor memory element may be mounted on the same chip with a logic transistor. In such a case, the semiconductor element of the present invention, particularly, the semiconductor memory element can be formed by a process having high compatibility with a process of forming a normal standard transistor such as a transistor or a logic transistor, so that they can be formed simultaneously. Therefore, a process of forming both the semiconductor memory element and a transistor or a logic transistor is very simple and, as a result, a cheap embedding device can be obtained.

In the semiconductor memory element of the present invention, the semiconductor memory element can store information of two or more values in one memory functional element. Thus, the semiconductor memory element can function as a semiconductor memory element for storing information of four or more values. The semiconductor memory element may store binary data only. The semiconductor memory element is also allowed to function as a semiconductor memory element having the functions of both a selection transistor and a memory transistor by a variable resistance effect of the memory functional element.

(Semiconductor Memory Element as Object of the Present Invention: First Configuration Example)

Next, the typical structure, characteristics, and operating principle of the semiconductor memory element will be concretely described with reference to the drawings.

The semiconductor memory element shown in FIG. 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional elements 105a and 105b for actually retaining charges. The memory functional element refers to a part in which charges are actually accumulated by rewriting operation in the memory functional element or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film configure a part of the channel region.

Figure 2:
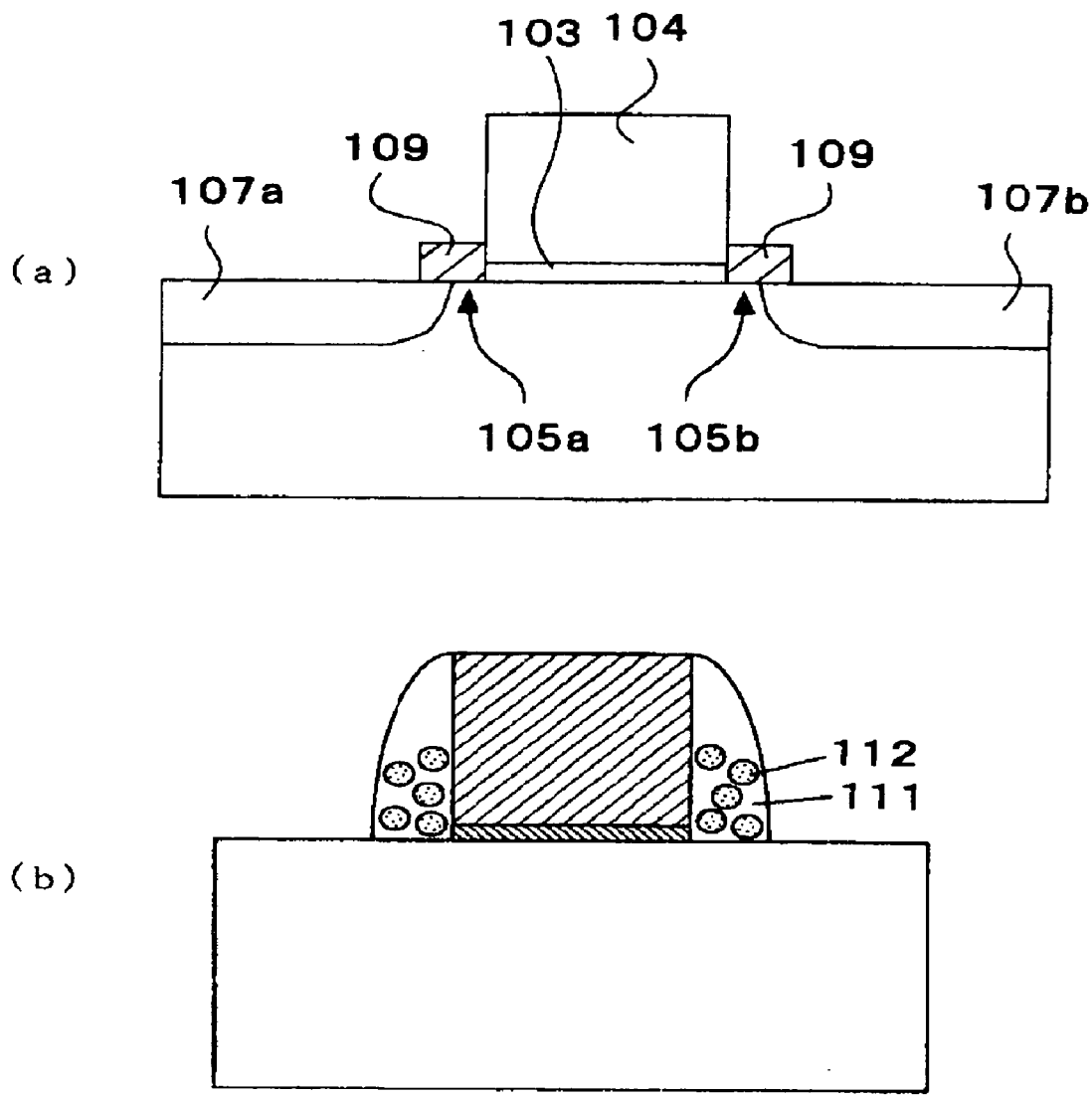
FIG. 2 is a schematic cross section diagram of a main portion of a modification of the semiconductor memory element (first configuration example) as an object of the present invention.

The memory functional elements 105a and 105b for substantially retaining charges are side wall parts of the gate electrode 104. Therefore, it is sufficient that the silicon nitride film 109 is formed only in regions corresponding to the parts (see FIG. 2A). The memory functional elements 105a and 105b may have a structure in which particles 111 made of conductor or semiconductor having a nanometer size are distributed in an insulating film 112 (see FIG. 2B). When the size of the particle 111 is less than 1 nm, the quantum effect is too large and it becomes difficult for charges to tunnel dots. When the size exceeds 10 nm, however, a noticeable quantum effect does not appear at room temperature. Therefore, the diameter of the particle 111 lies preferably in the range from 1 nm to 10 nm. Further, the silicon nitride film 109 serving as a charge retaining film may be formed in the side wall spacer shape on side faces of the gate electrode (see FIG. 3).

The principle of the programming operation of the semiconductor memory element will be described with reference to FIGS. 3 and 4. The case where whole memory functional elements 131a and 131b have the function of retaining charges will be described. "Programming" denotes here injection of electrons into the memory functional elements 131a and 131b when the semiconductor memory element is of the N channel type. Hereinafter, on assumption that the semiconductor memory element is of the N channel type, description will be given.

Figure 3:
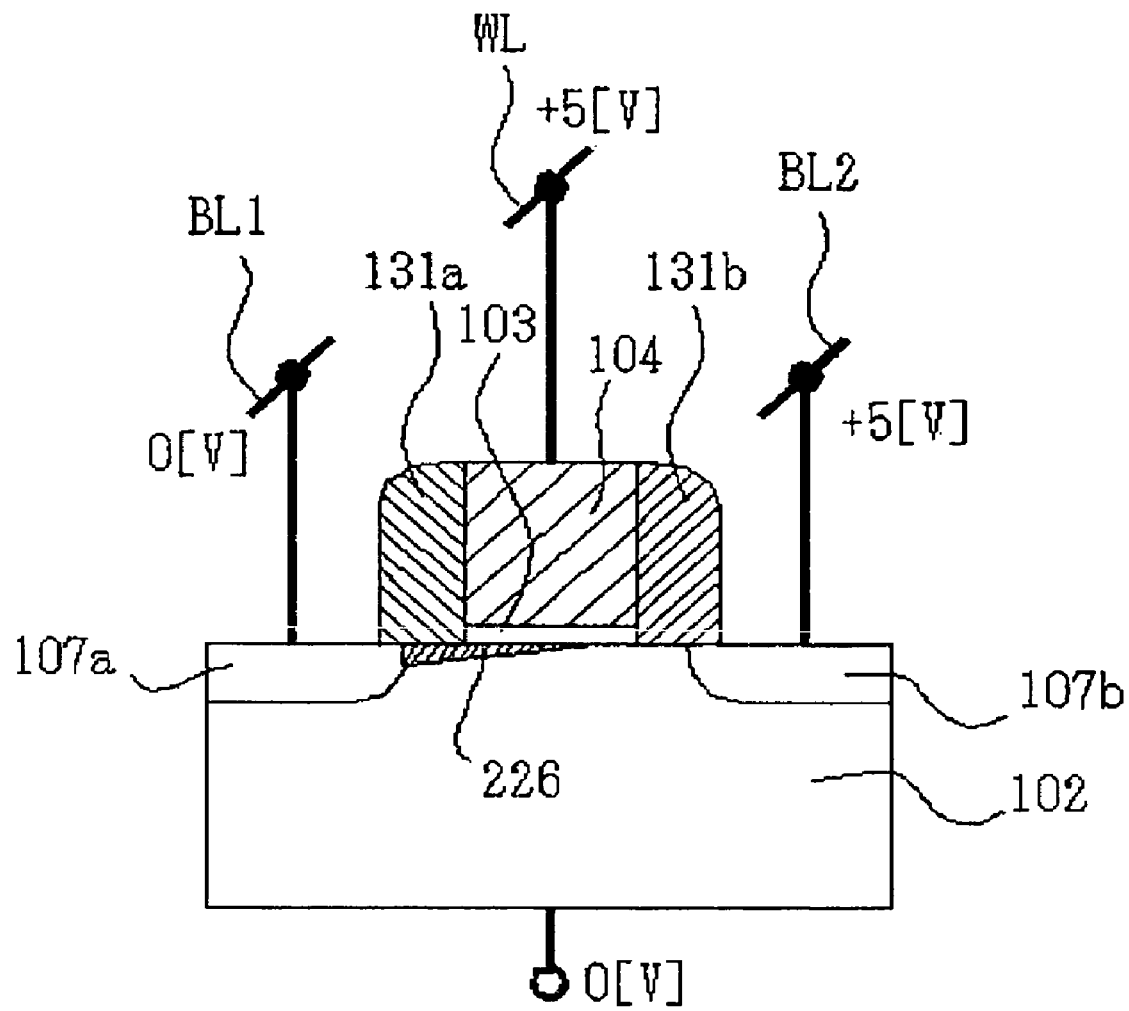
FIG. 3 is a diagram illustrating programming operation of the semiconductor memory element (first configuration example) as an object of the present invention.

In order to inject electrons (to program) into the second memory functional element 131b, as shown in FIG. 3, the first diffusion region 107a of the N-type is set as the source electrode, and the second diffusion region 107b of the N-type is set as the drain electrode. For example, 0 V is applied to the first diffusion region 107a and the P-type well region 102, +5 V is applied to the second diffusion region 107b, and +5 V is applied to the gate electrode 104. With such voltage parameters, an inversion layer 226 extends from the first diffusion region 107a (source electrode), but does not reach the second diffusion region 107b (drain electrode), so that a pinch-off point is generated. Electrons are accelerated from the pinch-off point to the second diffusion region 107b (drain electrode) by high electric field and become so-called hot electrons (conductive electrons of high energy). The hot electrons are injected into the second memory functional element 131b, thereby performing programming. Since hot electrons are not generated in the vicinity of the first memory functional element 131a, programming is not performed.

Figure 4:
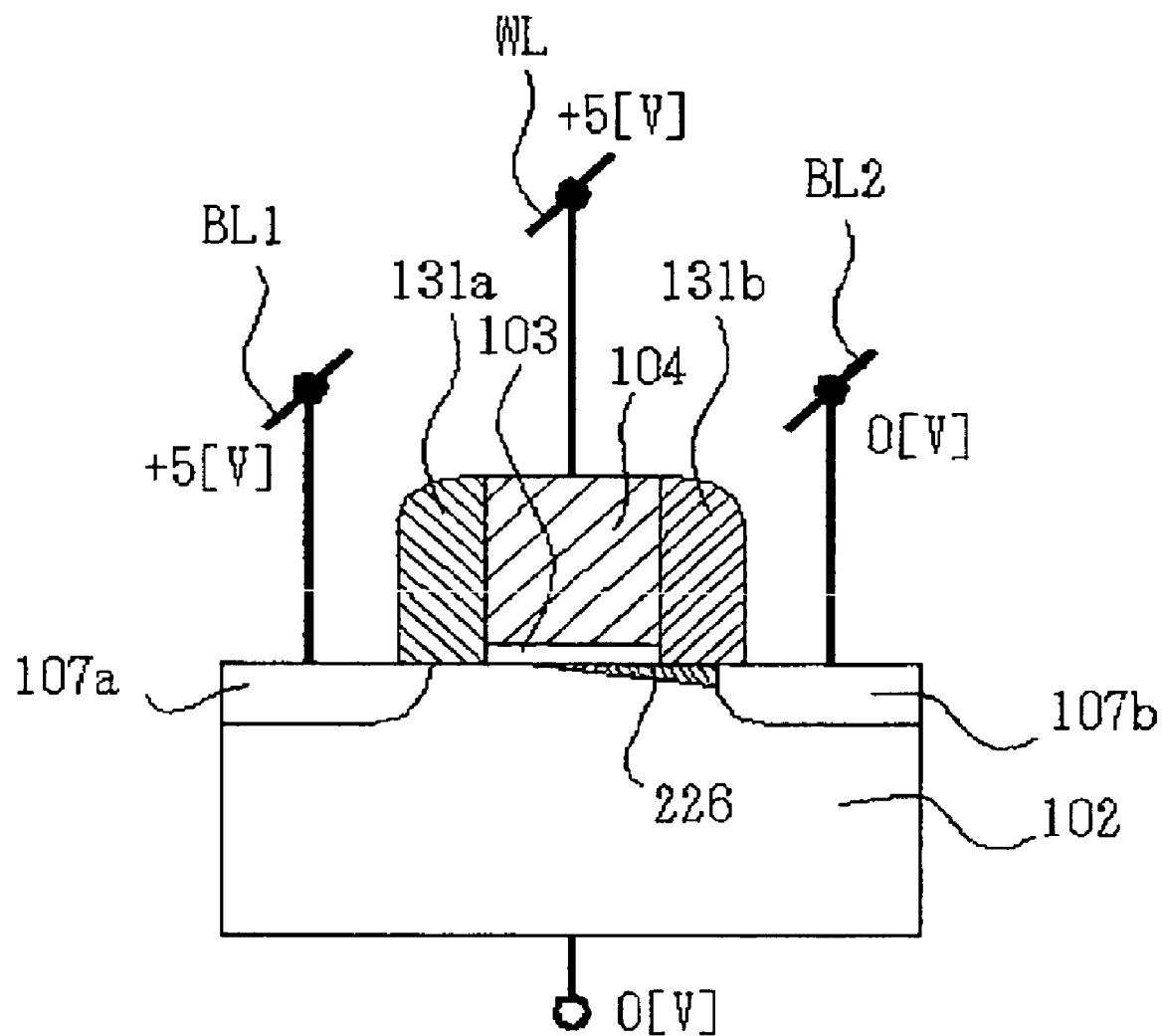
FIG. 4 is a diagram illustrating the programming operation of the semiconductor memory element (first configuration example) as an object of the present invention.

On the other hand, in order to inject electrons (to program) into the first memory part 131a, as shown in FIG. 4, the second diffusion region 107b is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. As described above, by interchanging the source and drain regions in the case of injecting electrons into the second memory functional element 131b, programming can be performed by injecting electrons into the first memory functional element 131a.

The principle of erasing operation of the semiconductor memory element will now be described with reference to FIGS. 5 and 6.

Figure 5:
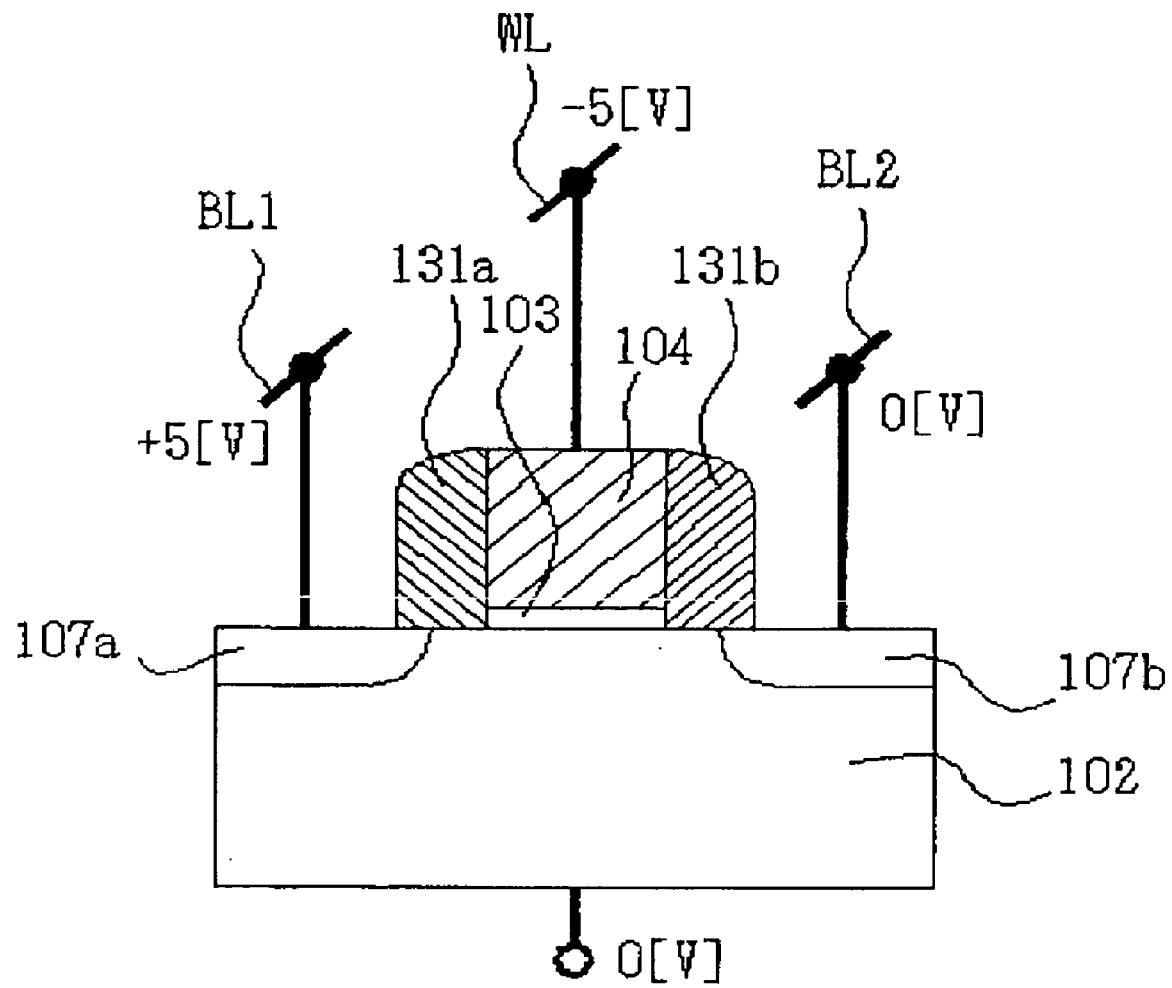
FIG. 5 is a diagram illustrating erasing operation of the semiconductor memory element (first configuration example) as an object of the present invention.

In a first method of erasing information stored in the first memory functional element 131a, as shown in FIG. 5, a positive voltage (for example, +5 V) is applied to the first diffusion region 107a, 0 V is applied to the P-type well region 102, a backward bias is applied to the PN junction between the first diffusion region 107a and the P-type well region 102, and a negative voltage (for example, −5 V) is applied to the gate electrode 104. At this time, in the vicinity of the gate electrode 104 in the PN junction, due to the influence of the gate electrode to which the negative electrode is applied, the gradient of potential becomes particularly sharp. Due to this, hot holes (positive holes of high energy) are generated on the side of the P-type well region 102 in the PN junction by interband tunneling. The hot holes are attracted by the gate electrode 104 having the negative potential and, as a result, holes are injected into the first memory functional element 131a. In such a manner, information in the first memory functional element 131a is erased. At this time, it is sufficient to apply 0 V to the second diffusion region 107b.

In the case of erasing information stored in the second memory functional element 131b, it is sufficient to interchange the potential in the first diffusion region and the potential in the second diffusion region in the above example.

Figure 6:
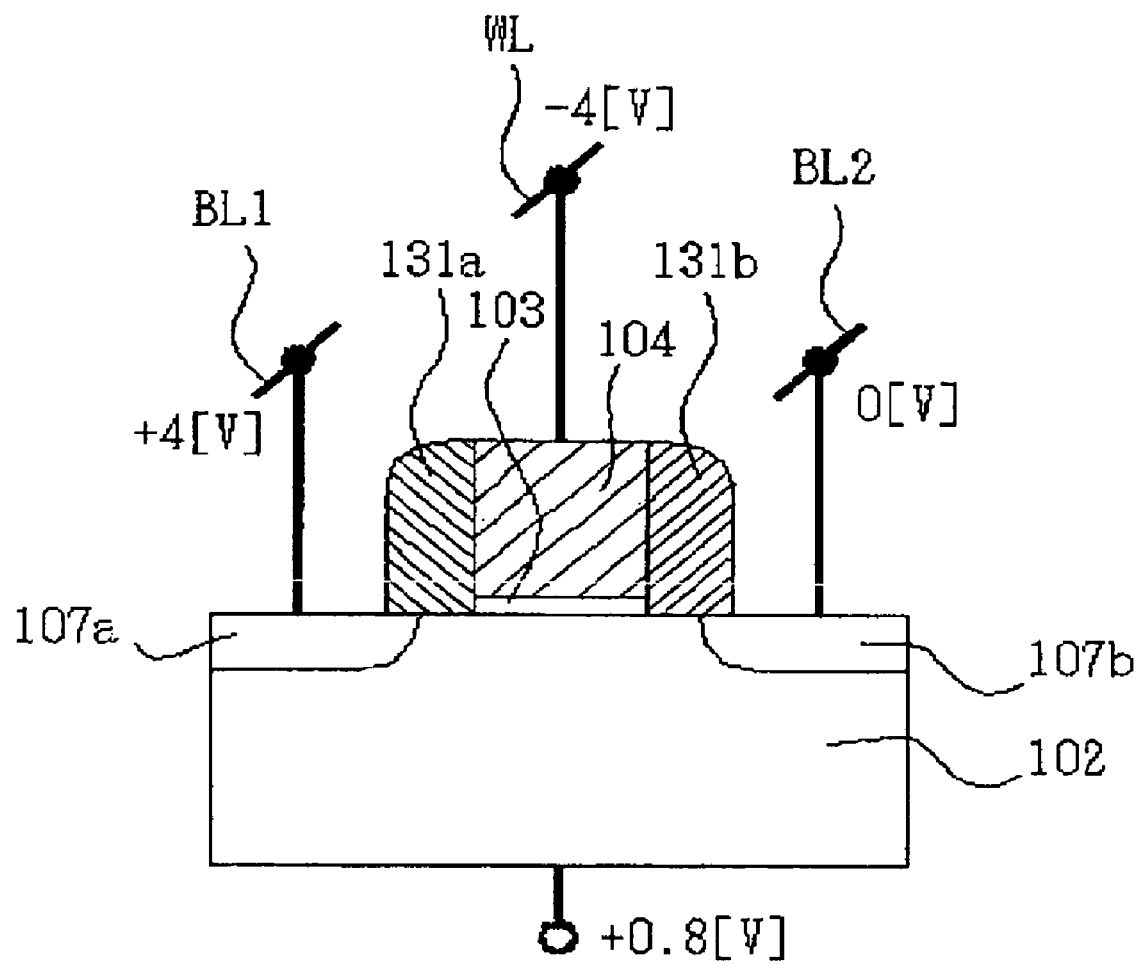
FIG. 6 is a diagram illustrating the erasing operation of the semiconductor memory element (first configuration example) as an object of the present invention.

According to a second method of erasing information stored in the first memory functional element 131a, as shown in FIG. 6, a positive voltage (for example, +4 V) is applied to the first diffusion region 107a, 0 V is applied to the second diffusion region 107b, a negative voltage (for example, −4 V) is applied to the gate electrode 104, and a positive voltage (for example, +0.8 V) is applied to the P-type well region 102. At this time, a forward voltage is applied between the P-type well region 102 and the second diffusion region 107b, and electrons are injected into the P-type well region 102. The injected electrons are diffused to the PN junction between the P-type well region 102 and the first diffusion region 107a and accelerated by the high electric field, thereby becoming hot electrons. The hot electrons generate electron-hole pairs in the PN junction. To be specific, by applying a forward voltage between the P-type well region 102 and the second diffusion region 107b, electrons injected in the P-type well region 102 become a trigger and hot holes are generated in the PN junction positioned on the opposite side. The hot holes generated in the PN junction are attracted by the gate electrode 104 and, as a result, positive holes are injected into the first memory functional element 131a.

According to the method, also in the case where only a voltage insufficient to generate hot holes by interband tunneling is applied in the PN junction between the P-type well region and the first diffusion region 107a, electrons injected in the second diffusion region 107b become a trigger of generating the electron-hole pairs in the PN junction, and hot holes can be generated. Therefore, a voltage in the erasing operation can be decreased. Particularly, when the offset region 120 (see FIG. 1) exists, an effect that the gradient of potential in the PN junction becomes sharp by the gate electrode to which a negative potential is applied is small. Consequently, it is difficult to generate hot holes by the interband tunneling. The second method overcomes the drawback and can realize the erasing operation with a low voltage.

In the case of erasing information stored in the first memory functional element 131a, according to the first erasing method, +5 V has to be applied to the first diffusion region 107a. According to the second erasing method, +4 V is sufficient. As described above, according to the second method, the voltage in the erasing operation can be decreased, so that power consumption can be reduced and deterioration in the semiconductor memory element due to hot carriers can be suppressed.

In any of the erasing methods, over-erasure does not occur easily in the semiconductor memory element. The over-erasure here denotes a phenomenon that as the amount of positive holes accumulated in the memory functional element increases, the threshold decreases without saturation. The over-erasure is a big issue in an EEPROM typified by a flash memory. Particularly, in the case where the threshold becomes negative, critical malfunctioning that selection of a semiconductor memory element becomes impossible occurs. On the other hand, in the semiconductor memory element in the semiconductor memory device of the present invention, also in the case where a large amount of positive holes are accumulated in the memory functional element, only electrons are induced below the memory functional element, but an influence is hardly exerted to the potential in the channel region below the gate insulating film. Since the threshold at the time of erasing is determined by the potential below the gate insulating film, occurrence of over-erasure is suppressed.

Figure 7:
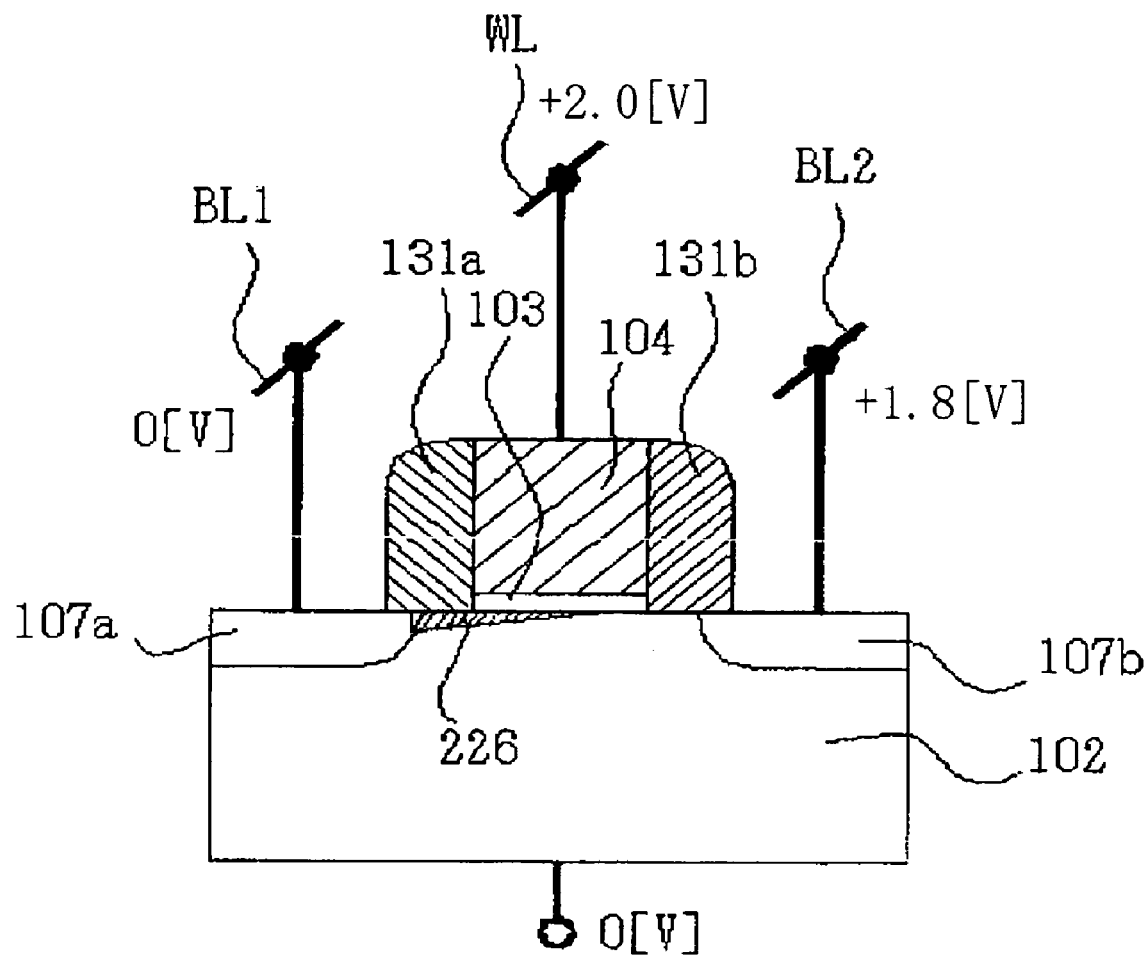
FIG. 7 is a diagram illustrating reading operation of the semiconductor memory element (first configuration example) as an object of the present invention.

Further, the principle of reading operation of the semiconductor memory element will be described with reference to FIG. 7.

In the case of reading information stored in the first memory functional element 131a, a transistor is operated in a saturation region by using the first diffusion region 107a as a source electrode and using the second diffusion region 107b as a drain electrode. For example, 0 V is applied to the first diffusion region 107a and the P-type well region 102, +1.8 V is applied to the second diffusion region 107b, and +2 V is applied to the gate electrode 104. In the case where no electrons are accumulated in the first memory functional element 131a at this time, drain current tends to flow. On the other hand, in the case where electrons are accumulated in the first memory functional element 131a, an inversion layer is not easily formed in the vicinity of the first memory functional element 131a, so that the drain current does not easily flow. Therefore, by detecting the drain current, information stored in the first memory functional element 131a can be read. Since the pinch off occurs in the vicinity of the drain at this time, whether charges are accumulated in the second memory functional element 131b or not does not exert an influence on the drain current.

In the case of reading information stored in the second memory functional element 131b, the transistor is operated in a saturation region by using the second diffusion region 107b as a source electrode and using the first diffusion region 107a as a drain electrode. It is sufficient to apply, for example, 0 V to the second diffusion region 107b and the P-type well region 102, +1.8 V to the first diffusion region 107a, and +2 V to the gate electrode 104. By interchanging the source and drain regions of the case of reading information stored in the first memory functional element 131a, information stored in the second memory functional element 131b can be read.

In the case where there is a channel region (offset region 120) which is not covered with the gate electrode 104, an inversion layer is dissipated or formed according to the presence/absence of excessive charges in the memory functional elements 131a and 131b in the channel region which is not covered with the gate electrode 104. As a result, a large hysteresis (change in the threshold) can be obtained. However, if the offset region 120 is too wide, the drain current largely decreases and the reading speed becomes much lower. Therefore, it is preferable to determine the width of the offset region 120 so that a sufficient hysteresis and reading speed can be obtained.

Even in the case where the diffusion regions 107a and 107b extend to the ends of the gate electrode 104, that is, the diffusion regions 107a and 107b overlap with the gate electrode 104, the threshold of the transistor is hardly changed by the programming operation. However, parasitic resistance at ends of the source and drain largely changes and the drain current greatly decreases (by one digit or more). Therefore, the reading operation can be performed by detecting the drain current, and the function of a memory can be obtained. In the case where a larger memory hysteresis effect is necessary, preferably, the diffusion regions 107a and 107b do not overlap with the gate electrode 104 (the offset region 120 exists).

By the above operating method, selective programming/erasing of two bits per one transistor can be realized. In the above-described operating method, by interchanging the source electrode and the drain electrode, programming and erasing of two bits per one transistor is performed. Alternatively, the semiconductor memory element can also operate as a 1-bit memory by fixing the source electrode and the drain electrode.

As obvious from the above description, in the semiconductor memory element in the semiconductor memory device of the present invention, the memory functional element is formed independently of the gate insulating film, and is formed on both sides of the gate electrode, so that 2-bit operation is possible. Since each memory functional element is isolated by the gate electrode, interference at the time of rewriting is effectively suppressed. Further, since the gate insulating film is isolated from the memory functional element, the semiconductor memory element can be formed thinly and a short channel effect can be suppressed. Therefore, reduction in size of the semiconductor memory element and, accordingly, the semiconductor memory device can be achieved easily.

(Semiconductor Memory Element as Object of the Present Invention: First Modification)

Figure 8:
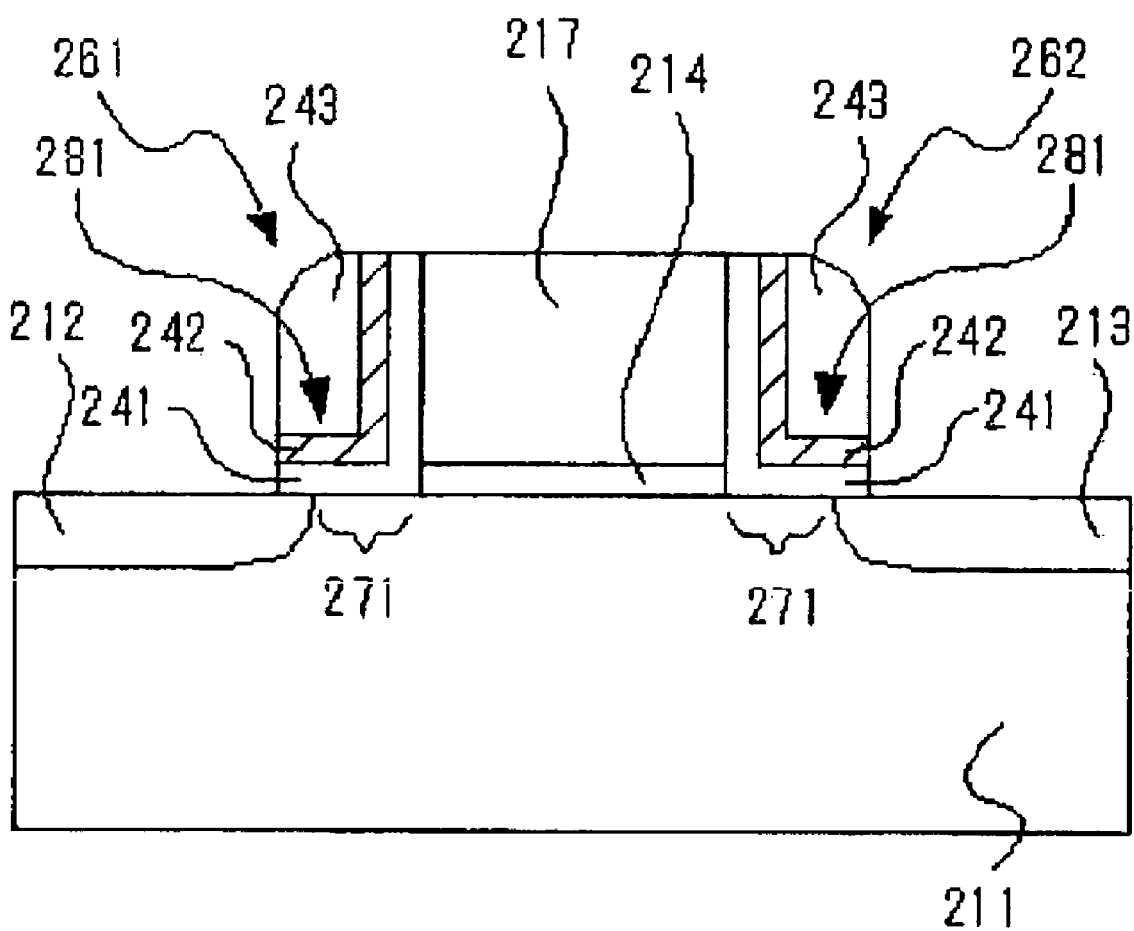
FIG. 8 is a schematic cross section diagram of a main portion of the semiconductor memory element (first modification) as an object of the present invention.

A semiconductor memory element has a configuration substantially similar to that of the semiconductor memory element 1 of FIG. 1 except that, as shown in FIG. 8, each of memory functional elements 261 and 262 is configured by a charge retaining region (which is a charge accumulating region and may be a film having the function of retaining charges) and a region for suppressing escape of charges (or a film having the function of suppressing escape of charges).

Preferably, from the viewpoint of improving the retaining characteristic of the memory, the memory functional element includes a charge retaining film having the function of retaining charges and an insulating film. In the first modification, a silicon nitride film 242 having a level of trapping charges is used as the charge retaining film and silicon oxide films 241 and 243 having the function of preventing escape of charges accumulated in the charge retaining film are used as the insulating films. When the memory functional element includes the charge retaining film and the insulating film, escape of charges is prevented and the retaining characteristic can be improved. As compared with the case where the memory functional element is configured only by the charge retaining film, the volume of the charge retaining film can be reduced properly and, by regulating movement of charges in the charge retaining film, occurrence of a change in the characteristics due to movement of charges during retention of information can be suppressed. Further, by employing the structure in which the silicon nitride film 242 is sandwiched by the silicon oxide films 241 and 243, the charge injection efficiency at the time of rewriting operation becomes high and the operation can be performed at higher speed. In the semiconductor memory element, the silicon nitride film 242 may be replaced with a ferroelectric.

The regions of retaining charges (silicon nitride film 242) in the memory functional elements 261 and 262 overlap with diffusion regions 212 and 213. Overlap means here that at least a part of the charge retaining region (silicon nitride film 242) exists over at least a part of the diffusion regions 212 and 213. 211 denotes a semiconductor substrate, 214 denotes a gate insulating film, 217 indicates a gate electrode, and 271 expresses offset regions between the gate electrode 217 and the diffusion regions 212 and 213. Although not shown, the uppermost surface of the semiconductor substrate 211 below the gate insulating film 214 is a channel region.

Effects produced by the overlap between the silicon nitride films 242 as the charge retaining regions in the memory functional elements 261 and 262 and the diffusion regions 212 and 213 will now be described.

Figure 9:
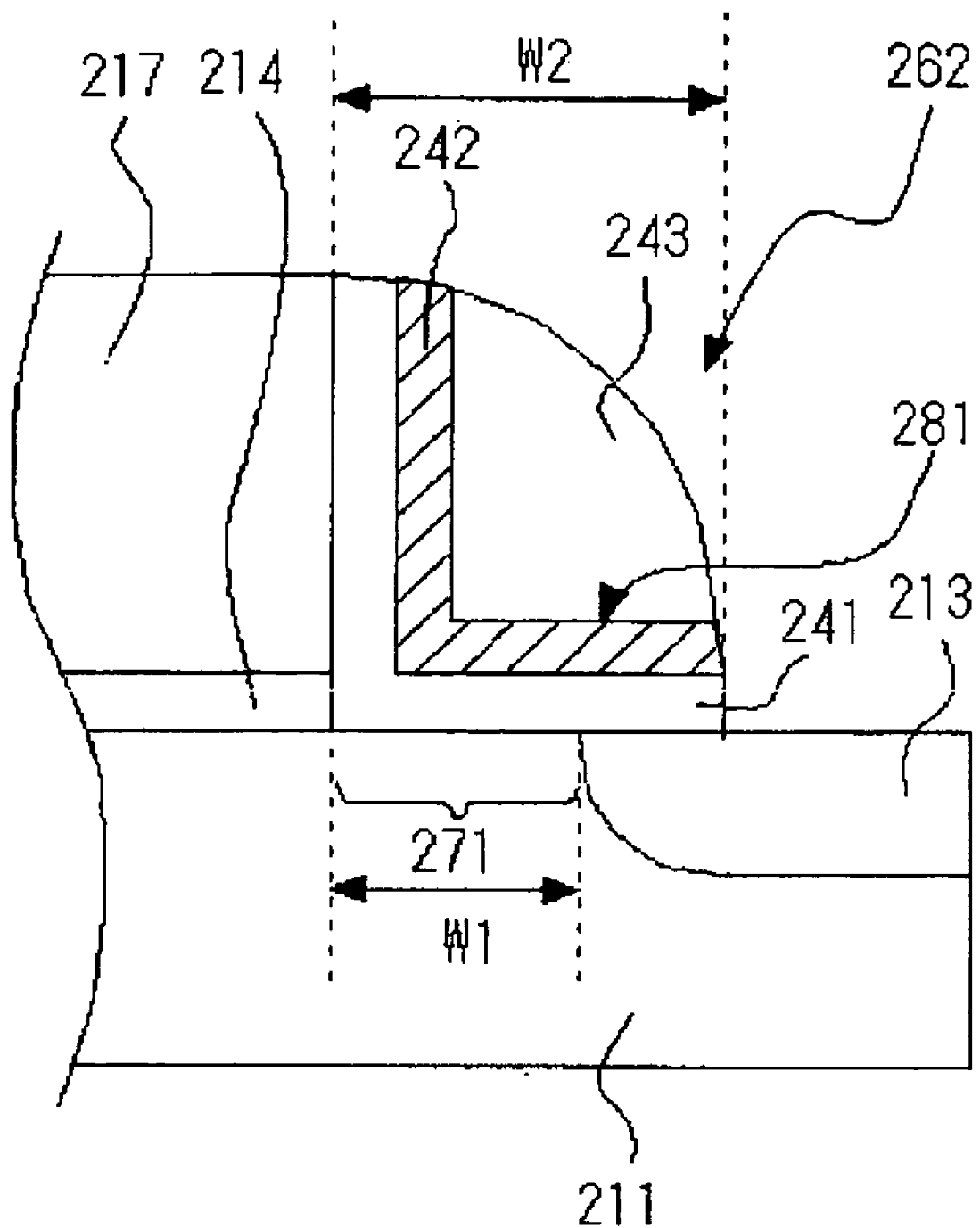
FIG. 9 is an enlarged schematic cross section diagram of a main portion of the semiconductor memory element (first modification) of FIG. 8.

As shown in FIG. 9, in the area around the memory functional element 262, when an offset amount between the gate electrode 217 and the diffusion region 213 is W1 and the width of the memory functional element 262 in a cutting plane in the channel length direction of the gate electrode is W2, an overlap amount between the memory functional element 262 and the diffusion region 213 is expressed by "W2−W1". It is important that the silicon nitride film 242 in the memory functional element 262 overlaps the diffusion region 213, that is, the relation of "W2>W1" is satisfied.

In FIG. 9, since the end on the side apart from the gate electrode 217, of the silicon nitride film 242 in the memory functional element 262 coincides with the end of the memory functional element 262 on the side apart from the gate electrode 217, the width of the memory functional element 262 is defined as W2.

Figure 10:
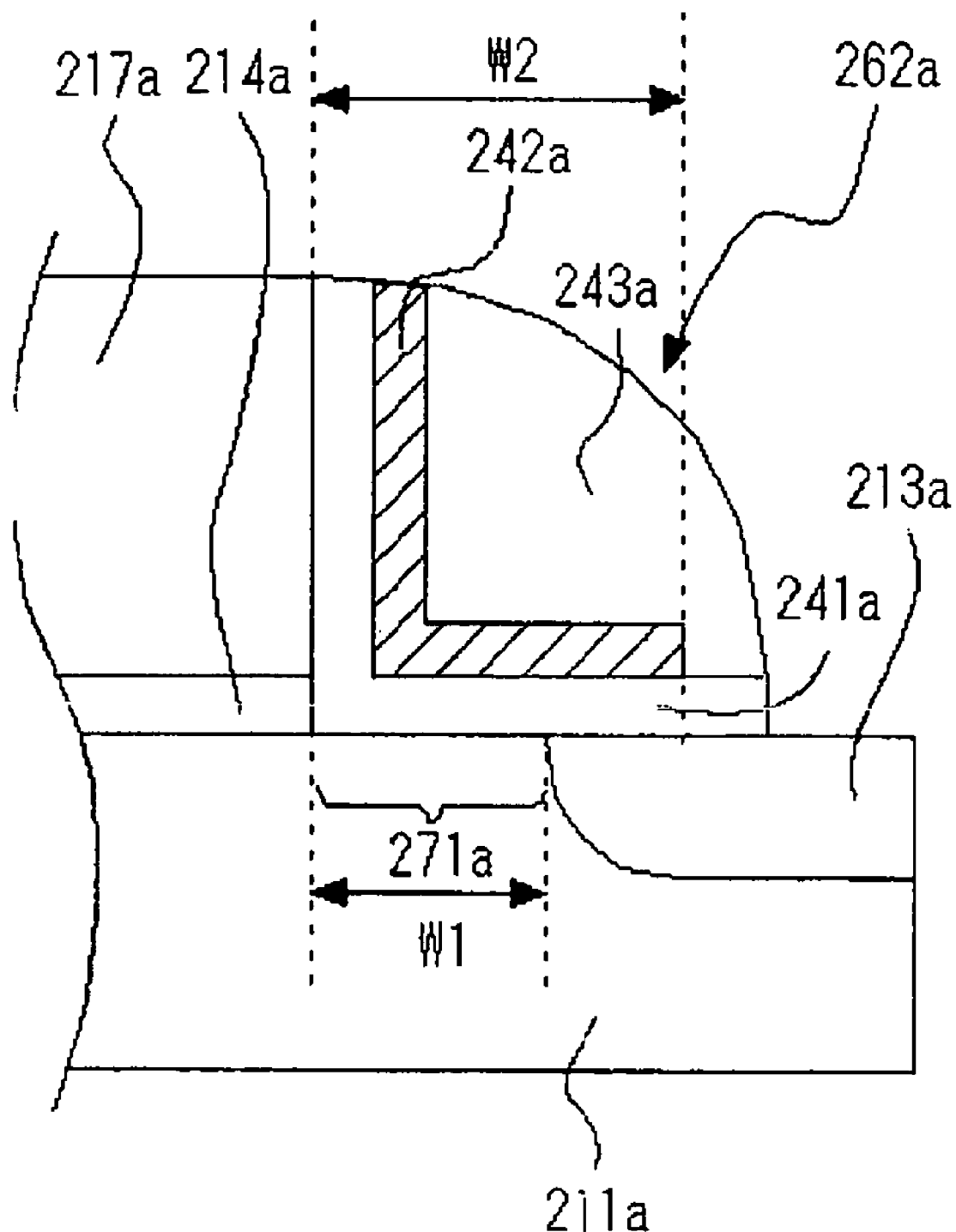
FIG. 10 is an enlarged schematic cross section diagram of a main portion of a modification of the semiconductor memory element (first modification) of FIG. 8.

As shown in FIG. 10, when the end on the side apart from a gate electrode 217a, of a silicon nitride film 242a in a memory functional element 262a does not coincide with the end of the memory functional element 262a on the side apart from the gate electrode 217a, W2 may be defined as a width from the end of the gate electrode to the end on the side apart from the gate electrode of the silicon nitride film 242a.

Figure 11:
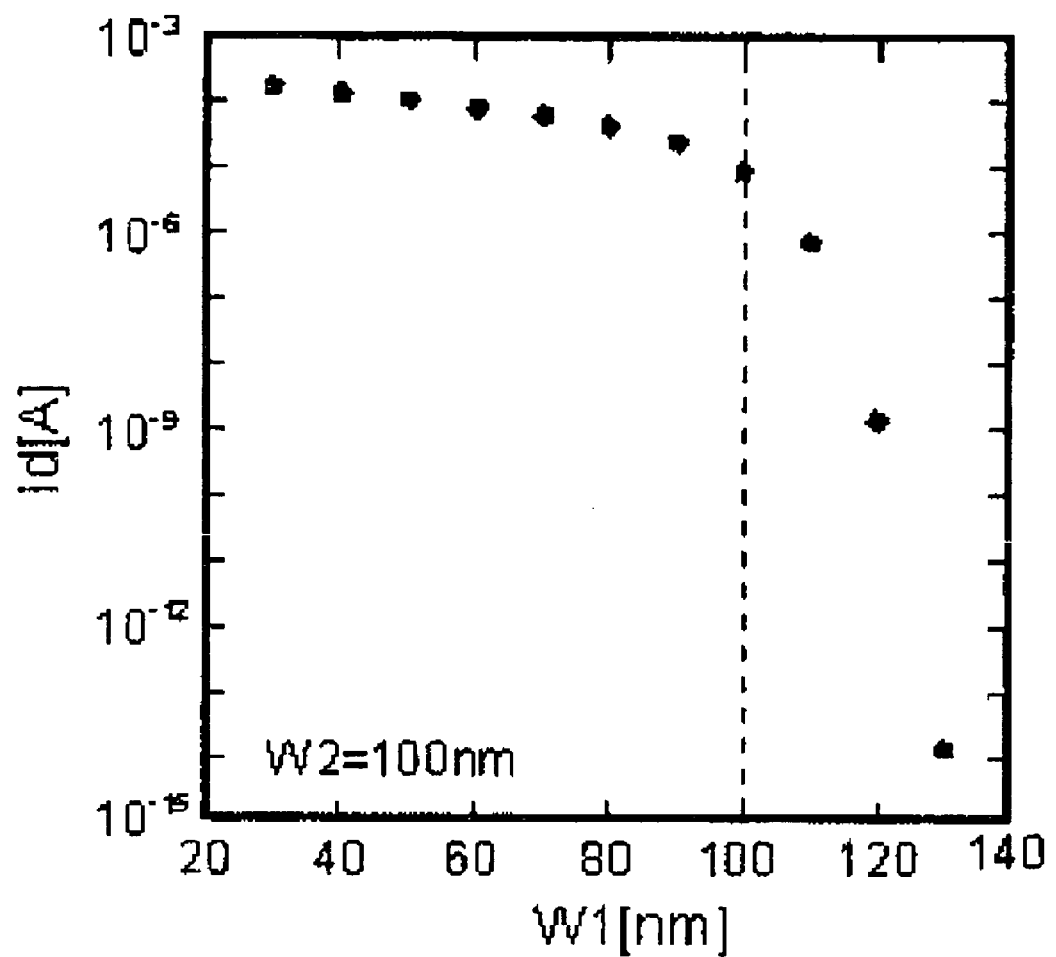
FIG. 11 is a graph showing electric characteristics of a semiconductor memory element (first modification) as an object of the present invention.

FIG. 11 shows drain current Id when the width W2 of the memory functional element 262 is fixed to 100 nm and the offset amount W1 is changed in the structure of the semiconductor memory element of FIG. 9. The drain current was obtained by device simulation on assumption that the memory functional element 262 is in erasing state (holes are accumulated), and the diffusion regions 212 and 213 serve as the source electrode and the drain electrode, respectively.

As obvious from FIG. 11, when W1 is 100 nm or more (that is, the silicon nitride film 242 and the diffusion region 213 do not overlap with each other), the drain current sharply decreases. Since the drain current value is almost proportional to the read operation speed, the performance of the memory sharply deteriorates when W1 is 100 nm or more. On the other hand, in the range where the silicon nitride film 242 and the diffusion region 213 overlap with each other, decrease in the drain current is gentle. Therefore, in the case of considering also variations in mass production, without overlap between at least a part of the silicon nitride film 242 as the film having the function of retaining charges and the source and drain regions, it is difficult to actually obtain the memory function.

On the basis of the result of the device simulation, by fixing W2 to 100 nm and setting W1 to 60 nm and 100 nm as design values, semiconductor memory element arrays were produced. In the case where W1 is 60 nm, the silicon nitride film 242 and each of the diffusion regions 212 and 213 overlap with each other by 40 nm as a design value. In the case where W1 is 100 nm, there is no overlap as a design value. Reading time of the semiconductor memory element arrays was measured and worst cases in which variations were considered were compared with each other. In the case where W1 was set to 60 nm as a design value, read access time was 100 times as fast as that of the other case. In practice, the read access time is preferably 100 n/sec or less per one bit. When W1=W2, this condition cannot be satisfied. In the case of considering manufacture variations as well, it is more preferable that (W2−W1)>10 nm be satisfied.

In reading of information stored in the memory functional element 261 (region 281), in a manner similar to the first embodiment, it is preferable to set the diffusion region 212 as a source region, set the diffusion region 213 as a drain region, and form a pinch-off point on the side closer to the drain region in the channel region. Specifically, at the time of reading information stored in one of two memory functional elements, it is preferable to form a pinch-off point in a region close to the other memory functional element in the channel region. With the configuration, irrespective of the storage state of the memory functional element 262, information stored in the memory functional element 261 can be detected with high sensitivity, and it enables a 2-bit operation to be performed.

On the other hand, in the case of storing information in only one of two memory functional elements or in the case of using two memory functional elements in the same storage state, it is not always necessary to form a pinch-off point at the time of reading.

Although not shown in FIG. 8, it is preferable to form a well region (P-type well in the case of an N-channel device) in the surface of the semiconductor substrate 211. By forming the well region, while optimizing the impurity concentration in the channel region to memory operations (rewriting operation and reading operation), the other electric characteristics (withstand voltage, junction capacitance and short channel effect) can be controlled more easily.

Figure 12:
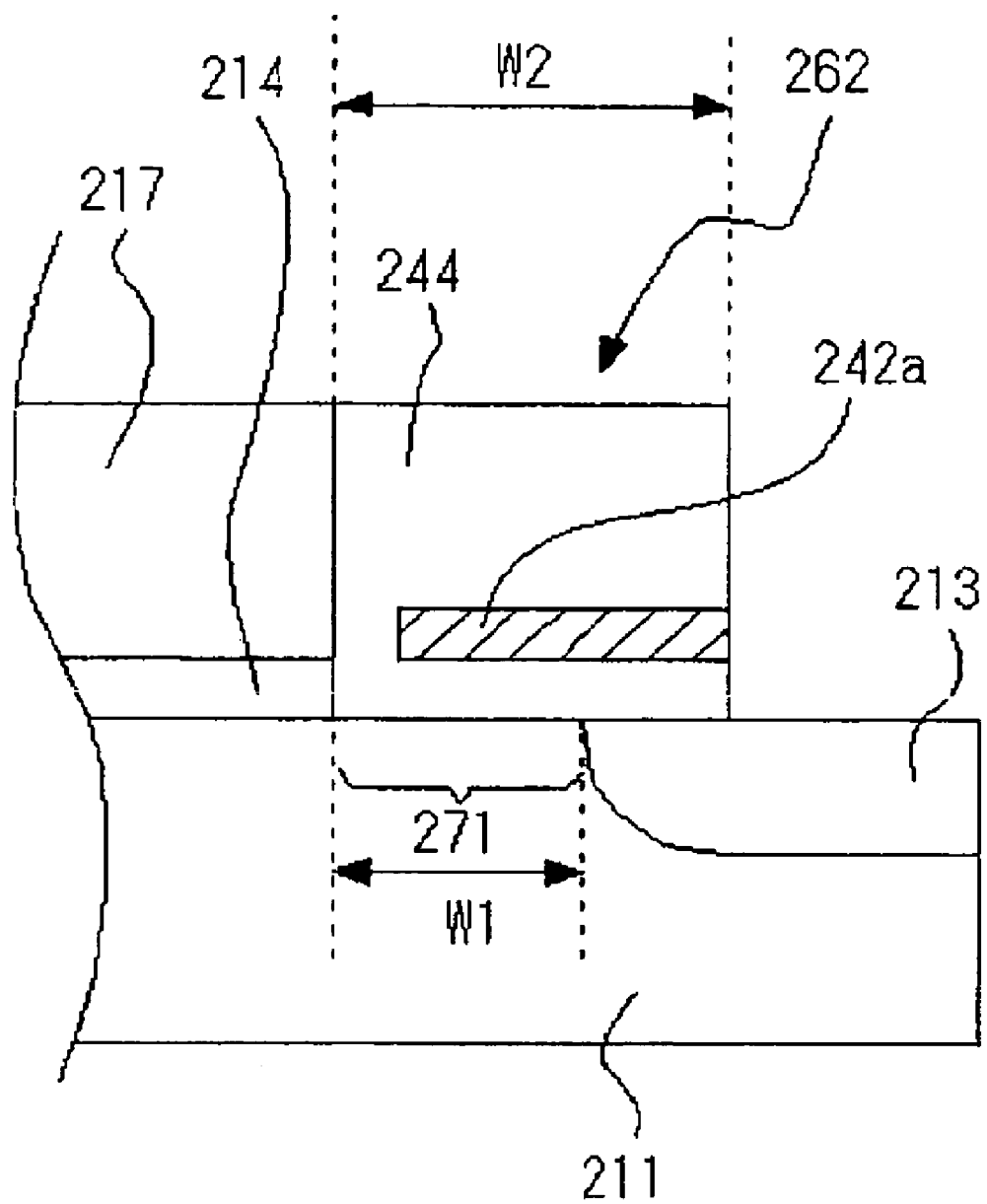
FIG. 12 is a schematic cross section diagram of a main portion of a modification of the semiconductor memory element (first modification) as an object of the present invention.

Preferably, the memory functional element includes the charge retaining film which is disposed almost parallel with the surface of the gate insulating film. In other words, it is preferable to dispose the memory functional element so that the top surface of the charge retaining film in the memory functional element is positioned in a distance equal from the top surface of the gate insulating film. Specifically, as shown in FIG. 12, the silicon nitride film 242a as the charge retaining film in the memory functional element 262 has a surface almost parallel with the surface of the gate insulating film 214. In other words, it is preferable that the silicon nitride film 242a be formed at a constant level from the level of the surface of the gate insulating film 214.

Because of the existence of the silicon nitride film 242a which is almost parallel with the surface of the gate insulating film 214 in the memory functional element 262, easiness of formation of an inversion layer in the offset region 271 can be effectively controlled in accordance with the amount of charges accumulated in the silicon nitride film 242a and, moreover, the memory effect can be increased. By forming the silicon nitride film 242a almost parallel with the surface of the gate insulating film 214, even in the case where the offset amount (W1) varies, a change in the memory effect can be maintained to be relatively small and variations in the memory effect can be suppressed. Moreover, movement of charges to the upper portion in the silicon nitride film 242a is suppressed and occurrence of a characteristic change due to movement of charges during retention of information can be suppressed.

Further, it is preferable that the memory functional element 262 include an insulating film (for example, a portion over the offset region 271 in the silicon oxide film 244) for separating the silicon nitride film 242a which is almost parallel to the surface of the gate insulating film 214 from the channel region (or well region). By the insulating film, dissipation of the charges accumulated in the charge retaining film is suppressed and a semiconductor memory element having a better retaining characteristic can be obtained.

By controlling the thickness of the silicon nitride film 242a and controlling the thickness of the insulating film below the silicon nitride film 242a (portion over the offset region 271 in the silicon oxide film 244) to be constant, the distance from the surface of the semiconductor substrate to charges accumulated in the charge retaining film can be maintained almost constant. To be specific, the distance from the surface of the semiconductor substrate to the charges accumulated in the charge retaining film can be controlled to be in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the semiconductor memory element can be reduced very much.

First Embodiment

An embodiment of a method of evaluating characteristics of a semiconductor memory element and a model parameter extracting method according to the present invention will be described with reference to the drawings. In the following description, unless otherwise specified, it is assumed that the semiconductor memory element of the first configuration example or first modification is used as a semiconductor memory element.

The present invention provides a characteristic evaluating method of obtaining a resistance value of the offset region (hereinafter, appropriately referred to as "offset resistance value") by subtracting the resistance value of the channel region just below the gate electrode and the resistance value of the diffusion regions from the resistance value between two diffusion regions. The resistance value between the two diffusion regions, the resistance value of the channel region just below the gate electrode, and the resistance value of the diffusion region can be relatively easily obtained as will be described later in concrete examples. Therefore, by subtracting the resistance value of the channel region just below the gate electrode and the resistance values of the diffusion regions from the resistance value between the two diffusion regions, the resistance value of the offset region which is important for extraction of the model parameter of the semiconductor memory element can be easily obtained.

In the characteristic evaluating method, the channel resistance is not calculated by regarding the whole region for forming the channel between the two diffusion regions as a channel region but the region is divided into the channel region just below the gate electrode and the offset regions below the memory function elements and the channel resistance and the offset resistance are calculated for each of the regions. The reasons why the channel region is divided into two regions are that dependency on the voltage applied to each of the gate electrode, semiconductor layer, and diffusion layer varies between the two regions, and the influence of the state of erase or program of the memory function element is related only to the offset region. Therefore, by dividing the channel region into the channel region just below the gate electrode and the offset region below the memory function element and obtaining each resistance value, the characteristic evaluating method of a higher degree of physical properties can be provided.

Concretely, the resistance value between two diffusion regions (source and drain) of the semiconductor memory element is obtained from a voltage applied across the source and drain and a current flowing between the source and drain in a state where electrode terminals are connected to the two diffusion regions (source and drain) of the semiconductor memory element, the substrate, and the gate electrode and a normal transistor operation is performed. The resistance value is a resistance value of series resistance (combined resistance) of the two diffusion regions, two offset regions, and the channel region just below the gate electrode. By subtracting the resistance values of the two diffusion regions and the channel region just below the gate electrode from the resistance value, the resistance value of the two offset regions can be obtained. The resistance value of the diffusion region is obtained as follows. For example, the resistance value of the diffusion region is obtained from impurity concentration of the diffusion region and the thickness of the diffusion region (each of which can be obtained by actual measurement or simulation), and a diffusion resistance value per a predetermined size is calculated from the resistance value and the size of the diffusion region. On the basis of the diffusion resistance value per the predetermined size, resistance according to the shape of the diffusion region of the semiconductor memory element can be obtained. The resistance value of the channel region just below the gate electrode can be obtained by calculating, for example, resistance values between the two diffusion regions (source and drain) from a voltage applied across the source and drain of each of two or more semiconductor memory elements having different gate lengths and having the same gate width and current flowing between the source and drain, and calculating the resistance value of the channel region from a change amount of the resistance value with respect to the change amount of the gate length. From the size of the semiconductor memory element used for evaluation at that time and the resistance of the channel region, the channel resistance value per the predetermined size is obtained. Based on the channel resistance value per the predetermined size, the resistance according to the channel region shape of the semiconductor memory element can be obtained. By using the offset resistance value of the semiconductor memory element obtained by the characteristic evaluation method, it becomes easier to provide a model parameter with higher precision with respect to the electrostatic characteristic of the semiconductor memory element.

Means for obtaining the offset resistance value with higher precision in the characteristic evaluating method will be described.

In the method of evaluating characteristics of the semiconductor memory element, at the time of obtaining resistance between two diffusion regions, it is preferable to obtain the resistance from the semiconductor memory element in which the length of the gate electrode (gate length) is sufficiently larger than the offset region (for example, by 10 μm). By using the semiconductor memory element having a large gate length, the ratio of the channel resistance value to the resistance value between the two diffusion regions increases, and the influence of variations of the offset resistance can be reduced. Thus, problems that a threshold of the semiconductor memory element cannot be determined due to variations of the offset resistance value, and an accurate resistance value between the source and drain cannot be determined due to variations in current flowing between the source and drain are solved.

In the characteristic evaluating method, it is preferable to obtain the resistance value of the channel region just below the gate electrode from an IGFET having a normal structure (a transistor in which an extension or an LDD (Lightly Doped Drain) is added to the source/drain region and the offset region does not exist). By using an IGFET having a normal structure in which no memory function element and no offset region exist, the influence of variations in the offset resistance value is not exerted. The problems of variations in the offset resistance value and obtaining accurate resistance value of the channel just below the gate electrode due to the variations in the offset region widths caused by the variations in the manufacturing process and variations in the amount of charges in the memory function element can be solved. It is also preferable to form the semiconductor memory element and an IGFET having a normal configuration on the same semiconductor substrate since the influence of variations in the manufacturing process can be reduced. Consequently, the precision improves. It is more preferable to set the semiconductor memory element and an IGFET at an adjacent distance as in the same chip on the same semiconductor substrate.

In the characteristic evaluating method, it is preferable to obtain the resistance value of the diffusion region by a device for resistance evaluation constructed by a region for resistance evaluation formed over the semiconductor layer and a plurality of electrodes provided over the diffusion region for resistance evaluation for the reason that it is difficult to obtain an accurate resistance value of the diffusion region since the impurity concentration is not constant with respect to the thickness direction of the diffusion region. An accurate diffusion resistance value is calculated by electric measurement by using the device for resistance evaluation. In a manner similar to the above, it is preferable to form the semiconductor memory element and the device for resistance evaluation on the same semiconductor substrate. Consequently, the precision improves. It is more preferable to set the semiconductor memory element and a device for resistance evaluation at an adjacent distance as in the same chip on the same semiconductor substrate.

Means for obtaining an offset resistance value having a higher degree of physical properties in the characteristic evaluating method will be described below.

In the characteristic evaluating method, it is preferable to calculate the resistance value of the offset region in consideration of the amount of charges or polarization state of charges accumulated in the memory function elements on both sides of the gate electrode, that is, dependency on the storing state. In other words, it is preferable to calculate the resistance value of the offset region as a variable resistance value which changes according to the amount of charges or a polarization state of charges accumulated in the memory function element since the offset resistance value changes according to the amount of charges or a polarization state of charges accumulated in the memory function elements. Consequently, the offset resistance value having a high degree of physical properties is obtained in each of the erase and program states of the memory function element.

In the characteristic evaluating method, it is preferable to calculate the resistance value of the offset region in consideration of dependency on the voltage applied to the gate electrode of the resistance value of the offset region, dependency on the voltage applied to the semiconductor layer, and dependency on the voltage applied to the diffusion region. That is, preferably, the resistance value of the offset region is calculated as a variable resistance value which changes according to the voltages since the offset region has dependency on the voltages of the parts, and the dependency is different from the resistance of the channel region just below the gate electrode. In such a manner, under various voltage conditions of the parts, the offset resistance value as a voltage-dependent variable resistance value having a high degree of physical properties is obtained.

In the characteristic evaluating method, preferably, the resistance value of the offset region on the side of the diffusion region serving as a source at the time of reading operation is set to be constant with respect to the voltage applied to the diffusion region for the following reason. When attention is paid to dependency on the voltage applied to the diffusion region, in a process where the voltage difference between the two diffusion regions gradually increases and the operation region shifts from a linear region to a pinch-off state and, further, to a saturation region, the width of a depletion layer on the side of the diffusion region serving as a drain in the reading operation increases whereas the width of a depletion layer on the side of the diffusion region serving as a source in the reading operation is almost constant. Consequently, the offset resistance value having a high degree of physical properties can be obtained under various voltage conditions of the diffusion regions.

The method of the present invention of modeling the offset resistance value obtained by the characteristic evaluating method and extracting a model parameter will be described below. A case where each of the diffusion regions is of the N type will be described here. Alternately, each of the diffusion regions in the present invention may be of the P type. The diffusion region of a low voltage out of the two diffusion regions will be called a source diffusion region and the diffusion region of a high voltage will be called a drain diffusion region (hereinafter, referred to as "source" and "drain", respectively).

It is preferable to accurately determine the offset resistance value obtained by the characteristic evaluating method in which the dependency on the voltages applied to the gate electrode and the semiconductor layer is considered by using fitting parameters A to D of a model formula shown as Equation (1) having dependency on the voltages applied to the gate electrode and the semiconductor layer because the offset resistance value cannot be obtained at a voltage which does not satisfy the conditions of the voltages applied to the gate electrode and the semiconductor layer in the characteristic evaluating method. Consequently, by using the model formula shown as Equation (1), the offset resistance value can be determined uniquely also under arbitrary conditions of voltages applied to the gate electrode and the semiconductor layer.

$$Rchos = A \times \exp\{B \times (Vgs + C \times Vbs)\} + D \qquad (1)$$

In Equation (1), Rchos denotes the resistance value of one of the offset regions, Vgs denotes the gate voltage when the source potential is used as a reference, and Vbs indicates a substrate voltage (the voltage of the semiconductor layer) when the source potential is used as a reference.

Similarly, it is preferable to accurately determine the offset resistance value obtained by the characteristic evaluating method in which the dependency on the voltages applied to the diffusion region is considered by using fitting parameter E of a model formula shown as Equation (2) having dependency on the voltage applied to the diffusion region because the offset resistance value cannot be obtained at a voltage which does not satisfy the conditions of the voltages applied to the diffusion region in the characteristic evaluating method. Consequently, by using the model formula shown as Equation (2), the offset resistance value can be determined uniquely also under an arbitrary condition of the voltage applied to the diffusion region.

$$Rchos = Rchos0 \times \{1 + E \times (Vds - Vds0)\} \qquad (2)$$

In Equation (2), Rchos denotes the resistance value of one of the offset regions, Vds denotes the drain voltage when the source potential is used as a reference, Vds0 denotes a sufficiently low drain voltage (for example, Vds=0.1V) in a linear region, and Rchos0 indicates an offset resistance value (Rchos) when the drain voltage (Vds) is Vds0.

A method of extracting a model parameter of an IGFET structure part by using the offset resistance value obtained by the above-described characteristic evaluating method or the offset resistance value obtained by the parameter extracting method will now be described.

The present invention provides a model parameter extracting method of extracting a model parameter by using a normal IGFET model by transferring an offset resistance value obtained by the semiconductor memory element characteristic evaluating method in which the voltage dependency of the regions (gate electrode, semiconductor layer, and diffusion region) is considered as parasitic resistance of the diffusion region of an IGFET or as external parasitic resistance connected to the diffusion region of the IGFET. By the method, extraction of a model parameter with respect to the electrostatic characteristic of the semiconductor memory element, which is difficult when only a normal IGFET model is used, can be realized.

In the model parameter extracting method, in a state where the resistance value obtained with high precision with respect to the state (erase, program, or the like) of the memory function element and to the voltage conditions of the parts is given to the resistance value of the offset region playing a very important role in the electrostatic characteristic of the semiconductor memory element, a model parameter is extracted by using a normal IGFET model. Consequently, as compared with the case of using only a normal IGFET model, higher-precision extract of a model parameter can be realized.

Figure 13:
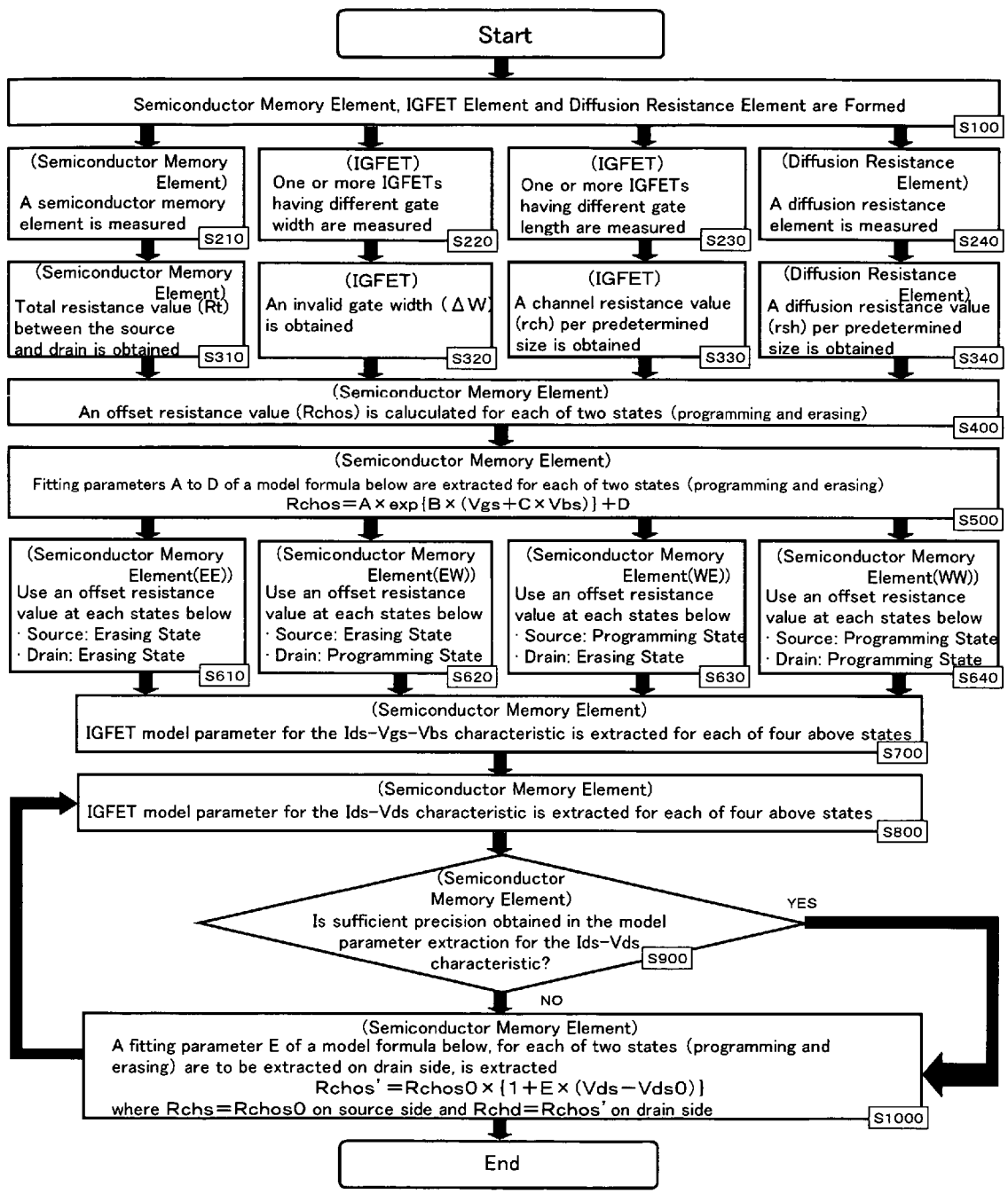
FIG. 13 is a flowchart showing procedure of a method of evaluating characteristics and a model parameter extracting method of the semiconductor memory element according to the present invention.

The procedure of the semiconductor memory element characteristic evaluating method and the model parameter extracting method according to the present invention will be described by using the flowchart of FIG. 13.

As described above, in evaluation of the electrostatic characteristic of the semiconductor memory element, the offset resistance value (Rchos) plays a very important role.

Although the offset resistance value (Rchos) is a part of the channel resistance value, it is necessary to regard the offset resistance value (Rchos) separately from the channel resistance value (Rchg) just below the gate electrode. The point that dependency on the voltages applied to the gate electrode, semiconductor layer, and diffusion layer varies between two regions and the influence of the amount of charges or the polarization state of charges accumulated in the memory function element relates only to the offset region.

Figure 14:
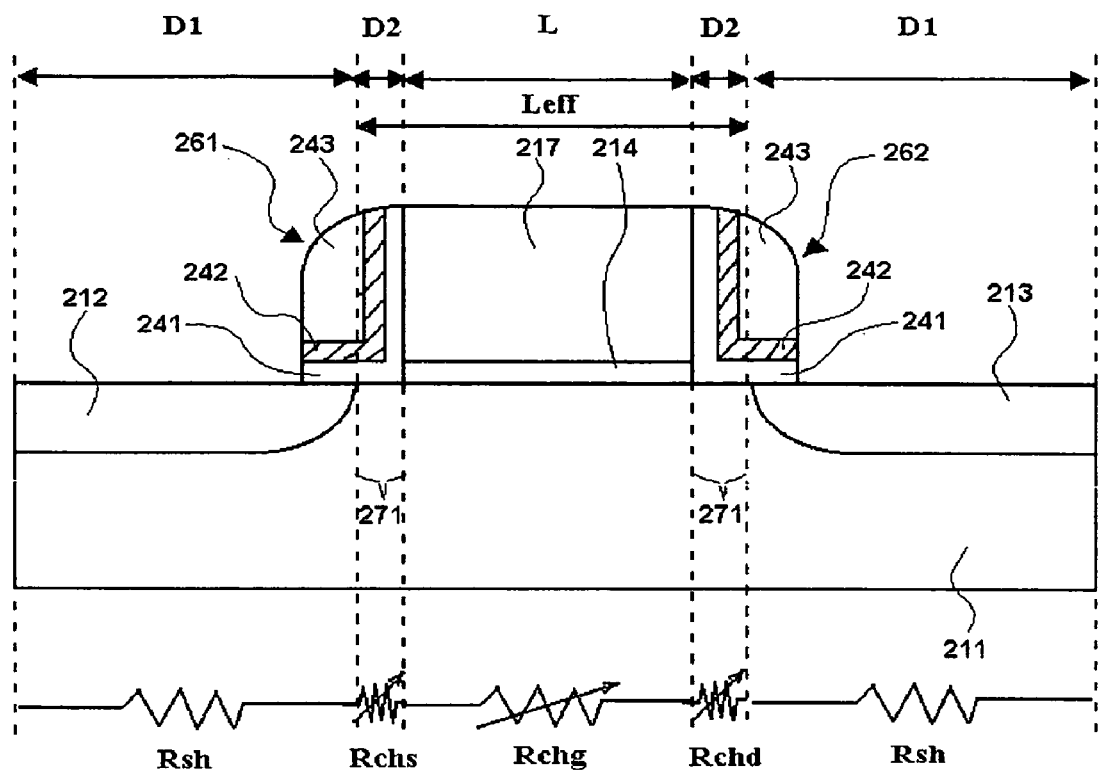
FIG. 14 is a schematic cross section diagram of a main portion of an example of the semiconductor memory element as an object of the present invention.

A total resistance value (Rt) between the source and drain inclusive of the semiconductor memory element can be expressed, as shown in FIG. 14, by Equation (3) using the channel resistance value (Rchg) just below the gate electrode, offset resistance values Rchs and Rchd) on the source and drain sides, and the diffusion resistance values (Rch).

$$Rt = (Rchg + Rchs + Rchd) + 2 \times Rsh \qquad (3)$$

Next, a case where both of the source and drain sides are set to an erase state and a case where both of the sides are set to a program state in order to set the two memory function elements on both sides of the gate electrode into the same storage state will be considered. Under a sufficiently low drain voltage condition (for example, Vds=0.1V) in the linear region, the width of a depletion layer is constant along the channel. Therefore, it is considered that when the erase/program states of the memory function elements on the source and drain sides are almost equal to each other, the offset resistance values (Rchs and Rchd) on the source and drain sides are almost equal to each other. When the offset resistance value at that time is set as Rchos (=Rchs=Rchd), Equation (3) is modified to Equation (4).

$$Rt = (Rchg + 2 \times Rsh) + 2 \times Rchos \qquad (4)$$

Therefore, to accurately obtain the offset resistance value (Rchos), it is necessary to accurately obtain the total resistance value (Rt) between the source and drain inclusive, the channel resistance value (Rchg) just below the gate electrode, and the diffusion resistance value (Rsh).

Further, when Equation (4) is expressed by using gate length (L), gate width (W), invalid gate width (ΔW), diffusion region length (D1), channel resistance value (rch) per predetermined size, and diffusion resistance value (rsh) per predetermined size, Equation (5) is resulted.

$$Rt = \{rch \times L/(W - \Delta W) + 2 \times rsh \times D1/(W - \Delta W)\} + 2 \times Rchos \qquad (5)$$

Figure 15:
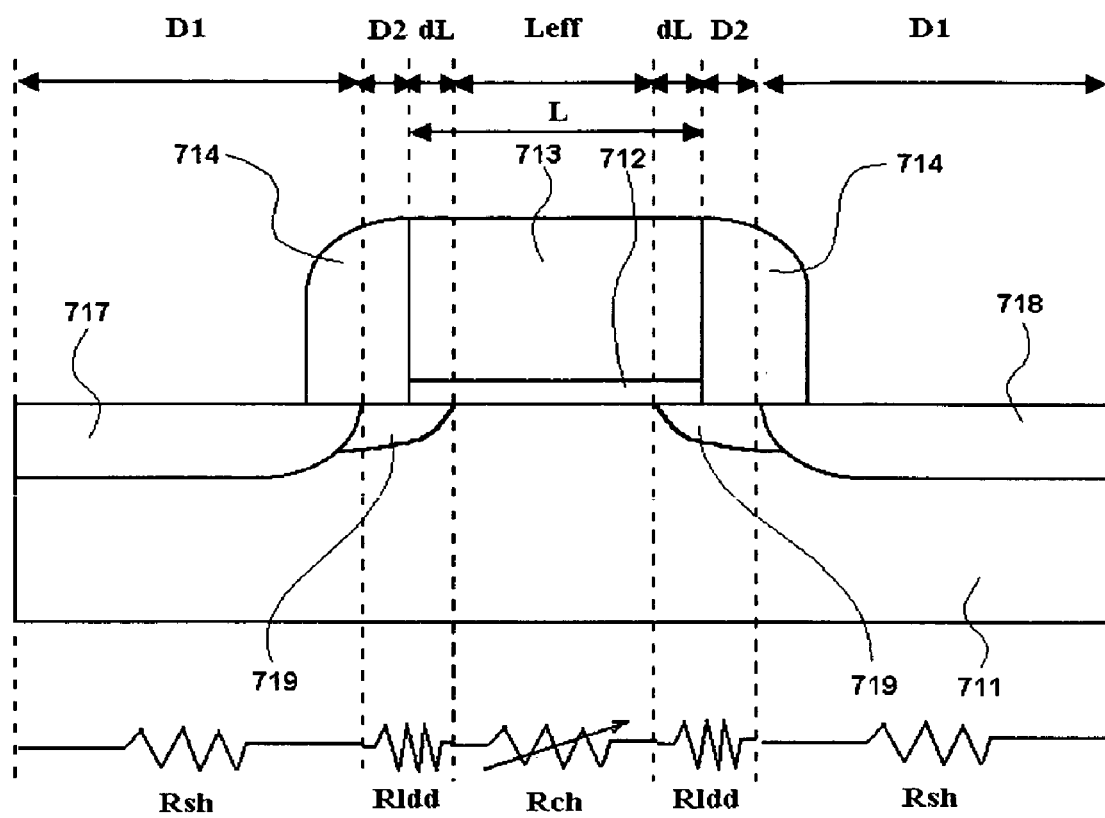
FIG. 15 is a schematic cross section diagram of a main portion of a normal LDD-structured transistor.

The characteristic evaluating method in the embodiment is characterized in that the offset resistance value (Rchos) is calculated with precision by deriving the invalid gate width (ΔW) and the channel resistance value (rch) per predetermined size from an IGFET having an LDD (Lightly Doped Drain) region having little variation factors and a low degree of influence of variations (hereinafter, referred to as "LDD-structured transistor") (see FIG. 15).

First, by using the same process, LDD-structured transistors having the same size as that of the semiconductor memory element are produced in various sizes at intervals so as to adjacent to each other on the same semiconductor substrate. A device for evaluating high-density diffusion resistance is also formed on the same semiconductor substrate (step S100). The LDD-structured transistors are formed at intervals so as to adjacent to each other on the same semiconductor substrate in order to reduce the influence of variations in manufacturing process.

Measurement of the devices will now be described. With respect to the semiconductor memory elements of various sizes, an Ids-Vgs-Vbs characteristic and an Ids-Vds characteristic are measured in four kinds of storing states in the two memory function elements (erase state in both sides (EE state); erase state on the source side and program state on the drain side (EW state); program state on the source side and erase state on the drain side (WE state); and program state on both sides (WW state) (step S210).

With respect to the LDD-structured transistors, the Ids-Vgs-Vbs characteristic is measured of a plurality of transistors including transistors (1) having a constant gate length (L) and a plurality of kinds of gate widths (W) and transistors (2) having a constant gate width (W) and a plurality of kinds of gate lengths (L) (steps S220 and S230).

With respect to the diffusion resistance device, the resistance value is measured (step S240).

Characteristic evaluation using measurement results will now be described. For a semiconductor memory element in which the gate width (W) is a constant value in the LDD-structured transistor in step S230 and a gate length (L) is sufficiently large (for example, 10 μm), the total resistance value (Rt) between the source and drain inclusive is obtained under every condition of the gate voltage (Vgs) and the substrate voltage (Vbs) in each of the two kinds of storing states (EE and WW) (step S310). The reason for using the gate length (L) of a sufficiently large size in step S310 will be described. By setting the gate length (L) to be larger than that of in Equation (5), the ratio of the channel resistance value (Rchg) just below the gate electrode to the total resistance value (Rt) between the source and drain inclusive increases. Consequently, variations in the threshold (Vth) caused by variations in the offset resistance value (Rchos) due to variations in the manufacturing process, a charge amount after erase/program of the memory function, and the like can be reduced, so that the total resistance value (Rt) between the source and drain inclusive can be obtained more accurately.

Figure 16:
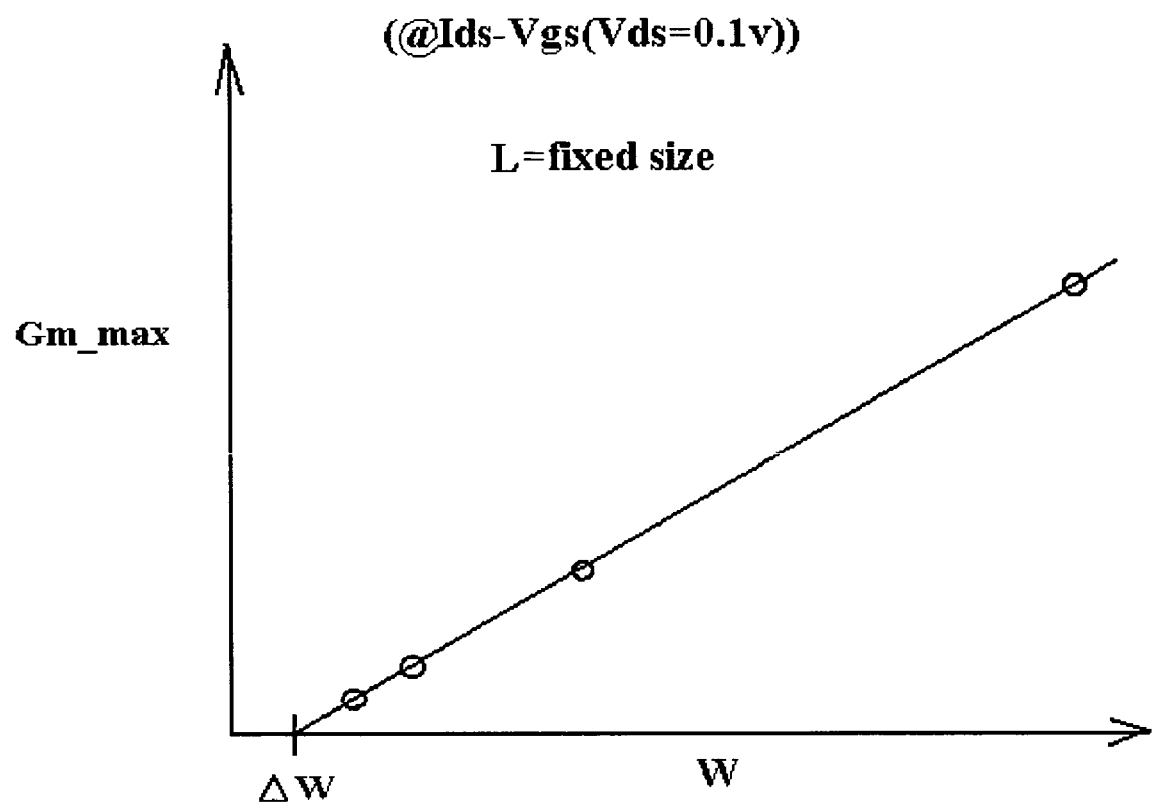
FIG. 16 is a graph illustrating a method of evaluating electric characteristics of the normal LDD-structured transistor.
Figure 17:
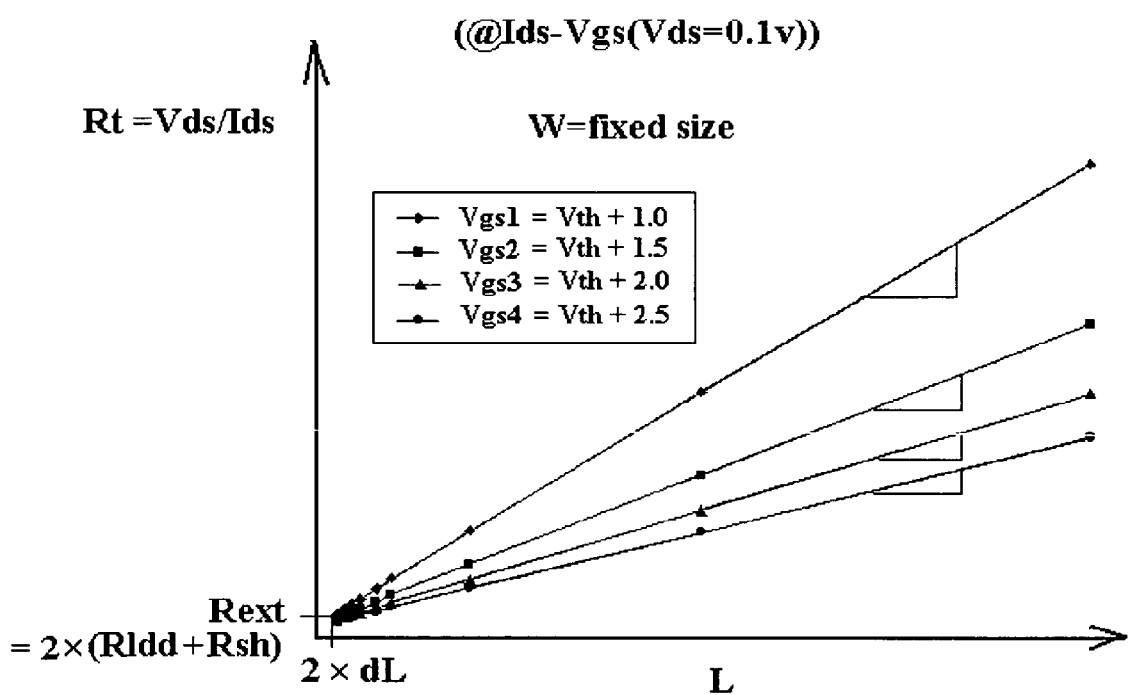
FIG. 17 is a graph illustrating a method of evaluating electric characteristics of the normal LDD-structured transistor.

With respect to the LDD-structured transistor, (1) the maximum value (gm_max) of conductance is obtained for each gate width (W) condition from the Ids-Vgs-Vbs characteristic measurement result of step S220, and the invalid gate width (ΔW) is obtained from an intersecting point between the graph straight line and the X axis as shown in FIG. 16 (step S320). (2) The total resistance value (Rt) between the source and drain inclusive is obtained for each gate length (L) condition from the Ids-Vgs-Vbs characteristic measurement result in step S230, and the channel resistance (rch) per predetermined size is obtained from inclination of the graph straight line of each gate voltage condition as shown in FIG. 17 and the invalid gate width (ΔW) obtained in step S320. To be concrete, the inclination of each graph straight line indicates the channel resistance value (Rch) per gate length (L) and is derived as a value obtained by dividing the channel resistance (rch) per predetermined size by an effective gate width (Weff) (step S330). As a result, by Equation (7), the channel resistance (rch) per predetermined size is calculated as a value obtained by multiplying the inclination of the graph shown in FIG. 17 by the effective gate width (Weff).

$$(\text{Inclination}) = \delta Rt/\delta L = \delta Rch/\delta Leff = rch/Weff = rch/(W-\Delta W) \quad (6)$$

$$rch(\Omega/\square) = (\text{Inclination}) \times (W-\Delta W) \quad (7)$$

With respect to a diffusion resistive element, the diffusion resistance value (rsh) per predetermined size is obtained from the resistance value measured in step S240 and the size of the diffusion resistance pattern (step S340).

By using the total resistance value (Rt) between the source and drain inclusive in each of the two kinds of storing states (EE and WW) obtained from the semiconductor memory element, the invalid gate width (ΔW) obtained from the LDD-structured transistor, the channel resistance (rch) per predetermined size, and the diffusion resistance value (rsh) per predetermined size obtained from the diffusion resistive element in the characteristic evaluation, the offset resistance value (Rchos) in each of the storing states (erase state and program state) for each of the memory function elements is obtained.

Figure 18:
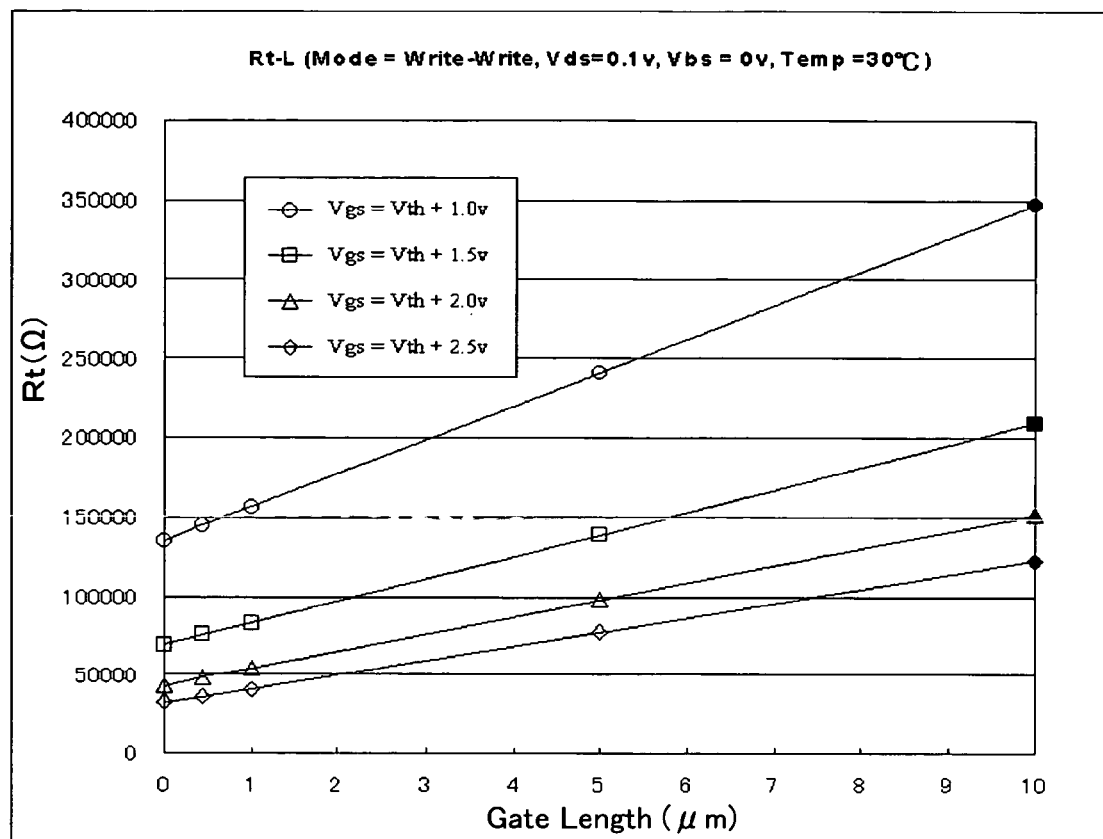
FIG. 18 is a graph illustrating a method of evaluating electric characteristics of a semiconductor memory element as an object of the present invention.

A concrete evaluating method will be described with reference to FIG. 18. First, in step S310, the total resistance value (Rt) between the source and drain inclusive obtained from the semiconductor memory element is plotted (the plot is indicated by solid marks in the graph). In step S330, each of graph straight lines is plotted at an inclination value of the graph straight line obtained from the LDD-structured transistor (the plot is indicated by hollow marks in the graph). A Y-axis section when the gate length (L) becomes "0" is expressed by Equation (8) from Equation (5).

$$Rt = 2 \times rsh \times D1/(W-\Delta W) + 2 \times Rchos \quad (8)$$

Finally, by using the invalid gate width (ΔW) obtained from the LDD-structured transistor in step S320 and the diffusion resistance value (rsh) per predetermined size obtained from the diffusion resistive element in step S340, the offset resistance value (Rchos) of each gate voltage and substrate voltage condition is calculated in each of the storing states (erase state and program state) on the memory function element unit basis by the equation (8) (step S400).

In the characteristic evaluating method, the fitting parameters A to D in the following model formula (Equation (11)) are determined in each of the two kinds of storing states (erase state and program state) so as to be accurately fit to the offset resistance value (Rchos) extracted with high precision from actually measured data (step S500). The model formula shown as Equation (11) is obtained by substituting the parameter A' in the model formula of Equation (9) with the parameter A in the Equation (10) and simplifying the resultant equation, and is the same as the model formula expressed as Equation (1).

$$Rchos = A' \times \exp[B \times \{(Vgs-Vth)+C \times Vbs\}]+D = A' \times \exp\{B \times (Vgs+C \times Vbs)-B \times Vth\}+D = \{A'/\exp(B \times Vth)\} \times \exp\{B \times (Vgs+C \times Vbs)\}+D \quad (9)$$

$$A = A'/\exp(B \times Vth) \quad (10)$$

$$Rchos = A \times \exp\{B \times (Vgs+C \times Vbs)\}+D \quad (11)$$

The gate voltage (Vgs) in the model formula (Equation (11)) is (Vgs−Vth) as an effective voltage. Vth is set as a threshold voltage value of the offset region. However, it is very difficult to obtain the accurate threshold voltage value (Vth) in the offset region. In a condition that the drain voltage (Vds) is constant, when the threshold voltage value (Vth) in the offset region is a fixed value, the effect can be included in the fitting parameter A. Therefore, in the embodiment, fitting using the model formula (Equation (11)) is carried out.

Figure 19:
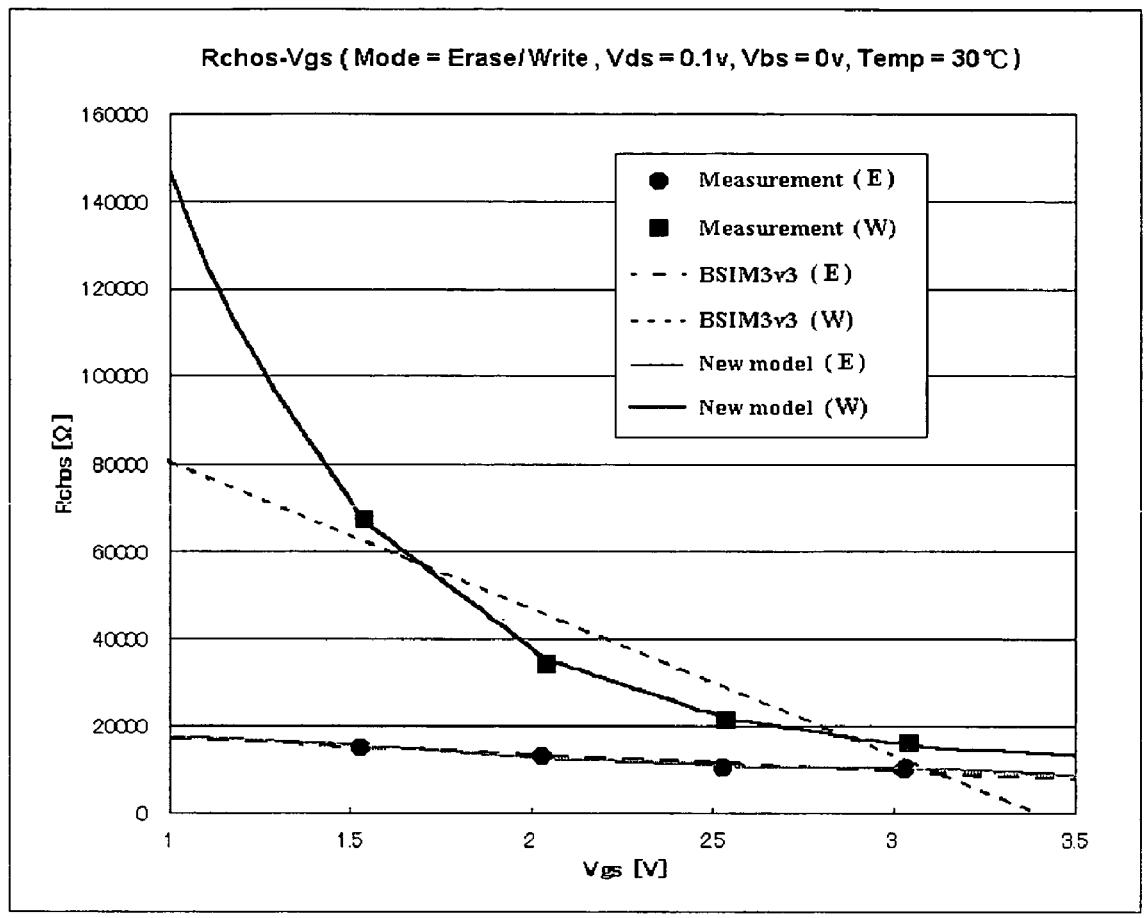
FIG. 19 is a graph illustrating a result of modeling electric characteristics of a semiconductor memory element as an object of the present invention.

FIG. 19 shows a result of fitting using the model formula (Equation (11)). When the memory function element is in the erase state (E), the precision difference between a general IGFET model (BSIM3v3) (broken line) and the model formula (Equation (11)) (solid line) with respect to the offset resistance values (solid circle marks) obtained from actual measurement data is small. However, when the memory function element is in the program state (W), as compared with the general IGFET model (BSIM3v3) (broken line), in the case of fitting to offset resistance values (solid square marks) obtained from actual measurement data by using the model formula (Equation (11)) (solid line), fitting of much higher precision can be realized.

In step S500, offset resistance values (Rchos(E) and Rchos(W)) in the two kinds of storing states (erase state and program state), respectively, obtained by the model formula (Equation (11)) are assigned to the four storing states (EE, EW, WE, and WW) of two memory functions as follows (steps S610 to S640).

Step S610: Storing State (EE)
    Source side: Rchs=Rchos (E)
    Drain side: Rchd=Rchos (E)

Step S620: Storing State (EW)
    Source side: Rchs=Rchos (E)
    Drain side: Rchd=Rchos (W)

Step S630: Storing State (WE)
    Source side: Rchs=Rchos (W)
    Drain side: Rchd=Rchos (E)

Step S640: Storing State (WW)
    Source side: Rchs=Rchos (W)
    Drain side: Rchd=Rchos (W)

The offset resistance value of each of the source and drain sides determined above is given to (a) each of model parameters regarding source-drain parasitic resistance in the IGFET model or (b) each of resistive elements on the source and drain sides when a voltage variable resistive element is regarded as an external resistor and circuits disposed on both sides of the source and drain of the IGFET are regarded as equivalent circuits of the semiconductor memory element. The value of each of the model parameters regarding the source-drain parasitic resistance in the IGFET model at that time is set to "0".

As described above, the offset resistance values on the source and drain sides are given to the inside or outside of the IGFET model, and SPICE parameter extraction in the IGFET model is performed in each of the four kinds of storing states (EE, EW, WE, and WW).

First, fitting is performed to the Ids-Vgs-Vbs characteristic under a sufficiently low drain voltage condition (for example, Vds=0.1 V, which is expressed as "Vds0" below) in the linear region by using SPICE parameters in the IGFET model (for example, BSIM3v3) (step S700).

Figure 20:
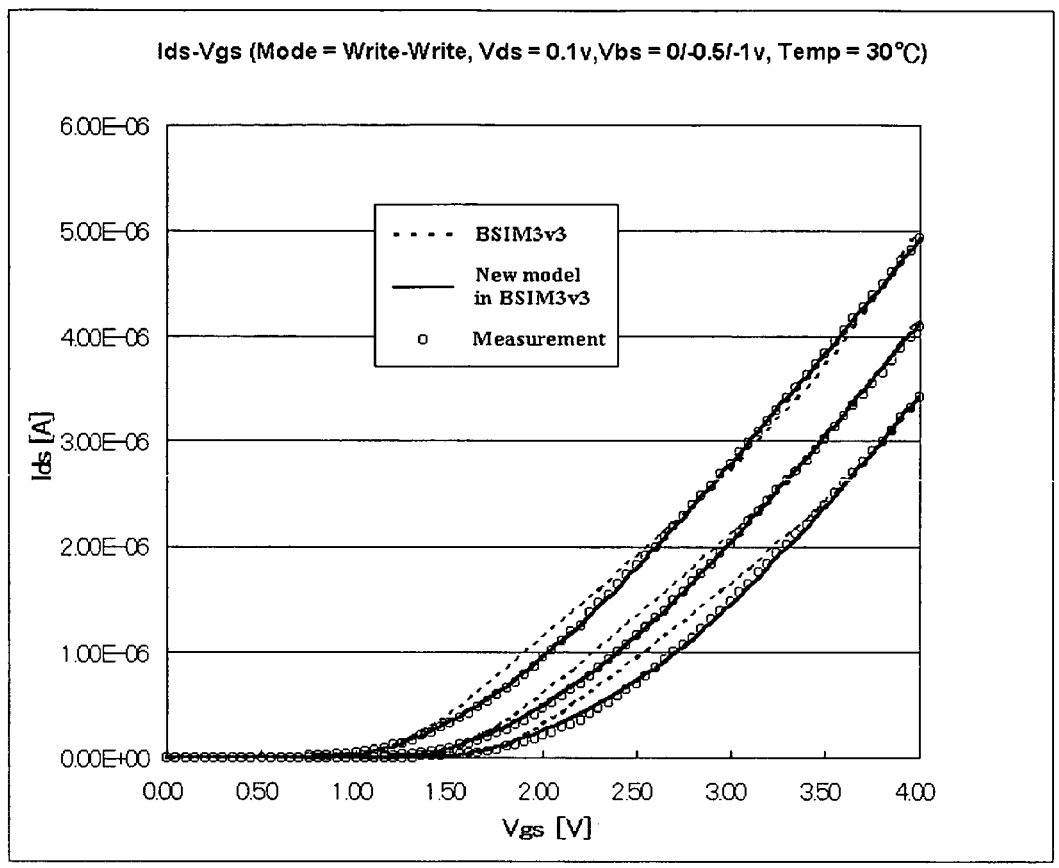
FIG. 20 is a graph showing a result of fitting to the electric characteristics of a semiconductor memory element as an object of the present invention.

As described above, particularly, when the memory function element is in the program state, the offset resistance value (Rchos) is largely influenced by the voltage conditions, so that it is very difficult to perform fitting only by the normal IGFET model. FIG. 20 shows a result of the SPICE parameter extraction in the WW storing state. It is understood from FIG. 20 that the model parameter extracting method (solid line) in the embodiment can perform higher-precision extraction of actual measurement data (hollowed circle marks) as compared with the case of performing extraction only by the normal IGFET model (BSIM3v3) (broken line).

Figure 21:
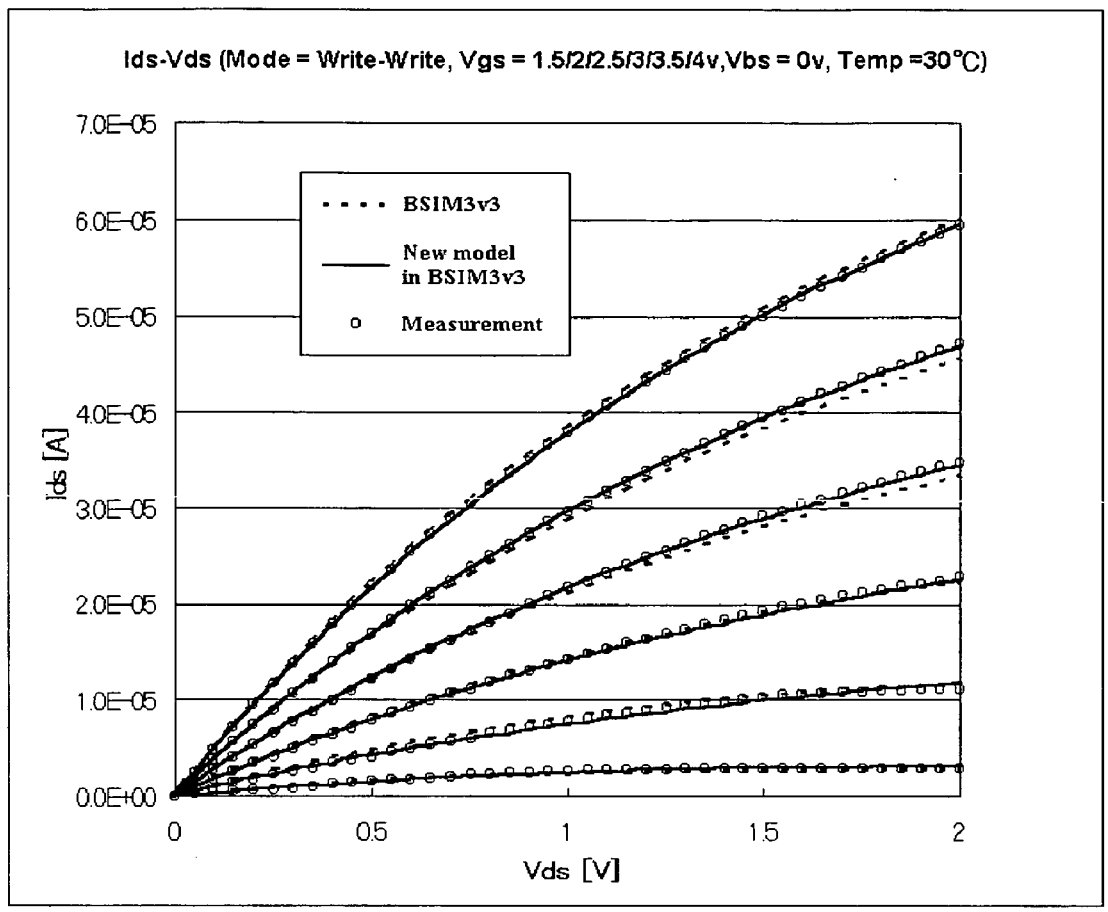
FIG. 21 is a graph showing a result of fitting to the electric characteristics of the semiconductor memory element as an object of the present invention.

Subsequent to step S700, fitting to the Ids-Vds characteristic is performed (step S800). FIG. 21 shows a result of SPICE parameter extraction in the WW storing state in which fitting is particularly difficult for a reason similar to the above. It is understood from FIG. 21 that, also in the result of model parameter extraction of the Ids-Vds characteristic in a manner similar to the result of model parameter extraction of the Ids-Vgs-Vbs characteristic, the model parameter extracting method (solid line) in the embodiment can perform higher-precision extraction of actual measurement data (hollowed circle marks) as compared with the case of performing extraction only by the normal IGFET model (BSIM3v3) (broken line).

After that, whether sufficient precision (for example, error of 3% or less) is obtained in the model parameter extraction of the Ids-Vds characteristic or not is determined (step S900). If sufficiently high precision is obtained, the model parameter extracting method which is characteristic in the present invention is completed. On the other hand, if sufficiently high precision is not obtained, it is necessary to consider decrease in the offset resistance value (Rchd) due to increase in the width of a depletion layer on the drain side accompanying increase in the drain voltage (Vds). It is assumed here that since the width of the depletion layer on the source side is almost constant, the offset resistance value (Rchs) does not depend on the drain voltage (Vds). Since the influence of the drain voltage (Vds) depends on the size of the semiconductor memory element, manufacturing process conditions, and the like, the degree of influence varies. Consideration of the drain voltage (Vds) will be concretely described below.

The offset resistance values are set as Rchs=Rchos0 on the source side and as Rchd=Rchos' on the drain side, and an effect that the resistance value on the drain side depends on the drain voltage (Vds) and decreases is expressed by the following model formula (Equation (12)). It is assumed that Rchos0 is the offset resistance value (Rchos) when the drain voltage (Vds) is Vds0. The model formula of Equation (12) is the same as the model formula of Equation (2).

$$Rchos'=Rchos0\times\{1+E\times(Vds-Vds0)\} \qquad (12)$$

The fitting parameter E in the model formula (Equation (12)) is determined in each of the two kinds of storing states (erase state and program state) so as to be fit with high precision to the offset resistance value (Rchd) on the drain side obtained for each of a plurality of Vds conditions under the predetermined conditions of the gate voltage (Vgs) and the substrate voltage (Vbs) (for example, Vgs=Vth+1V, Vbs=0V) (step S1000).

After that, the program returns to step S800 where the model parameter extraction for the Ids-Vds characteristic is performed again and is completed when target precision is achieved.

By the characteristic evaluating method and the model parameter extracting method of the embodiment, the offset resistance whose resistance value changes according to the voltage conditions or the erase/program storing state of the memory function element can be accurately evaluated. By modeling the offset resistance by using a model formula with high precision, high-precision model parameter extraction having a high degree of physical properties can be realized.

Second Embodiment

An embodiment of a model parameter extracting apparatus for a semiconductor memory element according to the present invention (hereinafter, appropriately referred to as "inventive apparatus") will be described with reference to the drawings.

The inventive apparatus of the second embodiment has the function of executing the semiconductor memory element characteristic evaluating method and the model parameter extracting method according to the first embodiment.

Figure 22:
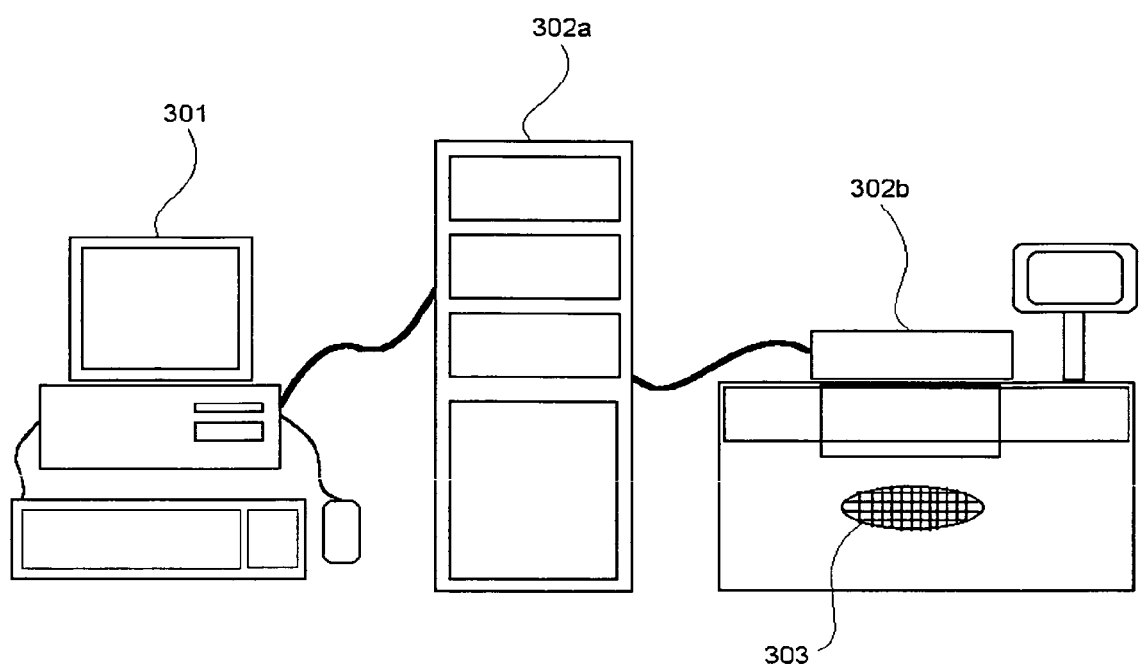
FIG. 22 is a configuration diagram showing an embodiment of a model parameter extracting apparatus according to the present invention.

As an example of the configuration of the inventive apparatus, an apparatus for evaluating characteristics of the semiconductor memory element and a model parameter extracting apparatus as shown in FIG. 22 can be mentioned. The configuration example is constructed by a PC or workstation 301 as a measurement controlling apparatus, a DC source/monitor 302a and an auto-prober 302b as a measuring apparatus, and a wafer 303 as an object to be measured.

Figure 23:
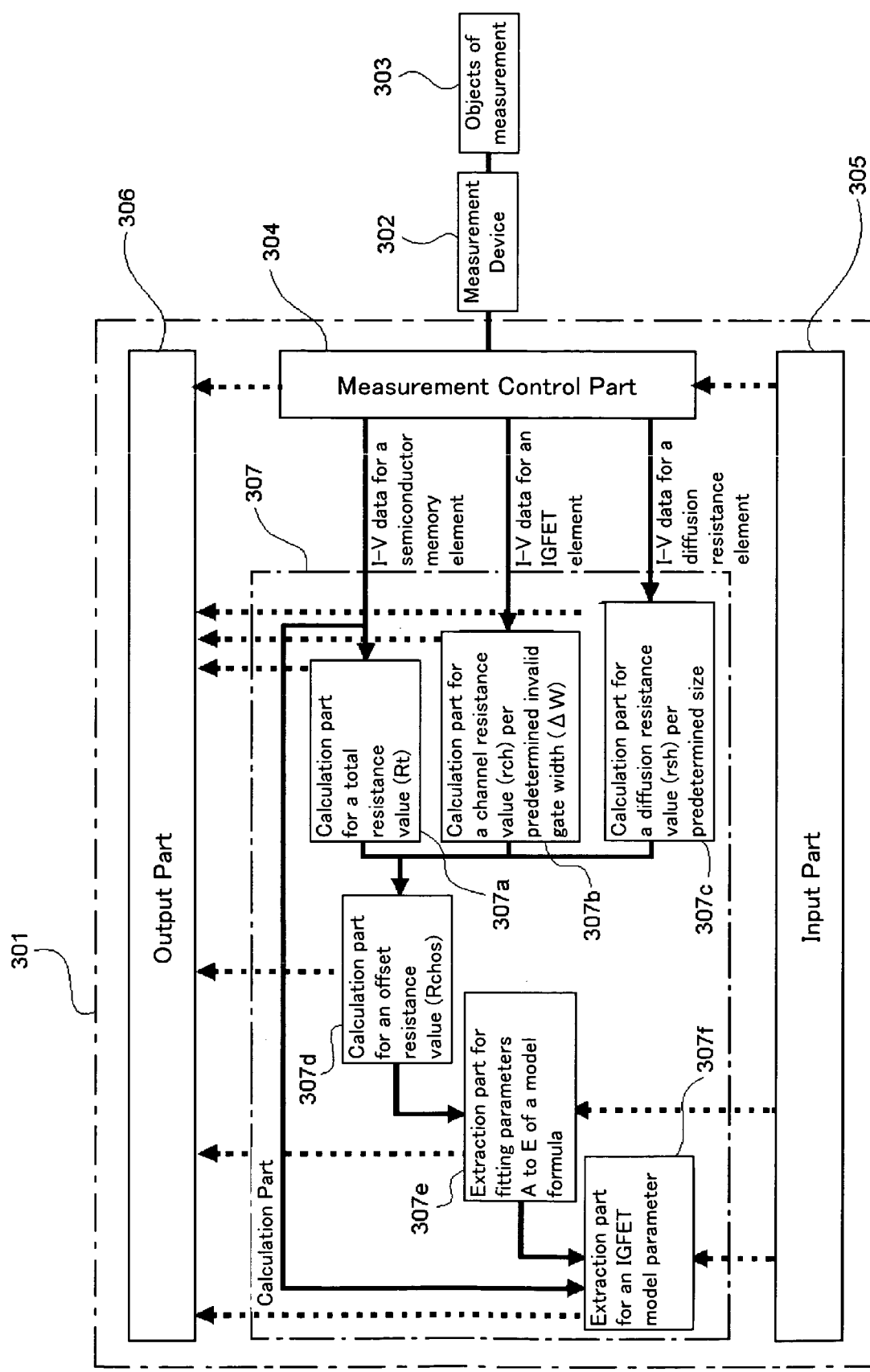
FIG. 23 is a block configuration diagram showing the model parameter extracting apparatus according to the present invention.

The more-concrete configuration will be described with reference to the block diagram of FIG. 23. The apparatus is roughly constructed by a measurement controlling apparatus 301, a measuring apparatus 302, and an object 303 to be measured. The measurement controlling apparatus 301 is constructed by a measurement control part 304 such as a measurement program, an input part 305 such as a keyboard and a mouse, an output part 306 for performing display such as a CRT or liquid crystal display, and a calculation part 307 such as a CPU for performing a computing process. The calculation part 307 is constructed by a part 307a for calculating total resistance value (Rt) between the source and drain inclusive of the semiconductor memory element, a part 307b for calculating invalid gate width ($\Delta W$) and a channel resistance value (rch) per predetermined size of an IGFET having a normal structure (for example, the LDD-structured transistor), a part, 307c for calculating a diffusion resistance value (rsh) per predetermined size of the diffusion resistive element, a part 307d for calculating the offset resistance value (Rchso) of the semiconductor memory element, a part 307e for extracting the fitting parameters (A to E) of the model formula in the first embodiment, and a normal IGFET model parameter extracting part 307f.

The operations of the apparatus for evaluating the characteristics of the semiconductor memory element and the model parameter extracting apparatus in the inventive apparatus will be described.

First, the operation of the apparatus for evaluating characteristics of the semiconductor memory element of the inventive apparatus will be descried. A measurement command is sent to the measurement control part 304 in the measurement controlling apparatus 301 by using the input part 305 in the measurement controlling apparatus 301 and the measuring apparatus 302 is controlled, thereby measuring the semiconductor memory element, an IGFET having a normal structure, and the diffusion resistive element formed on the object 303 to be measured. Information of the measurement results is obtained from the output part 306 in the measurement controlling apparatus 301 and recognized.

Next, the measurement result information is transferred to the calculation part 307 in the measurement controlling apparatus 301. Concretely, I-V characteristic measurement result information of the semiconductor memory element and measurement condition information such as the size of the semiconductor memory element, the storing state (erase or program) of the memory function element, and voltages of the parts (gate electrode, semiconductor layer, and diffusion region) is transferred to the part 307a for calculating the total resistance value (Rt) between the source and drain inclusive, where the total resistance value (Rt) between the source and drain is calculated. The calculation result information is obtained from the output part 306 and recognized. The I-V characteristic measurement result information of the IGFET having a normal structure and the measurement condition information such as the size of the IGFET having a normal structure and voltages of the parts (gate electrode, semiconductor layer, and diffusion region) is transferred to the part 307b for calculating the invalid gate width ($\Delta W$) and the channel resistance value (rch) per predetermined size, where the invalid gate width ($\Delta W$) and the channel resistance value (rch) per predetermined size are calculated. The calculation result information is obtained from the output part 306 and recognized. Further, information of a result of measurement of the resistance value of the diffusion resistive element and the measurement condition information such as the size of the diffusion resistive element is transferred to the part 307c for calculating the diffusion resistance value (rsh) per predetermined size, where the diffusion resistance value (rsh) per predetermined size is calculated, and the calculation result information is obtained from the output part 306 and recognized.

Next, the calculation result information of the calculating parts is transferred to the offset resistance value (Rchos) calculating part 307d where the offset resistance value (Rchos) is calculated, and the calculation result information is obtained from the output part 306 and recognized.

The operation of the apparatus for extracting a model parameter of the semiconductor memory element of the inventive apparatus will be described below. The offset resistance value calculation result information is transferred from the offset resistance value (Rchos) calculating part 307d in the characteristic evaluating apparatus to the part 307e for extracting the fitting parameters (A to E) of the model formula. The range of the values of the fitting parameters (A to E) in the model formula (Equations (11) and (12)) in the first embodiment is input from the input part 305, an optimum value of each fitting parameter in the range is extracted, the extraction result information is obtained from the output part 306, and precision is checked.

When an error from an actual measurement value of the offset resistance value becomes sufficiently small (for example, 3% or less), the values of the fitting parameters (A to E) in the model formula are transferred to the normal IGFET model parameter extracting part 307f. Simultaneously, the I-V characteristic measurement result information of the semiconductor memory element and measurement condition information such as the size of the semiconductor memory element, the storing state (erase/program) of the memory function element, and voltages of the parts (gate electrode, semiconductor layer, and diffusion region) is transferred to the normal IGFET model parameter extracting part 307f. In the part 307f, the range of values of the normal IGFET model parameters (such as BSIM3v3) is input from the input part 305, the optimum value of the normal IGFET model parameter in the range is extracted, the extraction result information is obtained from the output part 306, and precision is checked. When an error from the actual measurement of the I-v characteristic of the semiconductor memory element becomes sufficiently small (for example, 3% or less), the operation of the apparatus for evaluating the characteristics of the semiconductor memory element and the model parameter extracting apparatus is completed.

As described above, the present invention provides a characteristic evaluating method of accurately obtaining a resistance value of the offset region which is very important to grasp electric characteristics of the semiconductor memory element, a model formula capable of precisely expressing a resistance value obtained by the method, and a model parameter extracting method using the resistance value obtained from the model formula. The semiconductor memory element includes: a gate electrode formed over a semiconductor layer via a gate insulating film; a channel region disposed just below the gate electrode via the gate insulating film; two diffusion regions formed on both sides of the channel region; a memory function element having a charge retaining function, formed on one side or both sides of the gate electrode; and an offset region positioned below the memory function element and isolating the channel region and the diffusion region from each other. The diffusion region formed on the side where the memory function element exists and the channel region are isolated from each other by the offset region, and a resistance value of the offset region changes according to an amount of charges or a polarization state of charges accumulated in the memory function element. With the configuration, as compared with the case of using only the normal IGFET model, model parameter extraction of a high degree of physical properties can be realized with higher precision. It realizes a high-precision circuit simulation.

The present invention has been described above on assumption that the storing state of the memory function element in the semiconductor memory element is binary. The storing state of the memory function element of the semiconductor memory element as an object is not limited to binary but may be three or more values.

Modifications (second to eighth modifications) of the semiconductor memory elements, as objects of the present invention, of the first configuration example and the first modification described before the first embodiment will be described below with reference to the drawings. All of the semiconductor memory elements described below are semiconductor memory elements as objects of the present invention.

(Second Modification)

Figure 24:
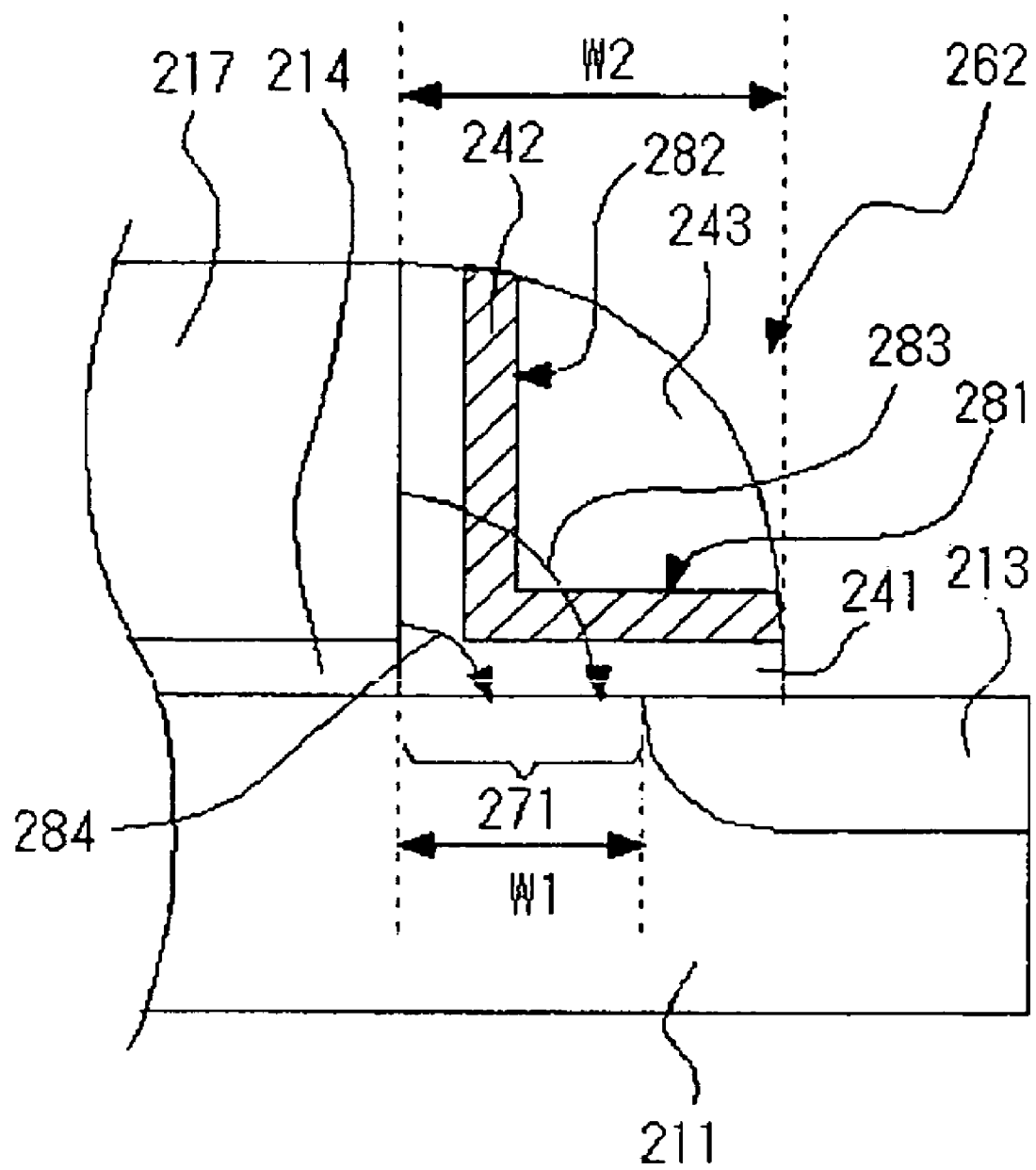
FIG. 24 is a schematic cross section diagram of a main portion of a semiconductor memory element (second modification) as an object of the present invention.

The memory functional element 262 in a semiconductor memory element of a second modification has a shape in which, as shown in FIG. 24, the silicon nitride film 242 as the charge retaining film has an almost constant thickness and is disposed almost parallel with the surface of the gate insulating film 214 (region 281) and, further, disposed almost parallel with a side surface of the gate electrode 217 (region 282).

In the case where a positive voltage is applied to the gate electrode 217, an electric line 283 of force in the memory functional element 262 passes through the silicon nitride film 242 twice (portions corresponding to the regions 282 and 281) as shown by the arrows. When a negative voltage is applied to the gate electrode 217, the direction of the electric line of force is reversed. The dielectric constant of the silicon nitride film 242 is about 6 and the dielectric constant of the silicon oxide films 241 and 243 is about 4. Therefore, as compared with the case where only the region 281 of the charge regaining film exists, the effective dielectric constant of the memory functional element 262 in the direction of the electric line 283 of force becomes high and the potential difference at both ends of the electric line of force can be reduced. That is, the most of the voltage applied to the gate electrode 217 is used to increase the electric field in the offset region 271.

The reason why charges are injected into the silicon nitride film 242 at the time of the rewriting operation is because generated charges are attracted by the electric field in the offset region 271. Therefore, by including the charge retaining film indicated by the arrow 282, charges injected into the memory functional element 262 increases in the rewriting operation, and the rewrite speed increases.

In the case where the portion of the silicon oxide film 243 is also a silicon nitride film, specifically, when the charge retaining film is not constant with respect to the level of the surface of the gate insulating film 214, movement of charges to the upper portion of the silicon nitride film becomes conspicuous and the retaining characteristic deteriorates.

More preferably, in place of the silicon nitride film, the charge retaining film is made of a high dielectric such as hafnium oxide having a very high dielectric constant.

Preferably, the memory functional element further includes an insulating film (portion over the offset region 271 in the silicon oxide film 241) for separating the charge retaining film which is almost parallel with the surface of the gate insulating film from the channel region (or well region). By the insulating film, dissipation of charges accumulated in the charge retaining film is suppressed and the retaining characteristic can be further improved.

Preferably, the memory functional element further includes an insulating film (a portion in contact with the gate electrode 217 in the silicon oxide film 241) for separating the gate electrode from the charge retaining film extended almost parallel with the side face of the gate electrode. The insulating film prevents injection of charges from the gate electrode into the charge retaining film and, accordingly, prevents a change in the electric characteristics. Thus, the reliability of the semiconductor memory element can be improved.

Further, in a manner similar to the first modification, it is preferable to control the thickness of the insulating film under the silicon nitride film 242 (the portion over the offset region 271 of the silicon oxide film 241) to be constant and to control the thickness of the insulating film disposed on the side surface of the gate electrode (the portion in contact with the gate electrode 217 in the silicon oxide film 241) to be constant. By the operation, the density of electric lines of force generated by the charges accumulated in the silicon nitride film 242 can be controlled more or less and leakage of charges can be prevented.

(Third Modification)

In a third modification, optimization of distances among the gate electrode, the memory functional element, and the source and drain regions of in a semiconductor memory element will be described.

Figure 25:
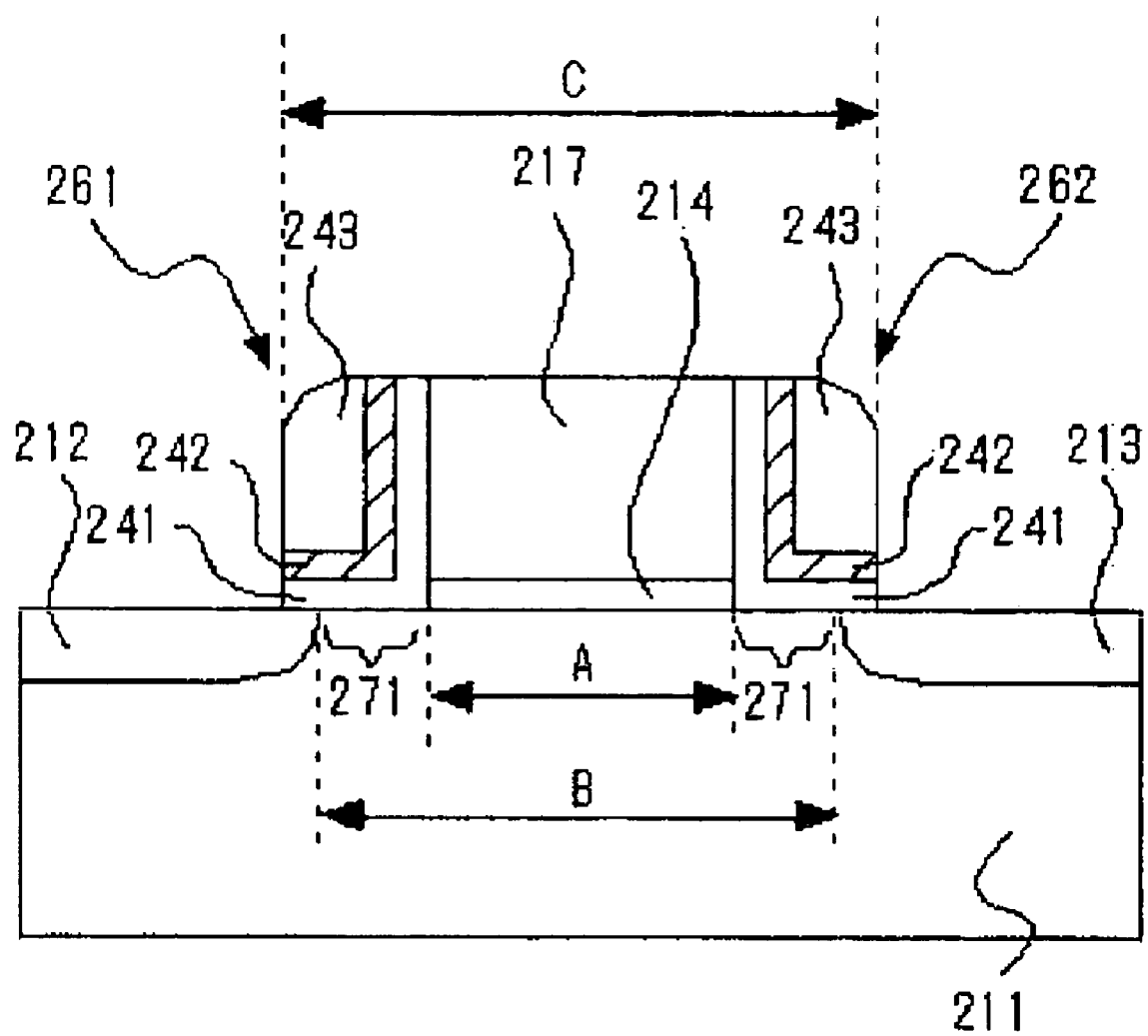
FIG. 25 is a schematic cross section diagram of a main portion of a semiconductor memory element (third modification) as an object of the present invention.

As shown in FIG. 25, A indicates the length of the gate electrode in a cutting plane in the channel length direction, B indicates the distance from the source and drain regions (channel length), and C indicates the distance between an end of one of memory functional elements to an end of the other memory functional element, that is, the distance from an end (on the side apart from the gate electrode) of the film having the function of retaining charges in one of the memory functional elements in a cutting plane in the channel length direction to an end (on the side apart from the gate electrode) of the film having the function of retaining charges in the other memory functional element.

In such a semiconductor memory element, B<C is preferable. By satisfying such a relation, the offset regions 271 exist between the portion under the gate electrode 217 in the channel region and each of the diffusion regions 212 and 213. Consequently, easiness of inversion effectively fluctuates in the whole offset regions 271 by charges accumulated in the memory functional elements 261 and 262 (silicon nitride films 242). Therefore, the memory effect increases and, particularly, higher-speed reading operation is realized.

In the case where there is an offset between the gate electrode 217 and each of the diffusion regions 212 and 213, that is, in the case where the relation of A<B is satisfied, easiness of inversion of the offset region when a voltage is applied to the gate electrode largely changes according to an amount of charges accumulated in the memory functional element, the memory effect increases, and a short channel effect can be reduced.

As long as the memory effect is produced, the offset region 271 does not always have to exist. Even in the case where the offset region 271 does not exist, if the impurity concentration in the diffusion regions 212 and 213 is sufficiently low, the memory effect can be produced in the memory functional elements 261 and 262 (silicon nitride film 242).

Thus, A<B<C is the most preferred.

(Fourth Modification)

Figure 26:
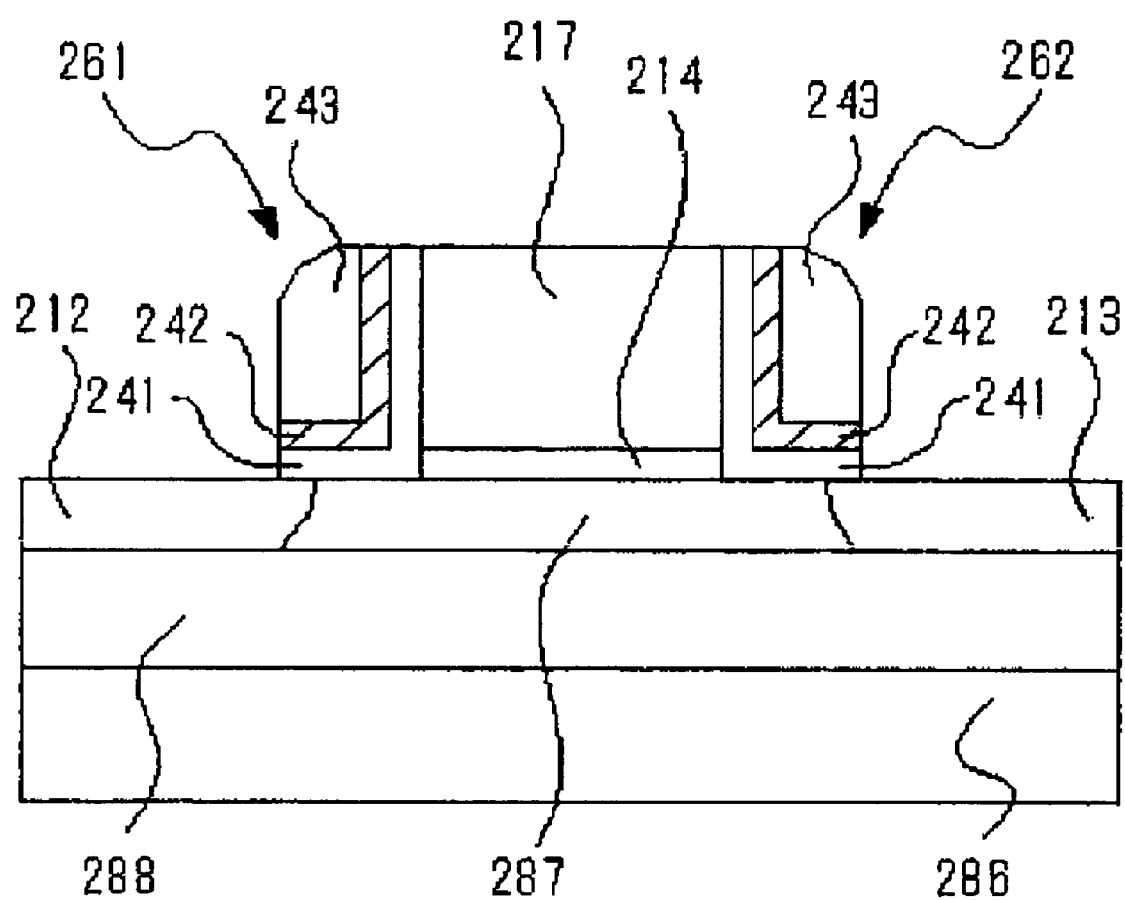
FIG. 26 is a schematic cross section diagram of a main portion of a semiconductor memory element (fourth modification) as an object of the present invention.

A semiconductor memory element in a forth modification has a substantially similar configuration to that of the first modification except that an SOI substrate is used as the semiconductor substrate in the second embodiment as shown in FIG. 26.

In the semiconductor memory element, a buried oxide film 288 is formed on a semiconductor substrate 286, and an SOI layer is formed on the buried oxide film 288. In the SOI layer, the diffusion regions 212 and 213 are formed and the other region serves as a body region 287.

By the semiconductor memory element as well, action and effect similar to those of the semiconductor memory element of the first modification are produced. Further, junction capacitance between the diffusion regions 212 and 213 and the body region 287 can be remarkably reduced, so that higher-speed operation and lower power consumption of the device can be achieved.

(Fifth Modification)

Figure 27:
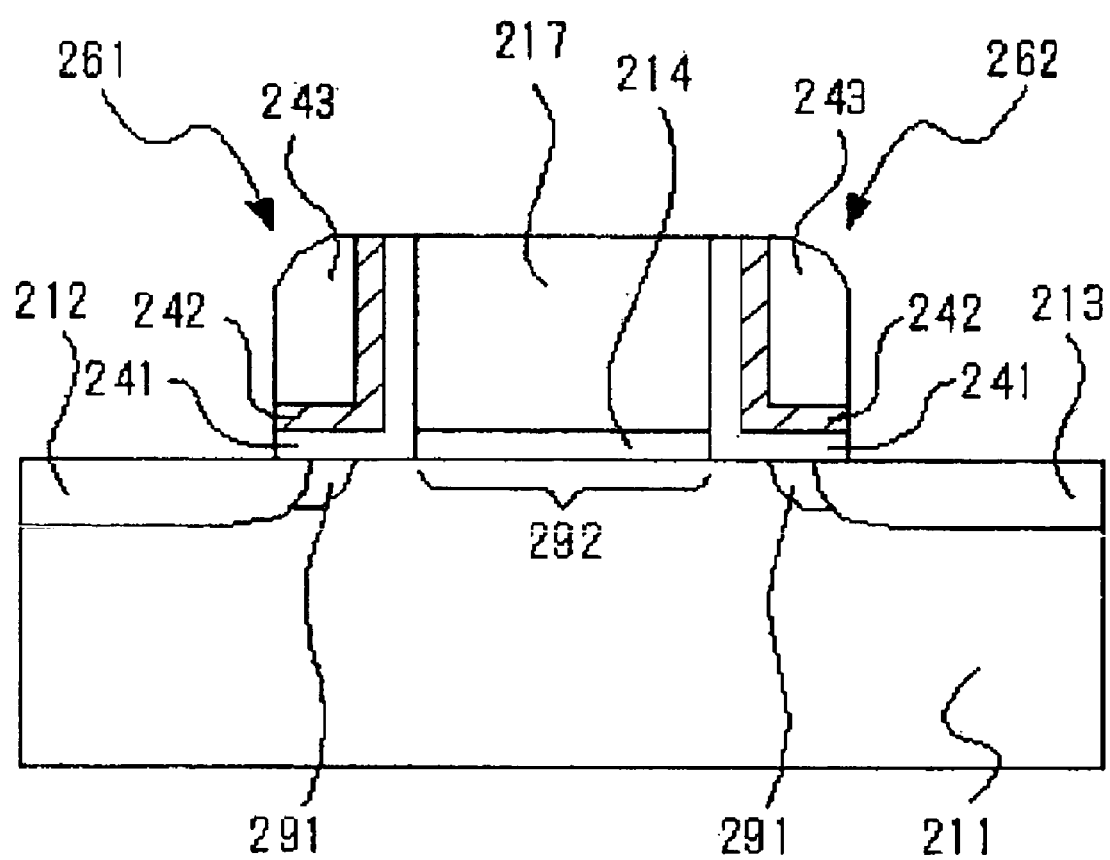
FIG. 27 is a schematic cross section diagram of a main portion of a semiconductor memory element (fifth modification) as an object of the present invention.

A semiconductor memory element in a fifth modification has, as shown in FIG. 27, a configuration substantially similar to that of the semiconductor memory element of the first modification except that P-type high-concentration regions 291 are added adjacent to the channel sides of the N-type diffusion regions 212 and 213.

Specifically, the concentration of P-type impurity (for example, boron) in the P-type high-concentration region 291 is higher than that in a region 292. Proper P-type impurity concentration in the P-type high-concentration region 291 is, for example, about $5 \times 10^{17}$ to $1 \times 10^{19}$ cm$^{-3}$. The P-type impurity concentration in the region 292 can be, for example, $5 \times 10^{16}$ to $1 \times 10^{18}$ cm$^{-3}$.

By providing the P-type high-concentration region 291 as described above, the gradient of potential in the junction between the diffusion regions 212 and 213 and the semiconductor substrate 211 becomes sharp immediately below the memory functional elements 261 and 262. Consequently, hot carriers are easily generated in the programming and erasing operations, and voltages in the programming and erasing operations are decreased, or the programming and erasing operations can be performed at high speed. Further, the impurity concentration in the region 292 is relatively low, so that the threshold when the memory is an erased state is low, and the drain current increases. Consequently, reading speed is improved. Therefore, the semiconductor memory element in which the rewriting voltage is low or rewriting speed is high and the reading speed is high can be obtained.

In FIG. 27, by providing the P-type high-concentration region 291 in the vicinity of the source/drain region and below the memory functional element (that is, not immediately below the gate electrode), the threshold of the transistor as a whole increases noticeably. The degree of increase is much higher as compared with the case where the P-type high-concentration region 291 exists immediately below the gate electrode. In the case where program charges (electrons in the case where the transistor is of the N-channel type) are accumulated in the memory functional element, the difference becomes much larger. On the other hand, when sufficient erase charges (positive holes in the case where the transistor is of the N channel type) are accumulated in the memory functional element, the threshold of the transistor as a whole decreases to the threshold determined by the impurity concentration in the channel region (region 292) below the gate electrode. That is, the threshold at the time of erasing does not depend on the impurity concentration in the P-type high-concentration region 291. On the other hand, the threshold at the time of programming is largely influenced by the impurity concentration. Therefore, by disposing the P-type high-concentration region 291 below the memory functional element and in the vicinity of the source/drain region, only the threshold at the time of programming fluctuates very largely and the memory effect (the difference between the threshold at the time of programming and the threshold at the time of erasing) can be remarkably increased.

(Sixth Modification)

Figure 28:
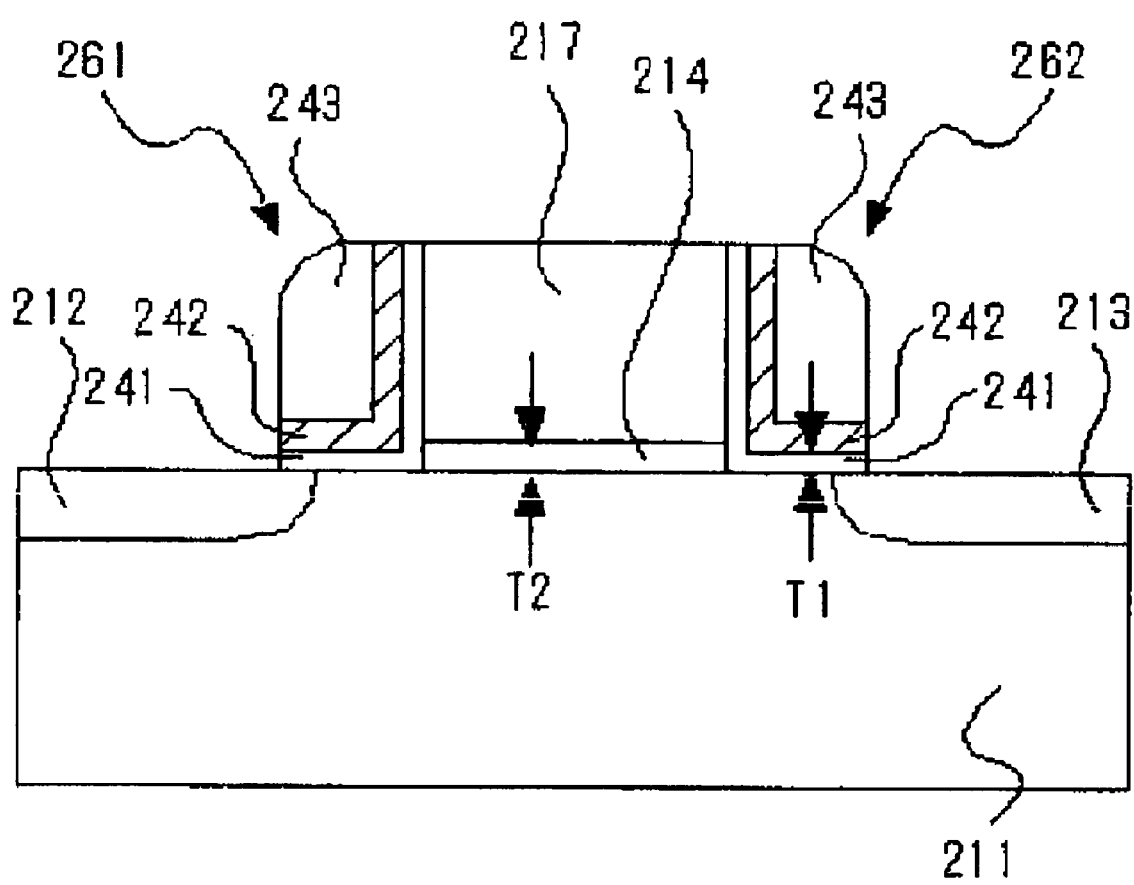
FIG. 28 is a schematic cross section diagram of a main portion of a semiconductor memory element (sixth modification) as an object of the present invention.

A semiconductor memory element of a sixth modification has a configuration substantially similar to that of the first modification except that, as shown in FIG. 28, the thickness (T1) of an insulating film for separating the charge retaining film (silicon nitride film 242) from the channel region or well region is smaller than the thickness (T2) of the gate insulating film.

The lower limit value exists in the thickness T2 of the gate insulating film 214 due to the demand for a withstand voltage at the time of memory rewriting operation. In contrast, the thickness T1 of the insulating film can be made smaller than the thickness T2 irrespective of the demand for a withstand voltage.

The flexibility of designing with respect to T1 is high in the semiconductor memory element for the following reason.

In the semiconductor memory element, the insulating film for separating the charge retaining film from the channel region or well region is not sandwiched by the gate electrode and the channel region or well region. Consequently, to the insulating film for separating the charge retaining film from the channel region or well region, a high electric field acting between the gate electrode and the channel region or well region does not directly act, but a relatively low electric field spreading from the gate electrode in the lateral direction acts. Consequently, irrespective of the demand for a withstand voltage to the gate insulating film, T1 can be made smaller than T2.

By making T1 thinner, injection of charges into the memory functional element becomes easier, and the voltage of the programming operation and the erasing operation can be decreased or the programming operation and erasing operation can be performed at high speed. Since the amount of charges induced by the channel region or well region when charges are accumulated in the silicon nitride film 242 increases, the memory effect can be increased.

The electric lines of force in the memory functional element include a short one which does not pass through the silicon nitride film 242 as shown by an arrow 284 in FIG. 24. On the relatively short electric line of force, electric field intensity is relatively high, so that the electric field along the electric line of force plays a big role in the rewriting operation. By reducing T1, the silicon nitride film 242 is shifted downward in the diagram, and the electric line of force indicated by the arrow 283 passes through the silicon nitride film. Consequently, the effective dielectric constant in the memory functional element along the electric line 284 of force increases, and the potential difference at both ends of the electric line of force can be further decreased. Therefore, a large part of the voltage applied to the gate electrode 217 is used to increase the electric field in the offset region, and the programming operation and the erasing operation become faster.

In contrast, for example, in an EEPROM typified by a flash memory, the insulating film for separating the floating gate from the channel region or well region is sandwiched by the gate electrode (control gate) and the channel region or well region, so that a high electric field from the gate electrode directly acts. Therefore, in an EEPROM, the thickness of the insulating film for separating the floating gate from the channel region or well region is regulated, and optimization of the function of the semiconductor memory element is inhibited.

As obvious from the above, by satisfying the relation of T1<T2, without deteriorating the performance of the withstand voltage of the memory, the voltage in the programming and erasing operations can be decreased or the programming and erasing operations can be performed at high speed and, further, the memory effect can be increased. The thickness T1 of the insulating film is preferably 0.8 nm or more as a limit at which the uniformity and the film quality in the manufacturing process can maintain a predetermined level and the retaining characteristic does not deteriorate extremely (Seventh Modification)

Figure 29:
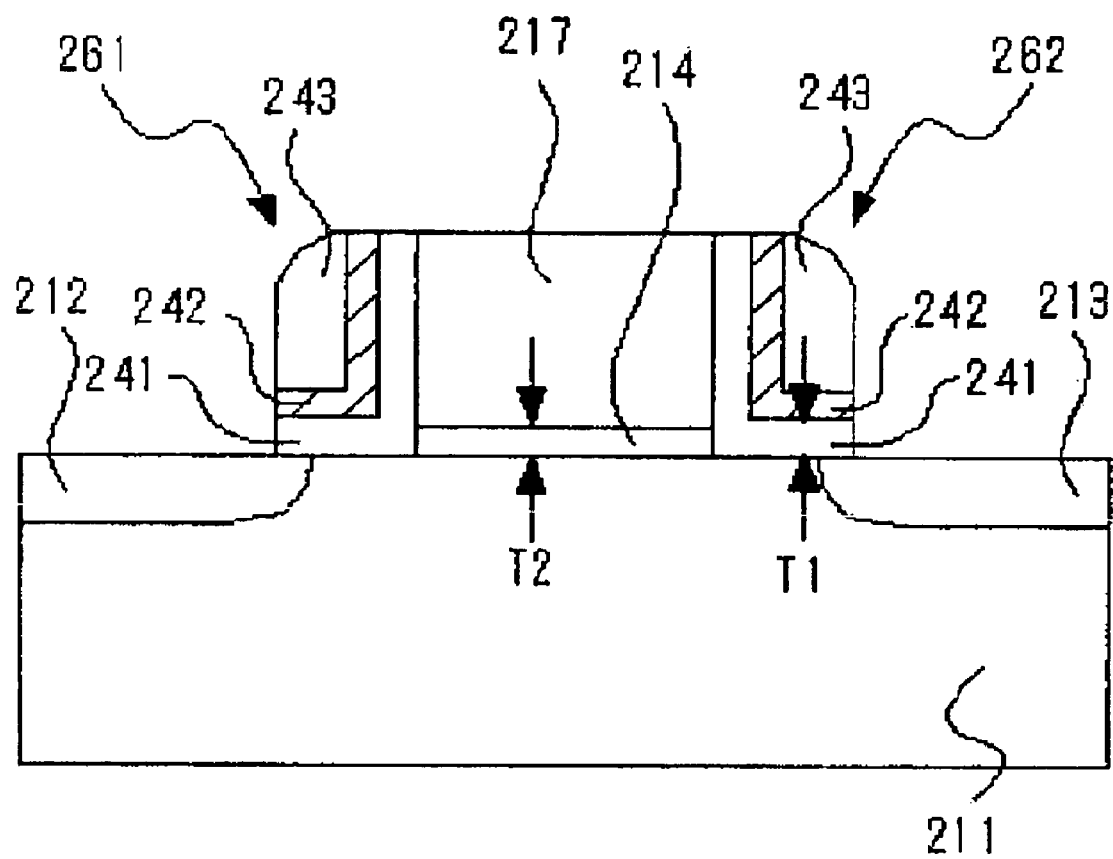
FIG. 29 is a schematic cross section diagram of a main portion of a semiconductor memory element (seventh modification) as an object of the present invention.

A semiconductor memory element of an seventh modification has a configuration substantially similar to that of the first modification except that, as shown in FIG. 29, the thickness (T1) of the insulating film for separating the charge retaining film (silicon nitride film 242) from the channel region or well region is larger than the thickness (T2) of the gate insulating film.

The upper limit value exists in the thickness T2 of the gate insulating film 214 due to the demand for preventing a short channel effect of the device. In contrast, the thickness T1 of the insulating film can be made larger than the thickness T2 irrespective of the demand for preventing a short channel effect. Specifically, when microfabrication scaling advances (when thinning of the gate insulating film advances), the thickness of the insulating film for separating the charge retaining film (silicon nitride film 242) from the channel or well region can be optimally designed independently of the thickness of the gate insulating film. Thus, an effect that scaling is not disturbed by the memory functional element is produced.

The reason why flexibility of designing of T1 is high in the semiconductor memory element is that, as described already, the insulating film for separating the charge retaining film from the channel region or well region is not sandwiched by the gate electrode and the channel region or well region. Consequently, irrespective of the demand for preventing the short channel effect for the gate insulating film, T1 can be made larger than T2. By making T1 thicker, dissipation of charges accumulated in the memory functional element can be prevented and the retaining characteristic of the memory can be improved.

Therefore, by satisfying the relation of T1>T2, the retaining characteristic can be improved without deteriorating the short channel effect of the memory.

The thickness T1 of the insulating film is preferably 20 nm or less in consideration of decrease in the rewriting speed.

Specifically, in a conventional nonvolatile memory typified by a flash memory, a selection gate electrode serves as a program/erase gate electrode, and a gate insulating film (including a floating gate) corresponding to the program/ erase gate electrode also serves as a charge accumulating film. Since a demand for size reduction (thinning of a film is indispensable to suppress short channel effect) and a demand for assuring reliability (to suppress leak of retained charges, the thickness of the insulating film for separating the floating gate from the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the semiconductor memory element, since T1 and T2 can be individually designed as described above, size reduction is made possible.

For example, for a semiconductor memory element having a gate electrode length (word line width) of 45 nm, T2=4 nm and T1=7 nm are individually set, thereby enabling a semiconductor memory element in which the short channel effect is not produced to be realized. The reason why the short channel effect is not produced even when T2 is set to be larger than the thickness of a normal logic transistor is because the source/drain regions are offset from the gate electrode.

Since the source/drain regions are offset from the gate electrode in the semiconductor memory element, as compared with a normal logic transistor, reduction in size is further facilitated.

Since the electrode for assisting programming and erasing does not exist in the upper portion of the memory functional element, a high electric field acting between the electrode for assisting programming and erasing and the channel region or well region does not directly act on the insulating film for separating the charge retaining film from the channel region or well region, but only a relatively low electric field which spreads in the lateral direction from the gate electrode acts. Consequently, the semiconductor memory element having a gate length which is reduced to be equal to or less than the gate length of a logic transistor of the same process generation can be realized.

(Eighth Modification)

A change in the electric characteristic when the semiconductor memory element is rewritten will be described. When an amount of charges in the memory function element changes in an N-channel type semiconductor memory element, a drain current (Ids)-gate voltage (Vgs) characteristic (actual measurement value) as shown in FIG. 30 is displayed.

Figure 30:
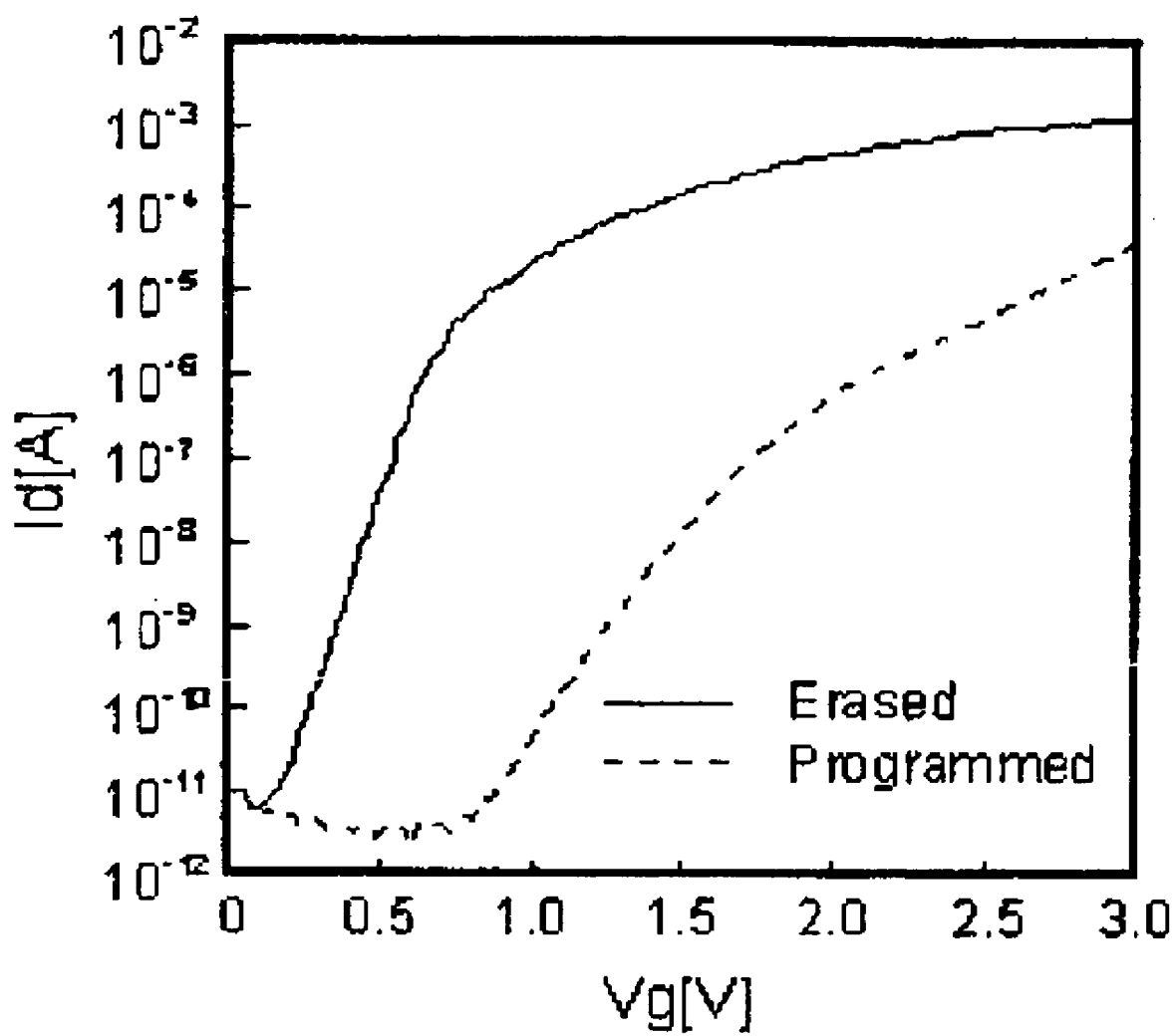
FIG. 30 is a graph showing electric characteristics of a semiconductor memory element (eighth modification) as an object of the present invention.
Figure 31:
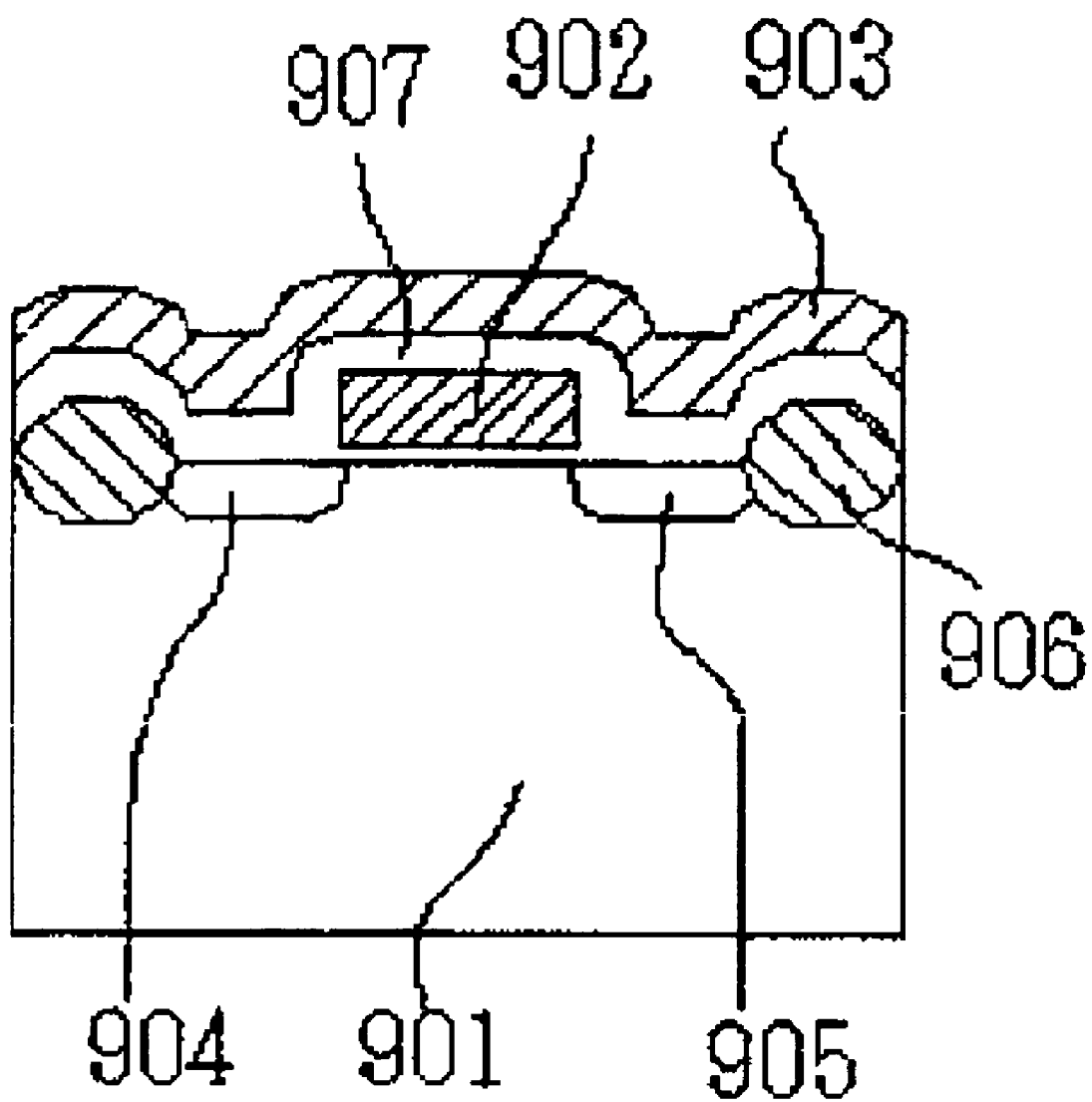
FIG. 31 is a schematic cross section diagram of a main portion of a conventional flash memory device.
Figure 32:
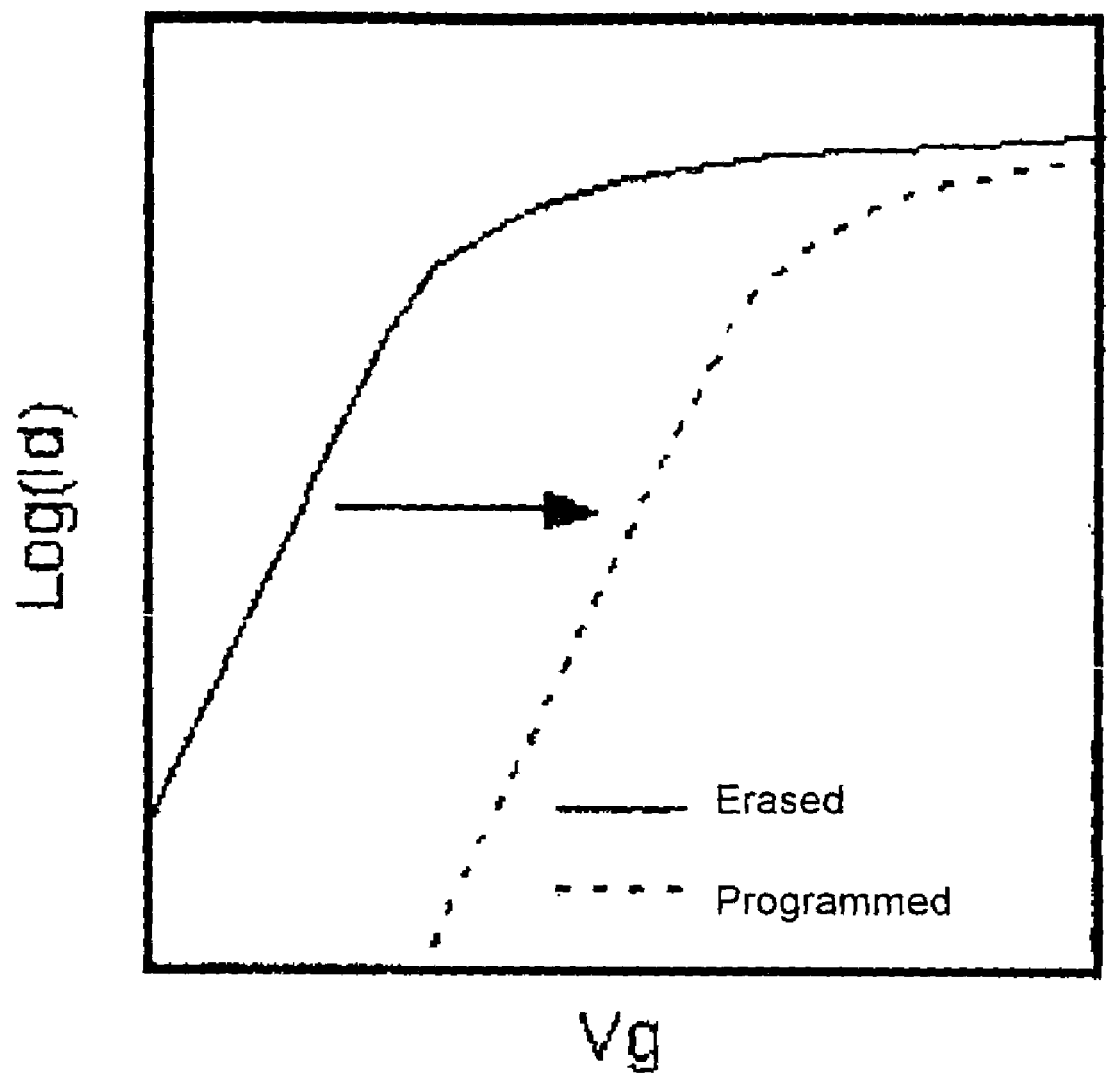
FIG. 32 is a graph showing electric characteristics of the conventional flash memory device.

As obvious from FIG. 30, in the case of performing a programming operation in an erasing state (solid line), not only the threshold simply increases, but the gradient of a graph remarkably decreases in a sub-threshold region. Consequently, also in a region where a gate voltage (Vgs) is relatively high, the drain current ratio between the erasing state and the programming state is high. For example, also at Vgs=2.5 V, the current ratio of two digits or more is maintained. The characteristic is largely different from that in the case of a flash memory (FIG. 32).

The appearance of such a characteristic is a peculiar phenomenon which occurs when the gate electrode and the diffusion regions are offset from each other and the gate electric field hardly acts on the offset region. When the semiconductor memory element is in a programming state, even if a positive voltage is applied to the gate electrode, an inversion layer is hardly generated in the offset region below the memory functional element. This is the cause that the gradient of the Ids-Vgs curve in the sub-threshold region becomes gentle in the programming state.

On the other hand, when the semiconductor memory element is in the erasing state, electrons of high density are induced in the offset region. Further, when 0 V is applied to the gate electrode (that is, when the gate electrode is in an off state), no electrons are induced in the channel below the gate electrode (consequently, an off-state current is small). This is the cause that the gradient of the Ids-Vgs curve is sharp in the sub-threshold region in the erasing state, and current increasing rate (conductance) is high also in the region of the threshold or more.

As obviously understood from the above, in the semiconductor memory element of the present invention, the drain current ratio between the programming operation and the erasing operation can be particularly made high.

The embodiments of the method of evaluating characteristics of a semiconductor memory element and the method and apparatus for extracting model parameters according to the present invention have been described in detail above, and the configuration examples and the modifications of the semiconductor memory element as an object of the present invention have been also described in detail. The method of evaluating characteristics of the semiconductor memory element and the method and apparatus for extracting model parameters according to the present invention can be also applied to semiconductor devices having configurations different from the above-described semiconductor memory element. They can be applied not only to the semiconductor memory element but also to a semiconductor memory element constructed by, for example, a semiconductor layer, a gate insulating film, a gate electrode, a channel region, a diffusion region, and a memory function element, in which an offset region exists between the channel region and the diffusion region, and the resistance value of the offset region changes while depending on the storing state of the memory function element and the voltages of the parts (gate electrode, semiconductor layer, and diffusion region). The memory function element does not always have to be disposed on both sides of the gate electrode. The present invention can be applied to the case where the memory function element exists only on one side of the gate electrode. The semiconductor memory element as an object of the present invention does not always have to be used as a semiconductor memory element. As long as a device has a characteristic in which the resistance value of the offset region behaves as a variable resistance, it can be used as the semiconductor memory element.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A method of evaluating characteristics of a semiconductor memory element, said semiconductor memory element having
    a gate electrode formed over a semiconductor layer via a gate insulating film;
    a channel region disposed just below said gate electrode via said gate insulating film;
    two diffusion regions formed on both sides of said channel region;
    a memory function element having a charge retaining function, formed on one side or both sides of said gate electrode; and
    an offset region positioned below said memory function element and isolating said channel region and said diffusion region from each other,
    said diffusion region formed on the side where said memory function element exists and said channel region being isolated from each other by said offset region, and a resistance value of said offset region changing according to an amount of charges or polarization state of charges accumulated in said memory function element, wherein
said method comprises steps of
obtaining each of a resistance value between said two diffusion regions inclusive of said semiconductor memory element, a resistance value of said channel region, and a resistance value of said diffusion regions; and
calculating the resistance value of said offset region on the basis of a result of subtracting the resistance value of said channel region and the resistance value of said diffusion regions from the resistance value between said two diffusion regions inclusive.

2. The method according to claim 1, wherein
a resistance value obtained from said semiconductor memory element in which length of said gate electrode is sufficiently larger than length of said offset region to a direction in which said two diffusion regions are apart from each other is used to obtain the resistance value between said two diffusion regions inclusive.

3. The method according to claim 1, wherein
a resistance value obtained from an IGFET for channel region resistance evaluation in which said diffusion region extends to a position below the gate electrode is used to obtain the resistance value of said channel region.

4. The method according to claim 3, wherein
said semiconductor memory element and said IGFET for channel region resistance evaluation are formed on the same semiconductor substrate.

5. The method according to claim 1, wherein
a resistance value of a diffusion region for resistance evaluation obtained from a device for resistance evaluation constructed by the diffusion region for resistance evaluation formed over a semiconductor layer and a plurality of electrodes provided over said diffusion region for resistance evaluation is used to obtain the resistance value of said diffusion region.

6. The method according to claim 5, wherein
said semiconductor memory element and said device for resistance evaluation are formed on the same semiconductor substrate.

7. The method according to claim 1, wherein
the resistance value of said offset region is calculated as a variable resistance value which changes according to an amount of charges or polarization state of charges accumulated in said memory function element.

8. The method according to claim 1, wherein
the resistance value of said offset region is calculated as a variable resistance value which changes according to potential of said gate electrode.

9. The method according to claim 8, wherein
the resistance value of said offset region is calculated as a variable resistance value which changes according to potential of said semiconductor layer.

10. The method according to claim 8, wherein
the resistance value of said offset region is calculated as a variable resistance value which changes according to a potential difference between said two diffusion regions.

11. The method according to claim 10, wherein
the resistance value of said offset region adjacent to a source diffusion region serving as a source electrode at the time of reading operation out of said two diffusion regions is set to be constant with respect to potential of said source diffusion region.

12. A method of extracting a model parameter for a circuit simulation for a semiconductor memory element, said semiconductor memory element having
a gate electrode formed over a semiconductor layer via a gate insulating film;
a channel region disposed just below said gate electrode via said gate insulating film;
two diffusion regions formed on both sides of said channel region;
a memory function element having a charge retaining function, formed on one side or both sides of said gate electrode; and
an offset region positioned below said memory function element and isolating said channel region and said diffusion regions from each other,
said diffusion region formed on the side where said memory function element exists and said channel region being isolated from each other by said offset region, and a resistance value of said offset region changing according to an amount of charges or a polarization state of charges accumulated in said memory function element, wherein
said method comprises steps of
modeling the resistance value of said offset region as a variable resistance value which changes according to the potential of each of said gate electrode and said semiconductor layer by using a model formula of:

$Rchos = A \times \exp\{B \times (Vgs + C \times Vbs)\} + D$ where a potential on the low potential side of said two diffusion regions is used as a reference potential, the resistance value of said offset region is set as Rchos, the potential of said gate electrode is set as Vgs, the potential of said semiconductor layer is set as Vbs, and A, B, C, and D are set as fitting parameters;
calculating the resistance value of said offset region by using the method according to claim 9; and
determining said fitting parameters so that the resistance value of said offset region calculated by said characteristic evaluating method coincides with the resistance value of said offset region modeled by using said model formula, in order to independently extract a model parameter of the resistance value of said offset region separately from a model parameter for a simulation of an IGFET.

13. A method of extracting a model parameter for a circuit simulation for a semiconductor memory element, said semiconductor memory element having
a gate electrode formed over a semiconductor layer via a gate insulating film;
a channel region disposed just below said gate electrode via said gate insulating film;
two diffusion regions formed on both sides of said channel region;
a memory function element having a charge retaining function, formed on one side or both sides of said gate electrode; and
an offset region positioned below said memory function element and isolating said channel region and said diffusion regions from each other,
said diffusion region formed on the side where said memory function element exists and said channel region being isolated from each other by said offset region, and a resistance value of said offset region changing according to an amount of charges or a polarization state of charges accumulated in said memory function element, wherein
said method comprises steps of
modeling the resistance value of said offset region as a variable resistance value which changes according to the potential difference between said two diffusion regions by using a model formula of:

$Rchos = Rchos0 \times \{1 + E \times (Vds - Vds0)\}$ where the resistance value of said offset region is set as Rchos, the potential difference between said two diffusion regions is set as Vds, a sufficiently low potential difference between said two diffusion regions when said IGFET is in a linear region is set as Vds0, Rchos at the time Vds=Vds0 is set as Rchos0, and E is set as a fitting parameter;
calculating the resistance value of said offset region by using the method according to claim 10; and
determining said fitting parameter so that the resistance value of said offset region calculated by said characteristic evaluating method coincides with the resistance value of said offset region modeled by using said model formula, in order to independently extracting a model parameter of the resistance value of said offset region separately from a model parameter for a simulation of an IGFET.

14. A method of extracting a model parameter for a circuit simulation for a semiconductor memory element, said semiconductor memory element having
a gate electrode formed over a semiconductor layer via a gate insulating film;
a channel region disposed just below said gate electrode via said gate insulating film;
two diffusion regions formed on both sides of said channel region;
a memory function element having a charge retaining function, formed on one side or both sides of said gate electrode; and
an offset region positioned below said memory function element and isolating said channel region and said diffusion regions from each other,
said diffusion region formed on the side where said memory function element exists and said channel region being isolated from each other by said offset region, and a resistance value of said offset region changing according to an amount of charges or polarization state of charges accumulated in said memory function element, wherein
said method comprises steps of
modeling the resistance value of said offset region as a variable resistance value which changes according to the potential difference between said two diffusion regions by using a model formula of:

$Rchos = Rchos0 \times \{1 + E \times (Vds - Vds0)\}$ where the resistance value of said offset region is set as Rchos, the potential difference between said two diffusion regions is set as Vds, a sufficiently low potential difference between said two diffusion regions when said IGFET is in a linear region is set as Vds0, Rchos at the time Vds=Vds0 is set as Rchos0, and E is set as a fitting parameter;

calculating the resistance value of said offset region by using the method according to claim 11; and determining said fitting parameter so that the resistance value of said offset region calculated by said characteristic evaluating method coincides with the resistance value of said offset region modeled by using said model formula, in order to independently extract a model parameter of the resistance value of said offset region separately from a model parameter for a simulation of an IGFET.

15. A method of extracting a model parameter for a circuit simulation for a semiconductor memory element, said semiconductor memory element having a gate electrode formed over a semiconductor layer via a gate insulating film;

a channel region disposed just below said gate electrode via said gate insulating film;

two diffusion regions formed on both sides of said channel region;

a memory function element having a charge retaining function, formed on one side or both sides of said gate electrode; and an offset region positioned below said memory function element and isolating said channel region and said diffusion regions from each other, said diffusion region formed on the side where said memory function element exists and said channel region being isolated from each other by said offset region, and a resistance value of said offset region changing according to an amount of charges or a polarization state of charges accumulated in said memory function element, wherein said method comprises steps of calculating the resistance value of said offset region by using the method according to claim 1; and extracting a model parameter of an IGFET by transferring the resistance value of said offset region calculated by said characteristic evaluating method to parasitic resistance of a diffusion region in a simulation model in said IGFET.

16. A method of extracting a model parameter for a circuit simulation for a semiconductor memory element, said semiconductor memory element having a gate electrode formed over a semiconductor layer via a gate insulating film;

a channel region disposed just below said gate electrode via said gate insulating film;

two diffusion regions formed on both sides of said channel region;

a memory function element having a charge retaining function, formed on one side or both sides of said gate electrode; and an offset region positioned below said memory function element and isolating said channel region and said diffusion regions from each other, said diffusion region formed on the side where said memory function element exists and said channel region being isolated from each other by said offset region, and a resistance value of said offset region changing according to an amount of charges or a polarization state of charges accumulated in said memory function element, wherein said method comprises steps of calculating the resistance value of said offset region by using the method according to claim 1; and extracting a model parameter of an IGFET by transferring the resistance value of said offset region calculated by said characteristic evaluating method as external parasitic resistance to be connected to said diffusion region of said IGFET.

17. An apparatus for extracting a model parameter for a circuit simulation for a semiconductor memory element, said semiconductor memory element having a gate electrode formed over a semiconductor layer via a gate insulating film;

a channel region disposed just below said gate electrode via said gate insulating film;

two diffusion regions formed on both sides of said channel region;

a memory function element having a charge retaining function, formed on one side or both sides of said gate electrode; and an offset region positioned below said memory function element and isolating said channel region and said diffusion regions from each other, said diffusion region formed on the side where said memory function element exists and said channel region being isolated from each other by said offset region, and a resistance value of said offset region changing according to an amount of charges or a polarization state of charges accumulated in said memory function element, wherein said apparatus has a function of determining fitting parameters so that the resistance value of said offset region modeled by the following model formula coincides with a resistance value of said offset region calculated by the method according to claim 9:

$$Rchos = A \times \exp\{B \times (Vgs + C \times Vbs)\} + D$$

where a potential on the low potential side of said two diffusion regions is used as a reference potential, the resistance value of said offset region is set as Rchos, the potential of said gate electrode is set as Vgs, the potential of said semiconductor layer is set as Vbs, and A, B, C, and D are set as fitting parameters.

18. The apparatus according to claim 17, further comprising:

a function of calculating the resistance value of said offset region by using the method according to claim 9.

19. An apparatus for extracting a model parameter for a circuit simulation for a semiconductor memory element, said semiconductor memory element having a gate electrode formed over a semiconductor layer via a gate insulating film;

a channel region disposed just below said gate electrode via said gate insulating film;

two diffusion regions formed on both sides of said channel region;

a memory function element having a charge retaining function, formed on one side or both sides of said gate electrode; and an offset region positioned below said memory function element and isolating said channel region and said diffusion regions from each other, said diffusion region formed on the side where said memory function element exists and said channel region being isolated from each other by said offset region, and a resistance value of said offset region changing according to an amount of charges or a polarization state of charges accumulated in said memory function element, wherein said apparatus has a function of determining fitting parameters so that a resistance value of said offset region modeled by the following model formula with a resistance value of said offset region calculated by the method according to claim 10:

$$Rchos=Rchos0\times\{1+E\times(Vds-Vds0)\}$$

where the resistance value of said offset region is set as Rchos, the potential difference between said two diffusion regions is set as Vds, a sufficiently low potential difference between said two diffusion regions when said IGFET is in a linear region is set as Vds0, Rchos at the time Vds=Vds0 is set as Rchos0, and E is set as a fitting parameter.

20. The apparatus according to claim 19, further comprising:

a function of calculating the resistance value of said offset region by using the method according to claim 10.

21. An apparatus for extracting a model parameter for a circuit simulation for a semiconductor memory element, said semiconductor memory element having a gate electrode formed over a semiconductor layer via a gate insulating film;

a channel region disposed just below said gate electrode via said gate insulating film;

two diffusion regions formed on both sides of said channel region;

a memory function element having a charge retaining function, formed on one side or both sides of said gate electrode; and an offset region positioned below said memory function element and isolating said channel region and said diffusion regions from each other, said diffusion region formed on the side where said memory function element exists and said channel region being isolated from each other by said offset region, and a resistance value of said offset region changing according to an amount of charges or a polarization state of charges accumulated in said memory function element, wherein said apparatus has a function of determining a fitting parameter so that a resistance value of said offset region modeled by the following model formula coincides with a resistance value of said offset region calculated by the method according to claim 11:

$$Rchos=Rchos0\times\{1+E\times(Vds-Vds0)\}$$

where the resistance value of said offset region is set as Rchos, the potential difference between said two diffusion regions is set as Vds, a sufficiently low potential difference between said two diffusion regions when said IGFET is in a linear region is set as Vds0, Rchos at the time Vds=Vds0 is set as Rchos0, and E is set as a fitting parameter.

22. The apparatus according to claim 21, further comprising:

a function of calculating the resistance value of said offset region by using the method according to claim 11.

* * * * *